US007951637B2

(12) United States Patent
Weidman et al.

(10) Patent No.: US 7,951,637 B2

(45) Date of Patent: May 31, 2011

(54) BACK CONTACT SOLAR CELLS USING PRINTED DIELECTRIC BARRIER

(75) Inventors: Timothy W. Weidman, Sunnyvale, CA (US); Rohit Mishra, Santa Clara, CA (US); Michael P. Stewart, San Francisco, CA (US); Kapila P. Wijekoon, Palo Alto, CA (US); Yonghwa Chris Cha, San Jose, CA (US); Tristan Holtam, Horsham (GB); Vinay Shah, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 12/549,284

(22) Filed: Aug. 27, 2009

(65) Prior Publication Data

US 2010/0055822 A1 Mar. 4, 2010

Related U.S. Application Data

(60) Provisional application No. 61/092,379, filed on Aug. 27, 2008, provisional application No. 61/105,029, filed on Oct. 13, 2008, provisional application No. 61/139,423, filed on Dec. 19, 2008, provisional application No. 61/157,179, filed on Mar. 3, 2009.

(51) Int. Cl.

| | |
|---|---|
| ***H01L 21/00*** | (2006.01) |
| ***H01L 21/76*** | (2006.01) |
| ***H01L 21/331*** | (2006.01) |
| ***H01L 21/20*** | (2006.01) |
| ***H01L 33/00*** | (2006.01) |

(52) U.S. Cl. .......... 438/57; 438/452; 438/378; 438/502; 257/E21.135

(58) Field of Classification Search .................... 438/57, 438/378, 369, 502, 501, 452; 257/E21.135

See application file for complete search history.

(56) References Cited

U.S. PATENT DOCUMENTS

| | | | |
|---|---|---|---|
| 3,849,880 | A | 11/1974 | Haynos |
| 3,979,241 | A | 9/1976 | Maeda et al. |
| 4,084,985 | A | 4/1978 | Evans, Jr. |
| 4,104,091 | A | 8/1978 | Evans et al. |
| 4,152,824 | A | 5/1979 | Gonsiorawski |
| 4,219,448 | A | 8/1980 | Ross |

(Continued)

FOREIGN PATENT DOCUMENTS

| | | |
|---|---|---|
| EP | 0 680 099 | 4/1995 |

(Continued)

OTHER PUBLICATIONS

Yang et al., Solar Cell and Method of Manufacturing the same, KR 10-2005-0124080, Jun. 21, 2006 (Machine Translation).*

(Continued)

*Primary Examiner* — Alexander G Ghyka
*Assistant Examiner* — Seahvosh J Nikmanesh
(74) *Attorney, Agent, or Firm* — Patterson & Sheridan, L.L.P.

(57) ABSTRACT

Embodiments of the invention contemplate the formation of a high efficiency solar cell using novel methods to form the active doped region(s) and the metal contact structure of the solar cell device. In one embodiment, the methods include the steps of depositing a dielectric material that is used to define the boundaries of the active regions and/or contact structure of a solar cell device. Various techniques may be used to form the active regions of the solar cell and the metal contact structure.

19 Claims, 40 Drawing Sheets

U.S. PATENT DOCUMENTS

| | | | |
|---|---|---|---|
| 4,308,091 | A | 12/1981 | Schmitt et al. |
| 4,478,879 | A | 10/1984 | Baraona et al. |
| 4,623,751 | A | 11/1986 | Kishi et al. |
| 4,717,591 | A | 1/1988 | Acosta et al. |
| 4,927,770 | A | 5/1990 | Swanson |
| 5,011,782 | A | 4/1991 | Lamb et al. |
| 5,030,295 | A | 7/1991 | Swanson et al. |
| 5,053,083 | A | 10/1991 | Sinton |
| 5,057,439 | A | 10/1991 | Swanson et al. |
| 5,198,385 | A | 3/1993 | Devitt et al. |
| 5,223,112 | A | 6/1993 | Tepman |
| 5,248,496 | A | 9/1993 | Schuster et al. |
| 5,281,350 | A | 1/1994 | Gimm et al. |
| 5,401,336 | A | 3/1995 | Noguchi et al. |
| 5,698,451 | A | 12/1997 | Hanoka |
| 5,705,828 | A | 1/1998 | Noguchi et al. |
| 5,897,368 | A | 4/1999 | Cole, Jr. et al. |
| 5,939,336 | A | 8/1999 | Yates |
| 5,972,732 | A | 10/1999 | Gee et al. |
| 6,020,250 | A | 2/2000 | Kenney |
| 6,036,741 | A | 3/2000 | Shindo et al. |
| 6,066,267 | A | 5/2000 | Rath et al. |
| 6,082,610 | A | 7/2000 | Shangguan et al. |
| 6,091,099 | A | 7/2000 | Kiyotoshi et al. |
| 6,096,968 | A | 8/2000 | Schlosser et al. |
| 6,103,393 | A | 8/2000 | Kodas et al. |
| 6,184,056 | B1 | 2/2001 | Nakamura et al. |
| 6,290,880 | B1 | 9/2001 | Ryan et al. |
| 6,328,913 | B1 | 12/2001 | Shaffer et al. |
| 6,388,187 | B1 | 5/2002 | Takeyama et al. |
| 6,420,646 | B2 | 7/2002 | Benz et al. |
| 6,451,665 | B1 | 9/2002 | Yunogami et al. |
| 6,458,183 | B1 | 10/2002 | Phillips et al. |
| 6,511,861 | B2 | 1/2003 | Takeyama et al. |
| 6,537,461 | B1 | 3/2003 | Nakahara et al. |
| 6,552,414 | B1 | 4/2003 | Horzel et al. |
| 6,586,161 | B2 | 7/2003 | Futase et al. |
| 6,607,988 | B2 | 8/2003 | Yunogami et al. |
| 6,649,091 | B2 | 11/2003 | Ryan et al. |
| 6,649,211 | B2 | 11/2003 | Lyons et al. |
| 6,695,903 | B1 | 2/2004 | Kubelbeck et al. |
| 6,737,221 | B2 | 5/2004 | Futase et al. |
| 6,753,133 | B2 | 6/2004 | Ono et al. |
| 6,800,542 | B2 | 10/2004 | Kim |
| 6,803,514 | B2 | 10/2004 | Takeyama |
| 6,825,104 | B2 | 11/2004 | Horzel et al. |
| 6,852,635 | B2 | 2/2005 | Satta et al. |
| 6,984,804 | B2 | 1/2006 | Takeyama et al. |
| 6,998,288 | B1 | 2/2006 | Smith et al. |
| 7,008,517 | B2 | 3/2006 | Feltsman |
| 7,129,109 | B2 | 10/2006 | Munzer et al. |
| 7,135,350 | B1 | 11/2006 | Smith et al. |
| 7,144,751 | B2 | 12/2006 | Gee et al. |
| 7,242,632 | B2 | 7/2007 | Hiraka |
| 7,335,555 | B2 | 2/2008 | Gee et al. |
| 7,375,378 | B2 | 5/2008 | Manivannan et al. |
| 7,432,438 | B2 | 10/2008 | Rubin et al. |
| 7,510,672 | B2 | 3/2009 | McCulloch et al. |
| 7,595,543 | B2 | 9/2009 | Weber et al. |
| 7,649,141 | B2 | 1/2010 | Schmit et al. |
| 2002/0041991 | A1 | 4/2002 | Chan et al. |
| 2002/0176927 | A1 | 11/2002 | Kodas et al. |
| 2002/0184969 | A1 | 12/2002 | Kodas et al. |
| 2003/0134469 | A1 | 7/2003 | Horzel et al. |
| 2003/0207214 | A1 | 11/2003 | Futase et al. |
| 2004/0013799 | A1 | 1/2004 | Kim et al. |
| 2004/0063326 | A1 | 4/2004 | Szlufcik et al. |
| 2004/0112426 | A1 | 6/2004 | Hagino |
| 2004/0126644 | A1 | 7/2004 | Bett et al. |
| 2004/0159869 | A1 | 8/2004 | Rinerson et al. |
| 2005/0009346 | A1 | 1/2005 | Miyajima |
| 2005/0062041 | A1 | 3/2005 | Terakawa et al. |
| 2005/0089748 | A1 | 4/2005 | Ohlsen et al. |
| 2005/0110125 | A1 | 5/2005 | Blackshear |
| 2005/0172996 | A1 | 8/2005 | Hacke et al. |
| 2005/0224968 | A1 | 10/2005 | Ho |
| 2005/0238808 | A1 | 10/2005 | Gatineau et al. |
| 2005/0247674 | A1 | 11/2005 | Kubelbeck et al. |
| 2006/0060238 | A1 | 3/2006 | Hacke et al. |
| 2006/0162766 | A1 | 7/2006 | Gee et al. |
| 2006/0174933 | A1 | 8/2006 | Rolison et al. |
| 2006/0255340 | A1 | 11/2006 | Manivannan et al. |
| 2006/0283496 | A1 | 12/2006 | Okamoto et al. |
| 2006/0283499 | A1 | 12/2006 | Terakawa et al. |
| 2007/0087564 | A1 * | 4/2007 | Speakman .................... 438/674 |
| 2007/0099806 | A1 | 5/2007 | Stewart et al. |
| 2007/0111354 | A1 | 5/2007 | Seong et al. |
| 2007/0148336 | A1 | 6/2007 | Bachrach et al. |
| 2007/0151599 | A1 | 7/2007 | Cousins |
| 2007/0181908 | A1 | 8/2007 | Otremba |
| 2007/0194467 | A1 | 8/2007 | Yang et al. |
| 2007/0256728 | A1 | 11/2007 | Cousins |
| 2008/0145708 | A1 | 6/2008 | Heil et al. |
| 2008/0152835 | A1 | 6/2008 | Mayers et al. |
| 2008/0210660 | A1 | 9/2008 | Stockum et al. |
| 2008/0216887 | A1 | 9/2008 | Hacke et al. |
| 2008/0236655 | A1 | 10/2008 | Baldwin et al. |
| 2009/0008787 | A1 | 1/2009 | Wenham et al. |
| 2009/0032087 | A1 | 2/2009 | Kalejs |
| 2009/0068783 | A1 | 3/2009 | Borden |
| 2009/0126786 | A1 | 5/2009 | Dominguez et al. |
| 2009/0142880 | A1 | 6/2009 | Weidman et al. |
| 2009/0189204 | A1 * | 7/2009 | Heitzinger et al. ........... 257/288 |
| 2009/0320922 | A1 | 12/2009 | Hacke et al. |
| 2010/0012172 | A1 | 1/2010 | Meakin et al. |
| 2010/0024881 | A1 | 2/2010 | Hacke et al. |

FOREIGN PATENT DOCUMENTS

| | | | |
|---|---|---|---|
| EP | 1 390 987 | | 11/2006 |
| JP | 6097153 | | 4/1994 |
| JP | 2007-049079 | A | 2/2007 |
| KR | 10-2006-0069307 | A | 6/2006 |
| KR | 2007-0079749 | A | 8/2007 |
| WO | WO 02/061854 | | 8/2002 |
| WO | WO 2004/021455 | | 3/2004 |
| WO | WO 2004/042828 | | 5/2004 |
| WO | WO-2006-042698 | A1 | 4/2006 |
| WO | WO 2007/071064 | | 6/2007 |
| WO | WO 2007/095757 | | 8/2007 |
| WO | WO 2007/130188 | | 11/2007 |
| WO | WO 2007/137407 | | 12/2007 |
| WO | WO 2008/046201 | | 4/2008 |
| WO | WO 2008/070087 | | 6/2008 |
| WO | WO 2008/098407 | | 8/2008 |
| WO | WO 2008/140224 | | 11/2008 |
| WO | WO 2009/032734 | | 3/2009 |

OTHER PUBLICATIONS

PCT international search report and written opinion of PCT/US2009/055211 dated Apr. 9, 2010. Provides a concise statement of relevance for KR-2006-0069307.

Mitchell, et al. "Plasma-Enhanced Chemical Vapour Deposition of a Si:H to Provide Surface Passivation of C-Si Surfaces at Low Temperature", 22$^{nd}$ European Photovoltaic Solar Energy Conference, Sep. 3-7, 2007, Milan, Italy. pp. 928-931.

Veschetti, et al. "Fabrication of Interdigited Back Contact Solar Cells on Large Area with Screen Printed Metallization", 22$^{nd}$ European Photovoltaic Solar Energy Conference, Sep. 3-7, 2007, Milan, Italy. pp. 1179-1182.

Ribeyron, et al. "Polymorphous/Crystalline Silicon Heterojuction Solar Cells: Optimisation of P-Type Monocrystalline Silicon", 22$^{nd}$ European Photovoltaic Solar Energy Conference, Sep.3-7, 2007, Milan, Italy. pp. 1197-1200.

Birmann, et al. "Fast Alkaline Etching of Monocrystalline Wafers in KOH/CHX", Presented at the 23$^{rd}$ European Photovoltaic Solar Energy Conference and Exhibitation, Sep. 1-5, 2008, Valencia, Spain.

Lohmann, et al. "Report on Industrial Use of Inline Wet Edge Isolation for Solar Cell Production", 22$^{nd}$ European Photovoltaic Solar Energy Conference, Sep. 3-7, 2007, Milan, Italy. pp. 1634-1635.

Garben, et al. "Investigation of Boron Diffusion from Polycrystalline Silicon", IBM East Fishkill Facility, Hopewell Junction , New York 12533. Oct. 1986. pp. 2152-2156.

Uzum. et al. "Effect of Boron-Diffusion on the Electrical Properties of N-Type Multicrystalline Silicon Wafers", Proc. 23rd European Photovoltaic Solar Energy Conference, Sep. 2008.
Recart, et al. "Bifacial Thin Solar Cells With Screen Printed Emitters and Metallizations", 23rd European Photovoltaic Solar Energy Conference and Exhibition, Sep. 1-5, 2008, Valencia, Spain. Session: 2DV.1.16. pp. 1893-1896.
Vitanov, et al. "A Study of Sol-Gel Deposited Al2O3 Films as Passivating Coatings for Solar Cells Application", 23rd European Photovoltaic Solar Energy Conference and Exhibition, Sep. 1-5, 2008, Valencia, Spain. Session: 2CV.5.5. pp. 1596-1599.
Kohler, et al. "New Inkjet Solution for Direct Printing of Local Diffusion Barriers on Solar Cells", 23$^{rd}$ Eupvsec (Valencia, Spain), 2008.
Morilla, et al. "Laser Induced Ablation and Doping Processes on High Efficiency Silicon Solar Cells", 23rd EUPVSEC (Valencia, Spain), 2008.
Kwark, et al. "Low J. Contact Structures Using Sipos and Polysilicon Films", Solid State Laboratory, Stanford University. 1985.
G. Bueno et al., "Simultaneous Diffusion of Screen Printed Boron and Phosphorus Paste for Bifacial Silicon Solar Cells".2004.
C. S. Curtis et al., "Direct -Write Printing of Silver Metallizations on Silicon Solar Cells", Mat. Res. Soc. Symp. Proc. vol. 730, 2002 Materials Research Society V3.8.1.
F. A. Lindholm et al., Heavily Doped Polysilicon-Contact Solar Cells, IEEE Electron Device Letters, vol. EDL-6, No. 7, Jul. 1985.
Paunovic, Milan "Electrochemically Deposited Thin Films" The Electrochemical Society, Inc., Electrodeposition Division Proceedings vol. 94-31. pp. 293-303. 1995.
Shacham-Diamand, et al. "Integrated Electroless Metallization for ULSI" Electrochimica Acta 44 (1999) 3639-3649.
Sankar, et al. "Low Temperature Chemical Vapour Deposition of Ruthenium and Ruthenium Dioxide on Polymer Surfaces" Journal of Materials Chemistry 9 (1999), 2439-2444.
Swider-Lyons, et al. "Selective Vapor Deposition of Hydrous RuO2 Thin Films", Journal of the Electrochemical Society, 152-3 (2005) C158-C162.
Shih, C.H., et al. "Direct Plating of Cu on ALD TaN for 45nm-node Cu BEOL Metallization". IEEE, 2004.
Herlitz, Fredrik "Titanium in the electrochemical industry—use and protection" Permascand AB, Sweden 2004.
SolarEtch. "New Structuring Concepts for Solar Cell Production Easy, Fast and Environmentally Friendly", www.isishape.com. Published Feb. 2003.
Buhler, et al. "Silicon Dioxide Sacrificial Layer Etching in Surface Micromachining," 1997. Physical Electronics Laboratory.
Lennon, et al. "Direct Patterned Etching of Silicon Dioxide and Silicon Nitride Dielectric Layers," Solar Energy Materials & Solar Cells. 2009.
Paunovic, Milan "Electrochemically Deposited Thin Films", The Electrochemical Society, Inc., Electrodeposition Division Proceedings vol. 94-31. pp. 293-303. 1995.
Colomer, et al., "Structural, Microstructural, and Electrical Transport Properties of TiO2—RuO2 Ceramic Materials Obtained by Polymeric Sol-Gel Route," Chem. Mater. 2000, 12, pp. 923-930.
Denissov, et al. "RIE—Textured Silicon Solar Cells with Screen Printed Metallization", p. 64-66. 2003.
Erler, et al. "Solar Cell Processing Steps Applied to RIE Textured Silicon Surfaces." Chemnitz University of Technology, Center for Microtechnologies Annual Report. 2002.
Hulkic, et al. "Development of A 21% Back Contact Monocrystalline Silicon Solar Cell for Large-Scale Production", 2008.
Isishape. "Structuring Solutions for economical and environmentally-friendly processes for solar cell and display fabrication", Jul. 14, 2009.

* cited by examiner 117
117
100
102
111
111
X
116
110
101

135
131
131
135
131
100
102
111
111
111
110
101

132
132
132
100
131
131
131
102
111
111
110
101

142
142
142
100
141
141
141
102
111
111
110
101

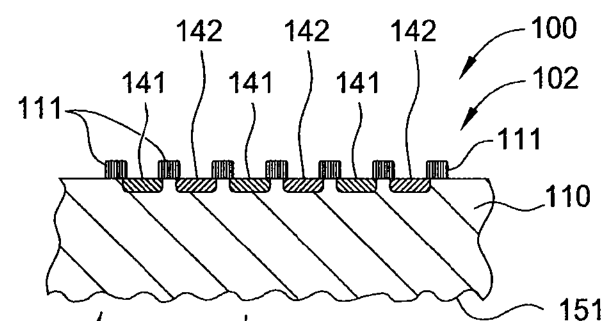
FIG. 1E
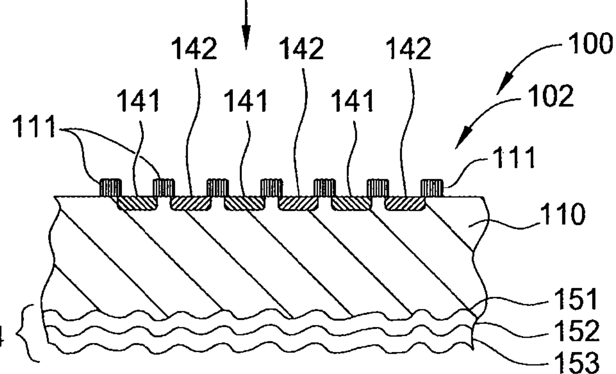
FIG. 1F
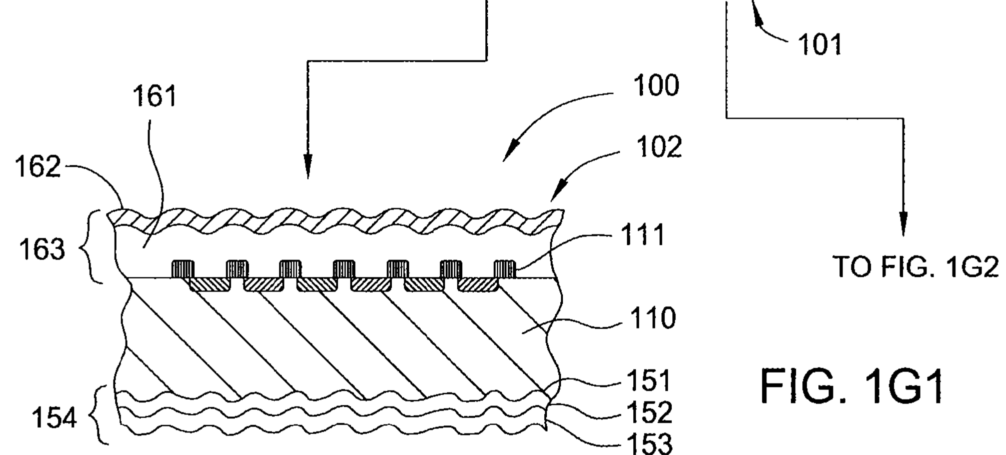
FIG. 1G1
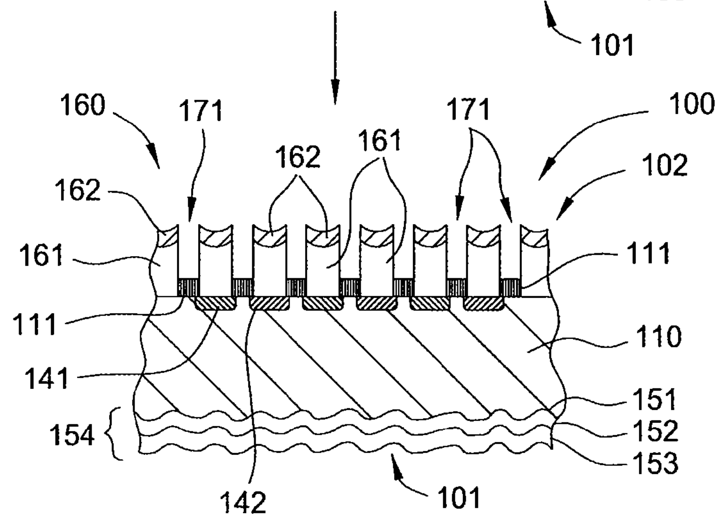
FIG. 1H1

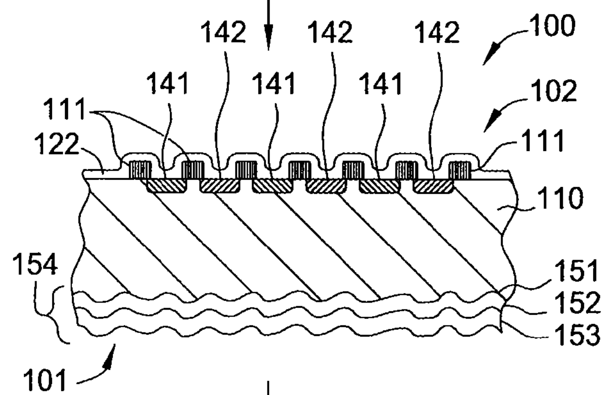
FIG. 1G2
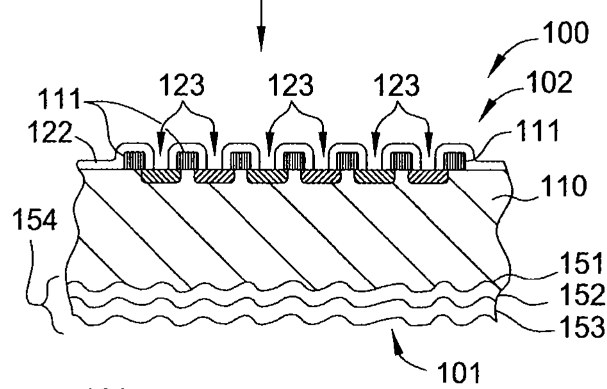
FIG. 1H2
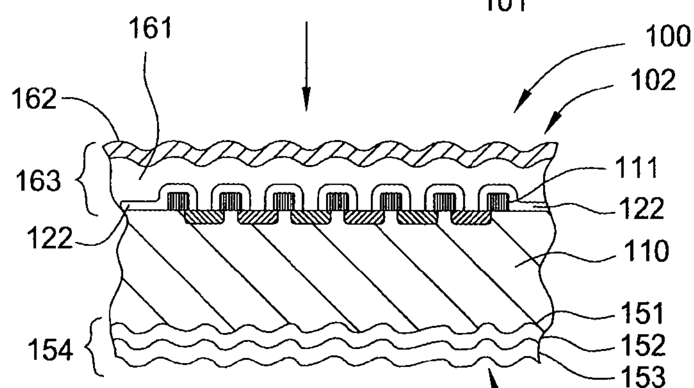
FIG. 1I2
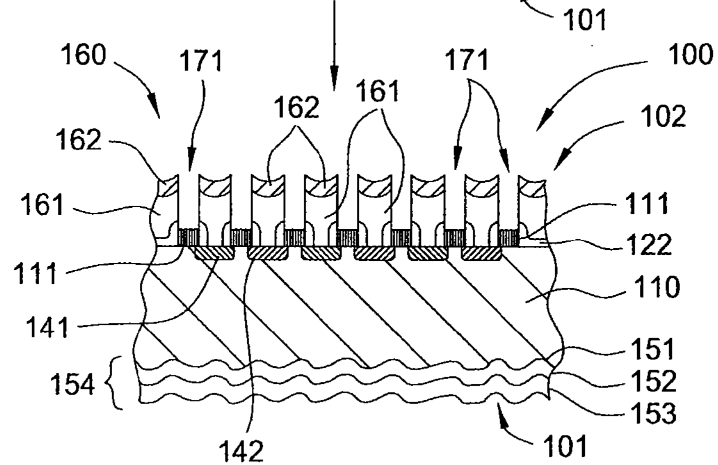
FIG. 1J2

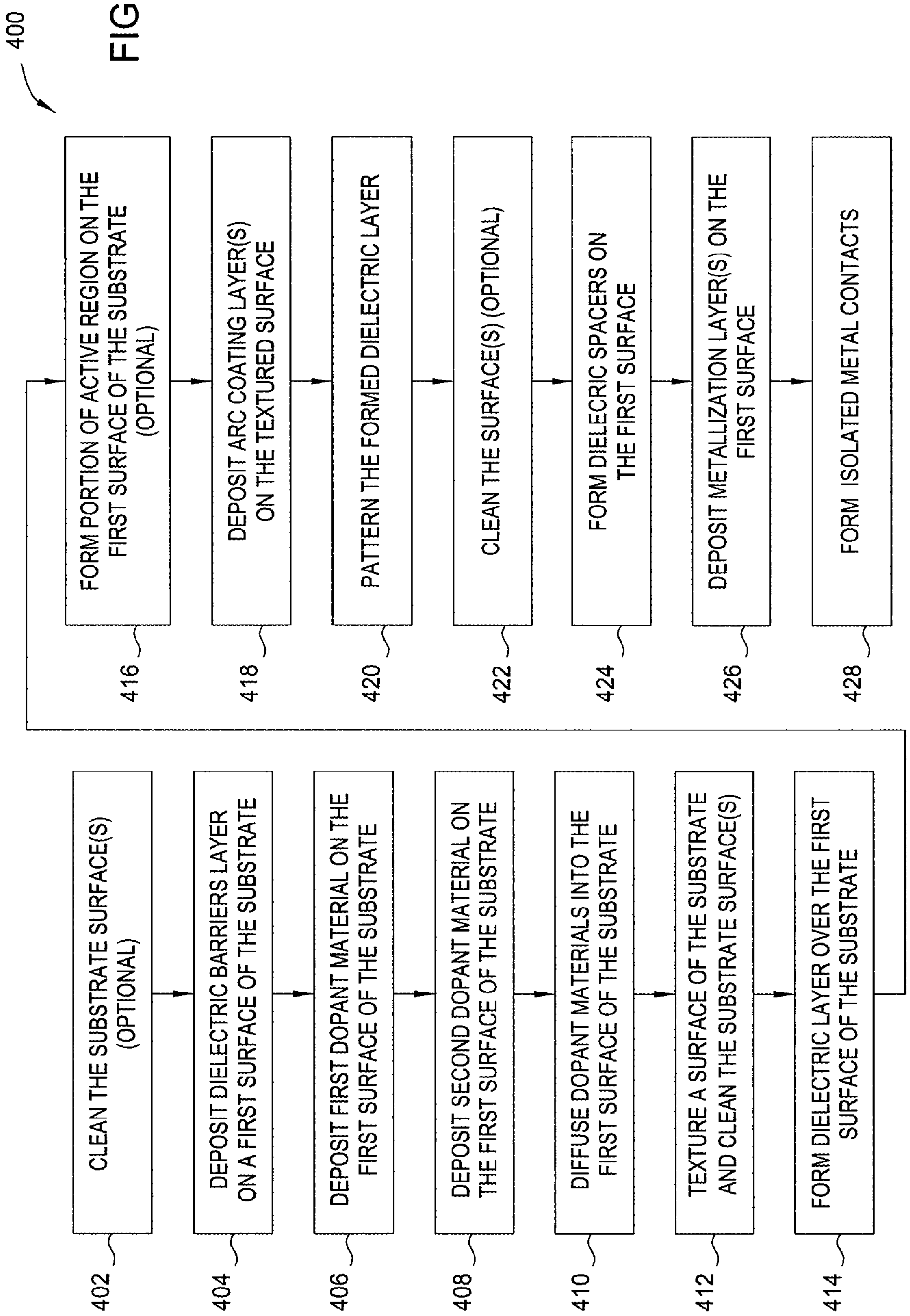
400
FIG. 4
CLEAN THE SUBSTRATE SURFACE(S) (OPTIONAL)
402
DEPOSIT DIELECTRIC BARRIERS LAYER ON A FIRST SURFACE OF THE SUBSTRATE
404
DEPOSIT FIRST DOPANT MATERIAL ON THE FIRST SURFACE OF THE SUBSTRATE
406
DEPOSIT SECOND DOPANT MATERIAL ON THE FIRST SURFACE OF THE SUBSTRATE
408
DIFFUSE DOPANT MATERIALS INTO THE FIRST SURFACE OF THE SUBSTRATE
410
TEXTURE A SURFACE OF THE SUBSTRATE AND CLEAN THE SUBSTRATE SURFACE(S)
412
FORM DIELECTRIC LAYER OVER THE FIRST SURFACE OF THE SUBSTRATE
414
FORM PORTION OF ACTIVE REGION ON THE FIRST SURFACE OF THE SUBSTRATE (OPTIONAL)
416
DEPOSIT ARC COATING LAYER(S) ON THE TEXTURED SURFACE
418
PATTERN THE FORMED DIELECTRIC LAYER
420
CLEAN THE SURFACE(S) (OPTIONAL)
422
FORM DIELECRIC SPACERS ON THE FIRST SURFACE
424
DEPOSIT METALLIZATION LAYER(S) ON THE FIRST SURFACE
426
FORM ISOLATED METAL CONTACTS
428

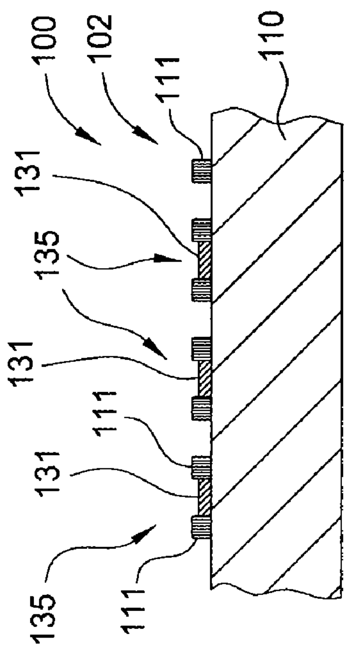
FIG. 5B
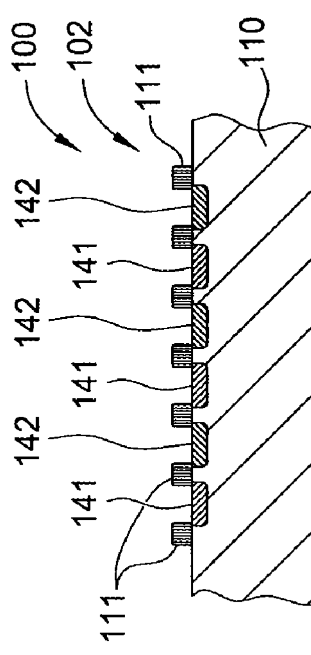
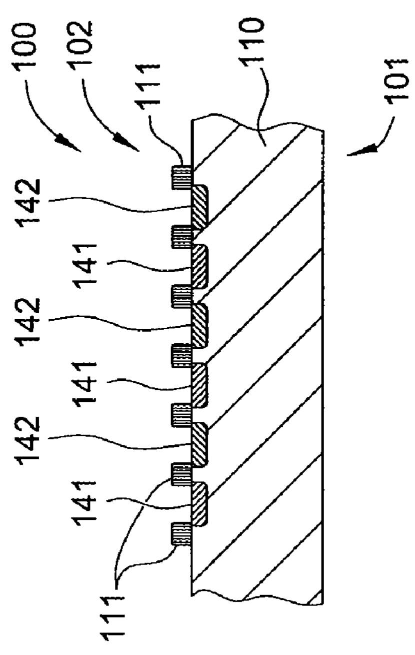
FIG. 5D
FIG. 5A
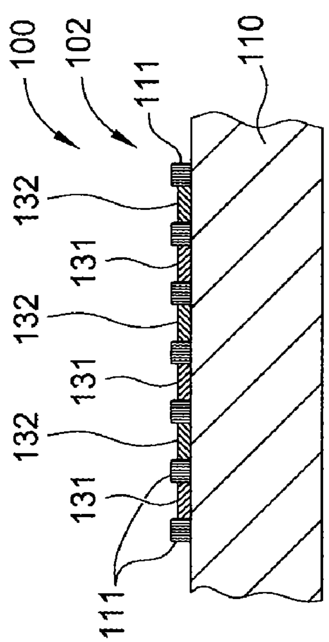
FIG. 5C

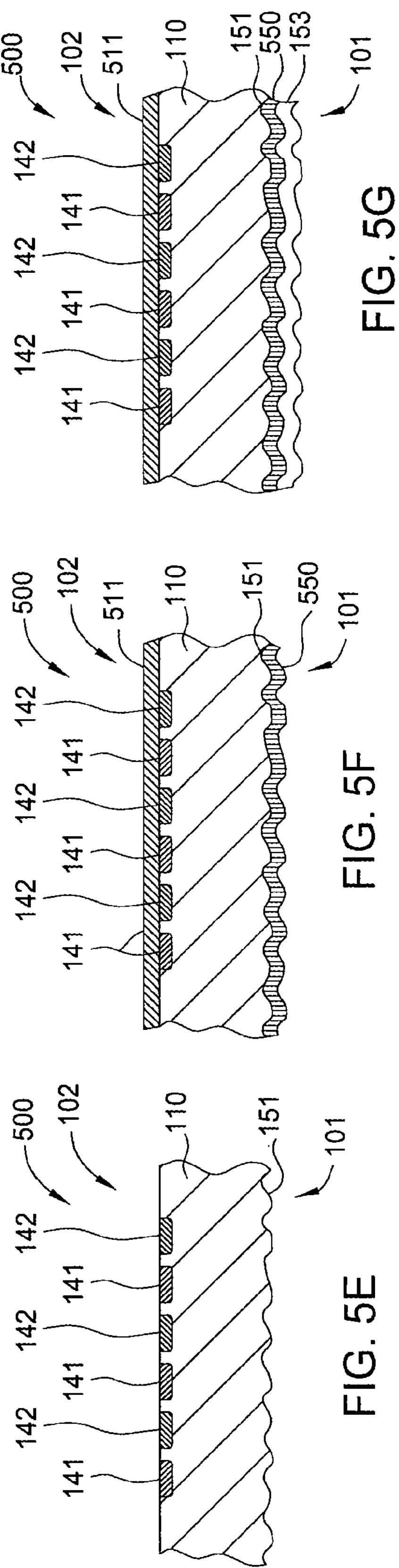
FIG. 5E
FIG. 5F
FIG. 5G
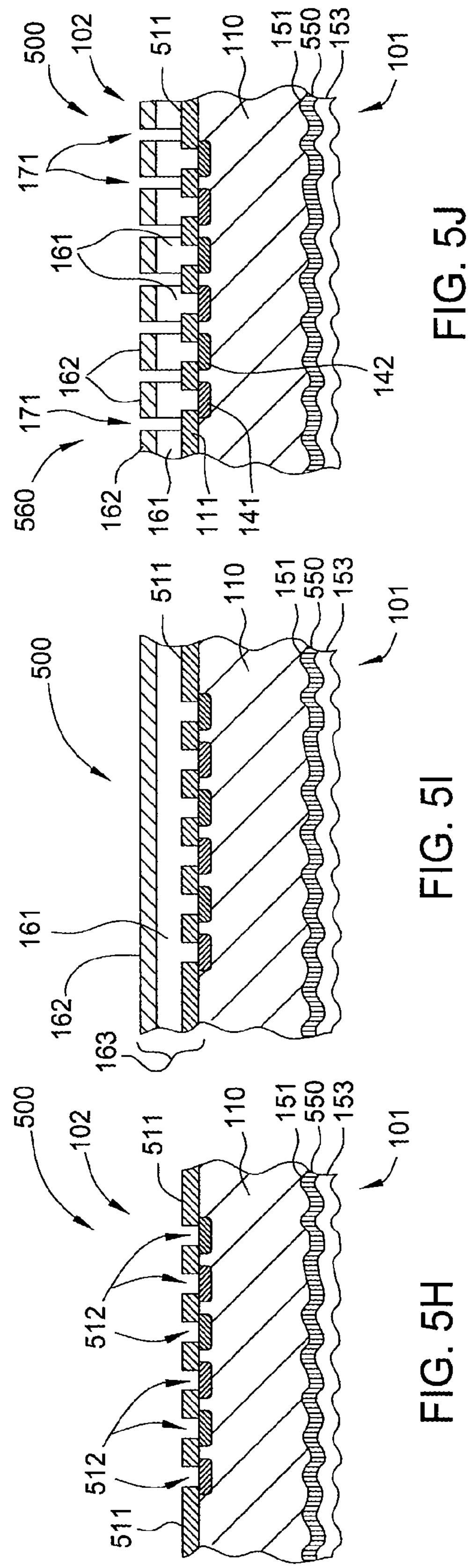
FIG. 5H
FIG. 5I
FIG. 5J

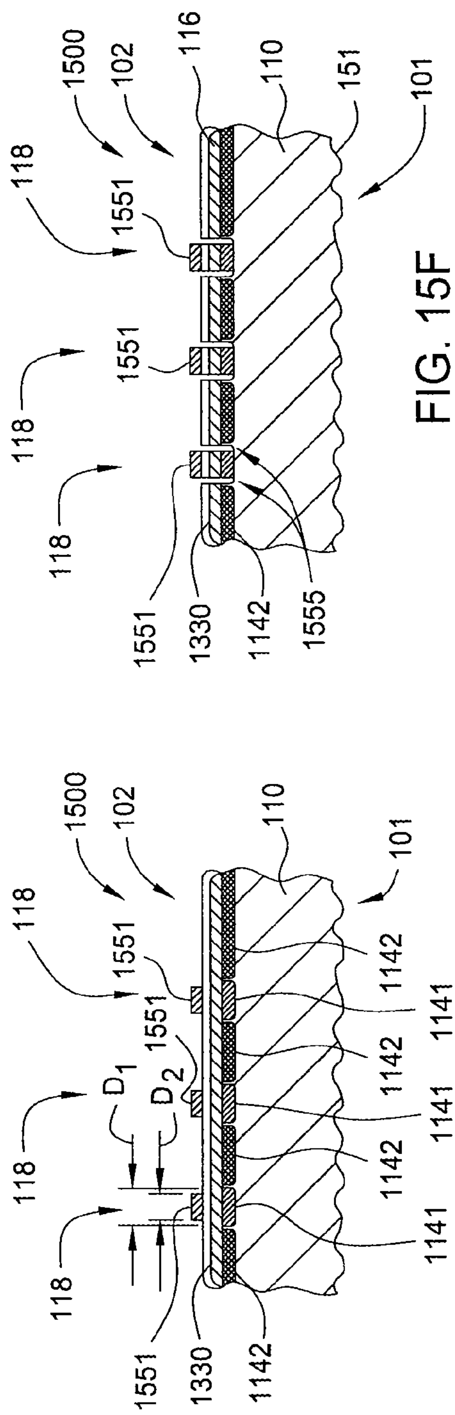
FIG. 15F
FIG. 15E
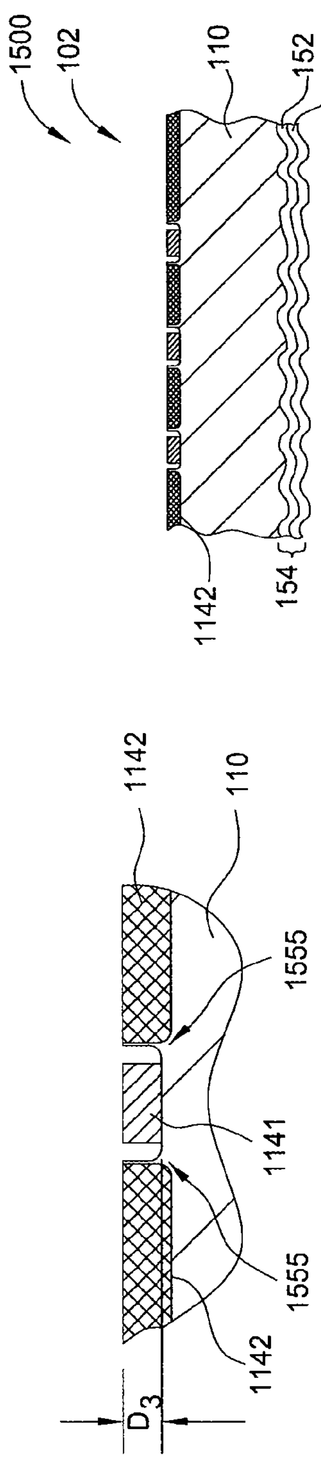
FIG. 15H
FIG. 15G

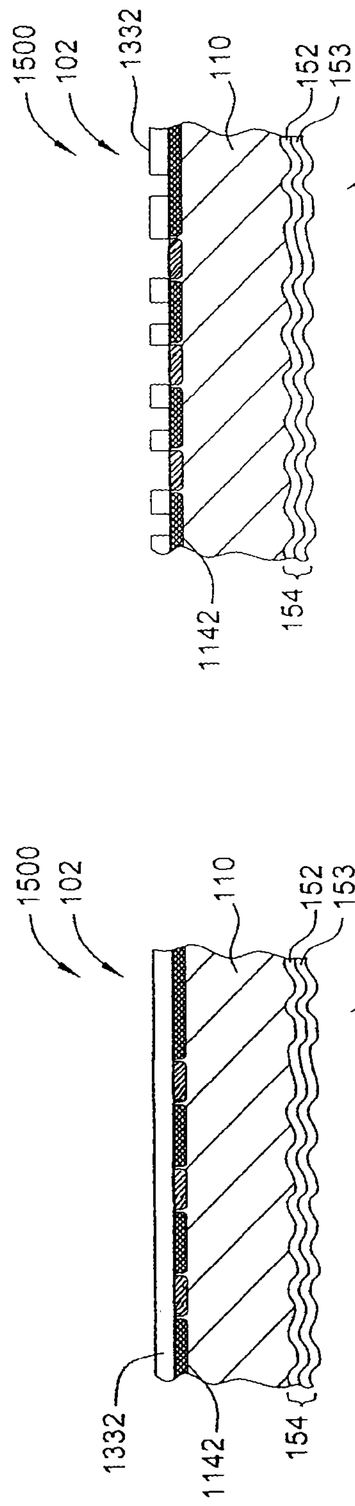
1500
102
1332
110
152
153
101
1142
154
FIG. 17G
1500
102
110
152
153
101
1332
1142
154
FIG. 17F
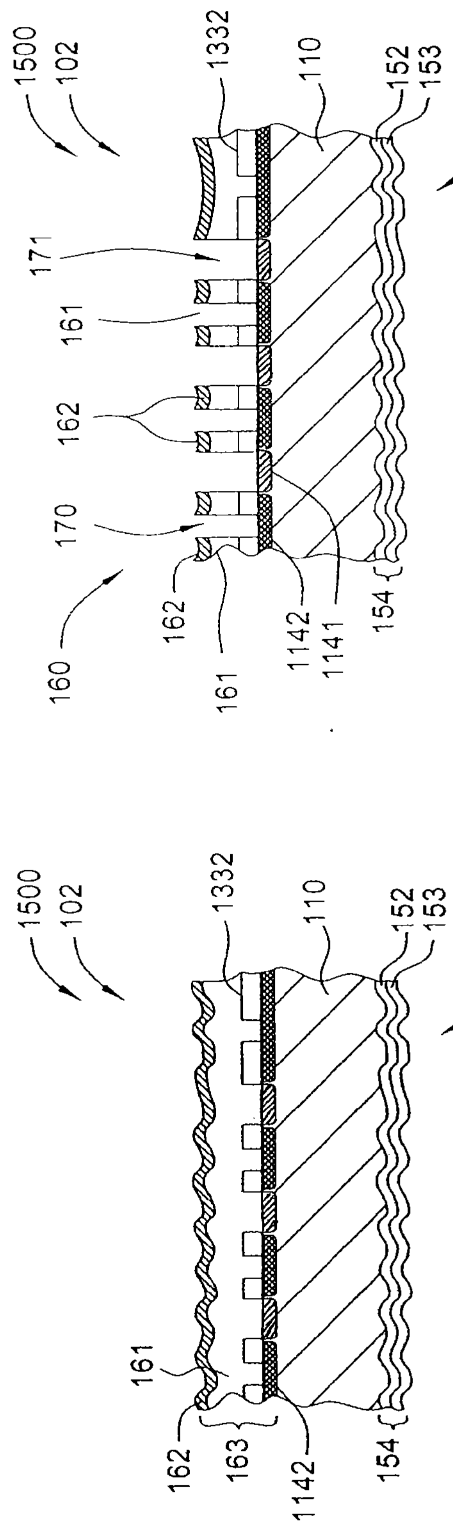
1500
102
1332
110
152
153
101
171
161
162
170
160
162
161
1142
1141
154
FIG. 17I
1500
102
1332
110
152
153
101
161
162
163
1142
154
FIG. 17H

BACK CONTACT SOLAR CELLS USING PRINTED DIELECTRIC BARRIER

CROSS-REFERENCE TO RELATED APPLICATIONS

This application claims benefit of U.S. Provisional Application Ser. No. 61/092,379 filed Aug. 27, 2008 and U.S. Provisional Application Ser. No. 61/105,029, filed Oct. 13, 2008 and U.S. Provisional Application Ser. No. 61/139,423 filed Dec. 19, 2008 and U.S. Provisional Application Ser. No. 61/157,179 filed Mar. 3, 2009, all of which are incorporated by references in their entirety.

BACKGROUND OF THE INVENTION

1. Field of the Invention

Embodiments of the invention generally relate to the fabrication of photovoltaic cells.

2. Description of the Related Art

Solar cells are photovoltaic devices that convert sunlight directly into electrical power. The most common solar cell material is silicon, which is in the form of single or multicrystalline substrates, sometimes referred to as wafers. Because the amortized cost of forming silicon-based solar cells to generate electricity is higher than the cost of generating electricity using traditional methods, there has been an effort to reduce the cost to form solar cells.

Various approaches enable fabricating active regions of the solar cell and the current carrying metal lines, or conductors, of the solar cells. However, there are several issues with these prior manufacturing methods. For example, the formation processes are complicated multistep processes that add to costs required to complete the solar cells.

Therefore, there exists a need for improved methods and apparatus to form the active and current carrying regions formed on a surface of a substrate to form a solar cell.

SUMMARY OF THE INVENTION

The present invention generally provides a method of forming a solar cell device, comprising disposing a dielectric material on a plurality of regions on a first surface of a substrate, disposing a first dopant material on the surface of the substrate, and disposing a second dopant material on the surface of the substrate, wherein at least a portion of the first and second dopant materials are separated from each other by the dielectric material.

The present invention also provides a method of forming a solar cell device includes disposing a first dopant material on a first surface of the substrate, forming a doping layer over the first dopant material an and the first surface of the substrate, wherein the layer comprises a second dopant material. And heating the substrate to a desired temperature to cause the first and the second dopant materials to diffuse into the first surface of the substrate to form n-type regions and p-type regions in the first surface of the substrate.

The present invention also provides a method of forming a solar cell device includes disposing a dopant material comprising a first dopant on a plurality of regions of a surface of a substrate, forming a layer over the first dopant material and a portion of the surface of the substrate, wherein the layer comprises a second dopant that is an opposite doping type of the first dopant, heating the substrate to a desired temperature to cause the first and second dopants to diffuse into the surface of the substrate, and depositing a conducting layer over the surface of the substrate.

In another embodiment, an apparatus for forming solar cell device includes an automation assembly configured to receive a substrate for processing, a plurality of transport elements that each have a substrate supporting surface coupled to the automation assembly, at least one deposition station that is adapted to deposit a dielectric layer on a surface of a substrate disposed on a substrate supporting surface of the transport element, wherein the deposition station, wherein the dielectric layer is formed on a plurality of regions of the substrate surface separating a first dopant material from a second dopant material, and at least one drying oven that is adapted to dry the deposited layer formed on the substrate disposed on the substrate supporting surface of the transport element in the automation assembly.

In yet another embodiment, an apparatus for forming solar cell device includes an automation assembly configured to receive a substrate for processing, a plurality of transport elements that each have a substrate supporting surface coupled to the automation assembly, at least one deposition station that is adapted to deposit a metal containing layer or a metal containing paste on a surface of a substrate disposed on a substrate supporting surface of the transport element, wherein the metal containing layer or a metal containing paste is formed on the substrate to electrically isolate at least one region of the metal containing layer or a metal containing paste in contact with a region of the substrate surface on which a first dopant material was disposed and at least one region of the metal containing layer or the metal containing paste in contact with a region of the substrate surface on which a second dopant material was disposed, and at least one drying oven that is adapted to dry the deposited layer formed on the substrate disposed on the substrate supporting surface of the transport element in the automation assembly.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings.

FIG. 2 illustrates a flow chart of methods to metalize a solar cell according to embodiments of the invention.

FIG. 4 illustrates a flow chart of methods to metalize a solar cell according to embodiments of the invention.

FIGS. 5A-5J illustrate schematic cross-sectional views of a solar cell during different stages in a sequence according to one embodiment of the invention.

FIGS. 15A-15L illustrate schematic cross-sectional views of a solar cell during different stages in a sequence according to one embodiment of the invention.

FIGS. 17A-17I illustrate schematic cross-sectional views of a solar cell during different stages in a sequence according to one embodiment of the invention.

For clarity, identical reference numerals have been used, where applicable, to designate identical elements that are common between figures. It is contemplated that features of one embodiment may be incorporated in other embodiments without further recitation.

DETAILED DESCRIPTION

Embodiments of the invention contemplate the formation of a high efficiency solar cell using novel methods to form the active region(s) and the metal contact structure of a solar cell device. In one embodiment, the methods include depositing a patterned dielectric material that is used to define the active regions and/or contact structure of a solar cell device. Various techniques may be used to form the active regions of the solar cell and the metal contact structure. Solar cell substrates (e.g., substrate 110 in FIG. 1A) that may benefit from the invention include substrates that may have an active region that contains organic material, single crystal silicon, multi-crystalline silicon, polycrystalline silicon, germanium (Ge), gallium arsenide (GaAs), cadmium telluride (CdTe), cadmium sulfide (CdS), copper indium gallium selenide (CIGS), copper indium selenide ($CuInSe_2$), gallium indium phosphide ($GaInP_2$), as well as heterojunction cells, such as GaInP/GaAs/Ge or ZnSe/GaAs/Ge substrates, that are used to convert sunlight to electrical power.

Solar Cell Formation Process

Figure 1A:
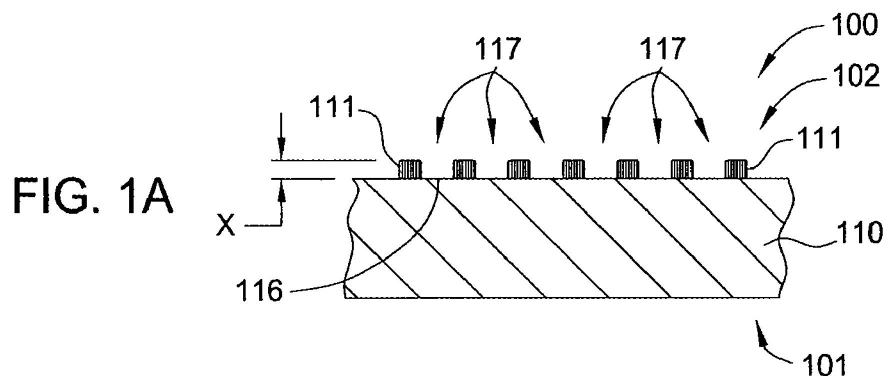
FIGS. 1A-1H1 illustrate schematic cross-sectional views of a solar cell during different stages in a sequence according to one embodiment of the invention.
Figure 1B:
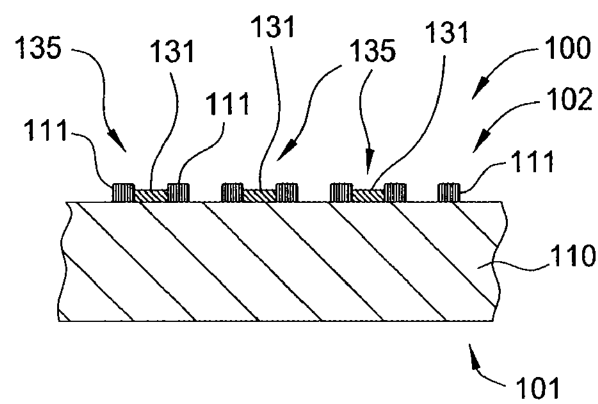
FIGS. 1G2-1J2 illustrate schematic cross-sectional views of a solar cell during different stages in a sequence according to another embodiment of the invention.
Figure 1C:
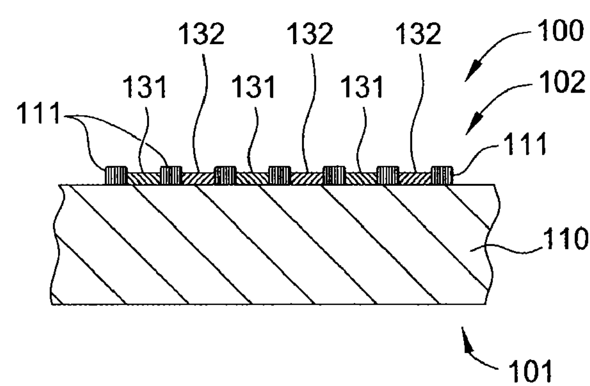
Figure 1D:
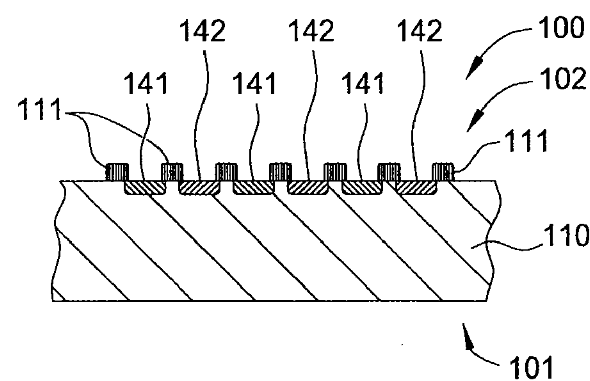
Figure 2:
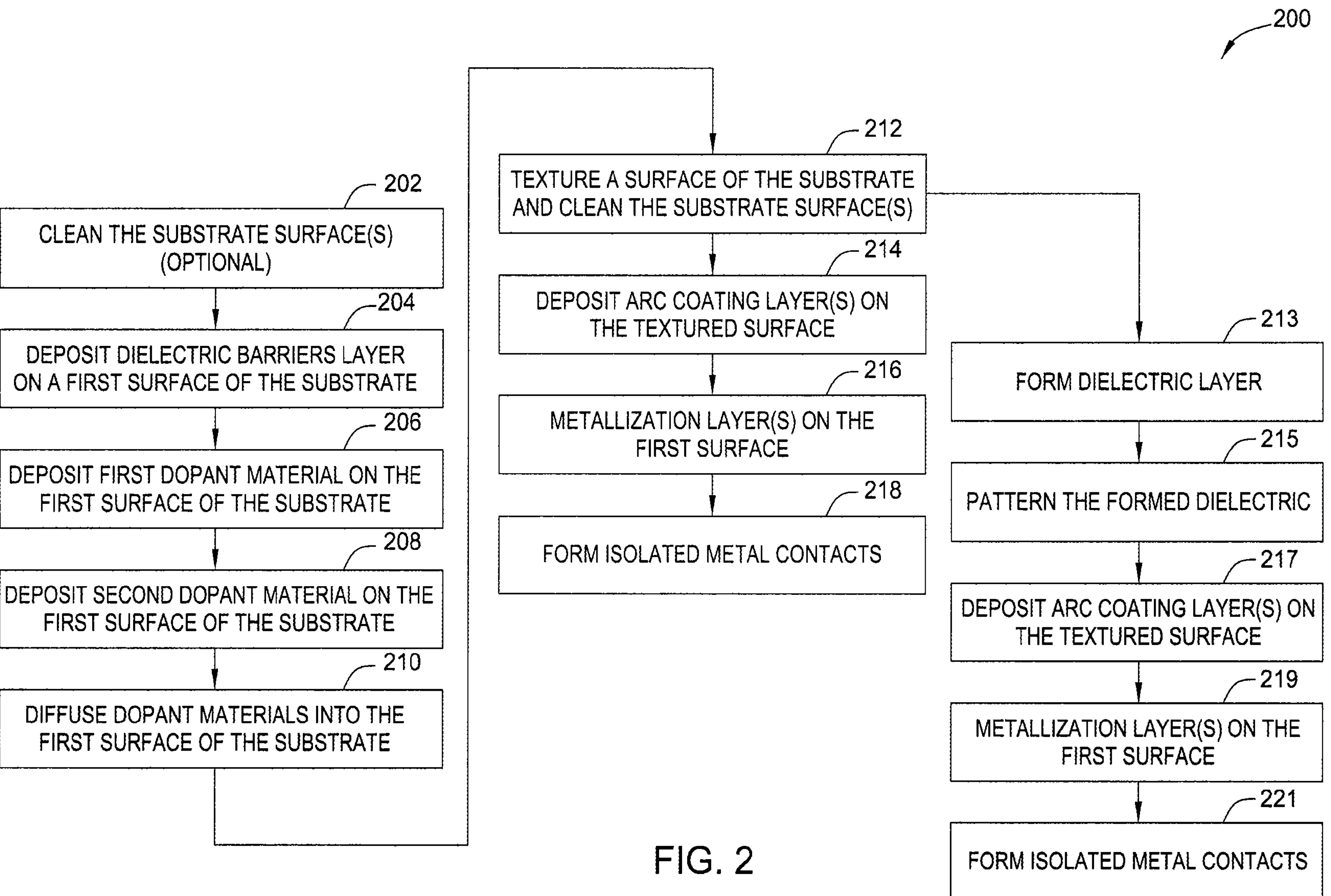

FIGS. 1A-1H1 and 1A-1J2 illustrate schematic cross-sectional views of a solar cell substrate 110 during different stages in a processing sequence used to form a contact structure 160 (FIG. 1H1 or 1J2) on a surface 102 of a solar cell 100. FIG. 2 illustrates a process sequence 200 used to form the active region(s) and/or contact structure on a solar cell. The sequences found in FIG. 2 correspond to the stages depicted in FIGS. 1A-1H1 or FIGS. 1A-1J2, which are discussed herein.

At box 202, shown in FIG. 2, the surfaces of the substrate 110 are cleaned to remove any undesirable material or roughness. In one embodiment, the clean process may be performed using a batch cleaning process in which the substrates are exposed to a cleaning solution. The substrates can be cleaned using a wet cleaning process in which they are sprayed, flooded, or immersed in a cleaning solution. The clean solution may be an SC1 cleaning solution, an SC2 cleaning solution, HF-last type cleaning solution, ozonated water solution, hydrofluoric acid (HF) and hydrogen peroxide ($H_2O_2$) solution, or other suitable and cost effective cleaning solution. The cleaning process may be performed on the substrate between about 5 seconds and about 600 seconds, such as about 30 seconds to about 240 second, for example about 120 seconds.

At box 204, as shown in FIGS. 1A and 2, dielectric features 111 are deposited on a surface 102 of the substrate 110. In one embodiment, the dielectric features 111 are formed from a dielectric paste material that is deposited by use of a conventional ink jet printing, rubber stamping, screen printing, or other similar process to form regions on the substrate surface 116 that are laterally isolated from each other (i.e., isolated regions 117). In one embodiment of the process described in box 204, after disposing the dielectric features on the surface of the substrate, the substrate is heated to a desirable temperature to cause the dielectric features 111 to form a bond with the substrate surface and densify to form a reliable isolating feature. The dielectric features may initially be a liquid, paste or gel that is patterned on to the substrate surface in a desired pattern, such as an array of adjacent rectangles, circles, hexagons, or other similarly shaped feature on the surface 102 of the substrate. In one embodiment, the dielectric features 111 are formed from a gel or paste that may contain particles of dielectric materials such as silicon nitride, silicon oxynitride, silicon dioxide, titanium dioxide, or other stable inorganic particle containing elements. Other inorganic materials may generally include materials that will not significantly diffuse into silicon at temperatures less than 1000° C., and more preferably 1100° C., in the time that would be required to damage the solar cell device due to the diffusion of the solar cell's electrically active dopants between layers, or regions, of the device. In one embodiment, the chemical composition of the material used to form the dielectric features 111, such that it will convert into a stable inorganic film after performing a high temperature curing step. The material, which may be deposited in the form of homogeneous liquid or gel "ink", will thus form a barrier to the mixing or interdiffusion of dopants contained in other adjacent deposited layers. Similarly, the precursor, or dielectric paste material, used to form the dielectric layer 111 may comprise a mixture of inorganic particles, dissolved precursors of the inorganic particles, and/or various organic solvents or suspension agents. The various organic solvents or suspension agents can be useful to facilitate the application of the material on the substrate surface, and can be selected so that will be removed during subsequent thermal cure steps. In some cases, even before performing a high temperature cure step, the positioning of the untreated dielectric layer 111 can be used to provide a physical barrier to the mixing of other subsequently deposited liquid, gel, or paste dopant containing precursors, thus allowing them to be fixed into place by evaporation or decomposition or liquid solvents or suspension agents. In one embodiment, after the dielectric features are deposited on the surface 116 of the substrate 110 the substrate is heated to a temperature of between about 100 and about 500° C. This thermal process, may be performed in a drying oven and screen printing device that is integrated together, such as the SoftLine tool manufactured by Baccini, SpA a division of Applied Materials, Inc. of Santa Clara Calif. In other embodiments, the substrate 110 may be heated (or "fired") at even higher temperatures useful to effect the consolidation of layer 111 to a more effective barrier material. In one embodiment, the surface 116 is the backside of a formed solar cell device. In one embodiment, the height "X" of the dielectric features 111 on the substrate surface 116 is between about 1 and 50 microns high. In one embodiment, the material from which the dielectric features 111 are formed is similar to material from which the dielectric spacers 305 are formed, which discussed below in conjunction with FIG. 3J.

At box 206, as shown in FIGS. 1B and 2, a first dopant material 131 is deposited into a plurality of the isolated regions 117 formed on the surface 116 of the substrate 110. In one embodiment, the first dopant material 131 is deposited or printed in a desired pattern by the use of ink jet printing, rubber stamping, screen printing, or other similar process into the one or more of the isolated regions 117. The first dopant material 131 may initially be a liquid, paste, or gel that will be used to form a doped region, which is isolated from the other isolated regions 117 by the dielectric features 111. In some cases, after disposing the first dopant material 131 in the isolated regions 117, the substrate is heated to a desirable temperature to assure that the first dopant material 131 will remain in the isolated region 117, and cause the dopant material 131 to cure, densify, and/or form a bond with the substrate surface. In one embodiment, the first dopant material 131 is a gel or paste that contains a p-type dopant. In one embodiment, the first dopant material 131 is a p-type dopant containing material that is configured to be screen printed using a screen printing system, which is described below, on a surface of the substrate 110. Typical p-type dopants used in silicon solar cell manufacturing are elements, such as, boron (B), aluminum (Al) or gallium (Ga). In one embodiment, after the first dopant material 131 is boron containing dopant paste that is deposited on the surface 116 of the substrate 110 the substrate is heated to a temperature of between about 80 and about 500° C. In other embodiments, the substrate may be heated to temperatures as high as 1100° C. so as to diffuse the contained dopant element into the underlying silicon. In one example, the first dopant material is configured so that after performing subsequent thermal processing steps (e.g., discussed in box 210) a doped regions is formed having a sheet resistance of less than about 50 Ohms per square (Ω/□) and/or has a doping level greater than about $10^{18}$ atoms/$cm^3$ at the surface of the substrate.

At box 208, as shown in FIGS. 1C and 2, a second dopant material 132 is deposited into a plurality of the unfilled isolated regions 117 formed on the surface of the substrate 110. In one embodiment, the second dopant material 132 is deposited by use of a conventional ink jet printing, rubber stamping, screen printing, or other similar process into the one or more of the isolated regions 117. The second dopant material 132 may initially be a liquid, paste or gel that will be used to form a doped region, which is isolated from the first dopant material 131 by the dielectric features 111. In some cases, after disposing the second dopant material 132 on the substrate is heated to a desirable temperature to cause the second dopant material 132 to cure, densify and/or form a bond with the substrate surface, and to assure that material will not leave its isolated region 117. In one embodiment, the second dopant material 132 is a gel or paste that contains a material that contains an n-type dopant. In one embodiment, the first dopant material 131 is an n-type dopant containing material that is configured to be screen printed using a screen printing system, which is described below, on a surface of the substrate 110. Typical n-type dopants used in silicon solar cell manufacturing are elements, such as, phosphorus (P), arsenic (As), or antimony (Sb). In one embodiment, the second dopant material 132 is phosphorous containing dopant paste that is deposited on the surface 116 of the substrate 110 and the substrate is heated to a temperature of between about 80 and about 500° C. In one example, the second dopant material is configured so that after performing subsequent thermal processing steps (e.g., discussed in box 210) a doped regions is formed having a sheet resistance of less than about 50 Ohms per square (Ω/□) and/or has a doping level greater than about $10^{18}$ atoms/$cm^3$ at the surface of the substrate.

In one embodiment, the doping material 132 may be added to an etching material designed to penetrate through any thin dielectric layers already present on the wafer surface, such that an improved contact to the silicon surface can also be formed. In one example, the etching material is similar to the material described in conjunction with FIG. 5H, which shown below. In one embodiment, the second dopant material 132 may contain materials selected from a group consisting of phosphoric acid ($H_3PO_4$), phosphorus acid ($H_3PO_3$), hypophosphorous acid ($H_3PO_2$), and/or various ammonium salts thereof.

In one embodiment, it is also desirable to deposit a capping layer (not shown) over the first dopant material 131 and the second dopant material 132 prior to performing the processes described in box 210 to prevent volatile components in the first dopant material 131 or the second dopant material 132 from vaporizing and depositing on unwanted regions of the substrate surface. In one embodiment, the capping layer is selectively deposited over the first dopant material 131 to encapsulate the first dopant material 131 prior to depositing the second dopant material 132. In another embodiment, the capping layer is selectively deposited over the second dopant material 132 to encapsulate the second dopant material 132 after depositing the first dopant material 131. The capping layer may be selectively deposited over the first dopant material 131 and/or second dopant material 132 found in each of the isolated regions 117 (FIG. 1C) using a screen printing, ink jet printing or other similar process. The capping layer may also be deposited non-selectively over the entire surface of the wafer by a technique such as spray coating, spin-coating, roll coating, or dip coating. In one embodiment, the capping material is a dielectric material, such as gel or paste that contains particles of a material, such as silicon nitride (SiN), silicon oxynitride (SiON), silicon carbide ($Si_xC_y$), titanium oxide ($TiO_2$), silicon dioxide ($SiO_2$), a glass frit, or other similar materials or any combination of the above materials. The capping material may also comprise one or more of the precursors used to form the dielectric barriers 111, discussed above. In some cases the cap layer may be a blanket layer that is deposited over a surface of the substrate using a conventional APCVD, PECVD, PVD, or other gas phase deposition process. In one case the blanket film is a silicon oxide material. After depositing the blanket layer, one or more regions of the deposited capping layer may be subsequently etched to expose underlying regions of the substrate by use of a conventional dry etch, laser ablation, wet etch or other similar material removal process. An example of a etching process that can be desirable is further described in the U.S. patent application Ser. No. 12/274,023, which is incorporated by reference in its entirety.

At box 210, as shown in FIGS. 1D and 2, the substrate is heated to a temperature greater than about 800° C. to cause the doping elements in the first and second dopant materials to diffuse into the surface 116 of the substrate 110 to form a p-type region 141 and an n-type region 142 within the substrate 110. In one embodiment, the substrate is heated to a temperature between about 800° C. and about 1300° C. in the presence of nitrogen ($N_2$), oxygen ($O_2$), hydrogen ($H_2$), air, or combinations thereof for between about 1 and about 120 minutes. In one embodiment, the formed p-type region 141 and n-type region 142 can thus be used to form regions of a point contact type solar cell.

An optional cleaning process may then be performed on the substrate 110 after the process performed at box 210 has been completed to remove any undesirable residue from the substrate surface. The cleaning process may be similar or the same as the cleaning process described above at box 202 in FIG. 2 and/or the cleaning process described in conjunction with FIG. 17E. Alternatively, the substrate may be cleaned by any other suitable manners.

At box 212, as shown in FIGS. 1E and 2, a texturizing process is performed on the opposing surface 101 of the substrate 110 to form a textured surface 151. In one example, the average depth of the texture formed has a roughness of between about 1 μm and about 10 μm. In one embodiment, the opposing surface 101 of the substrate 110 is the front side of a solar cell substrate that is adapted to receive sunlight after the solar cell has been formed. An example of an exemplary texturizing process is further described in the Provisional Patent Application Ser. No. 61/039,384, filed Mar. 25, 2008, which is incorporated by reference. In one embodiment, at least some portion of the dielectric layer 111, the first dopant material 131, the second dopant material 132, and/or the capping layer is allowed to remain on the surface of the substrate following the high temperature diffusion process, so as to form an effective barrier to the alkaline etching chemistry used to texture the front side of the solar cell.

In one embodiment, the processing sequence may continue on with the process steps described at boxes 214, 216, and 218 and illustrated in FIGS. 1F-1H1. In an alternate embodiment, the processing sequence may continue on using the processing steps described at boxes 213, 215, 217, 219, and 221 and illustrated in FIGS. 1G2-1J2. These different processing sequences will be further described below.

In one embodiment, after the processes are performed at box 212, the processing may continued on at box 214, as shown in FIGS. 1F and 2. Therefore, after the opposing surface 101 is textured, a thin passivation and antireflection layer 153 and/or transparent conductive oxide (TCO) layer 152 are formed thereon. One will note that the preparation of the opposing surface 101 completed at boxes 212 and 214 may also be performed prior to performing the process at box 204, or other steps in the process sequence 200, without deviating from the basic scope of the invention described herein. In one embodiment, the front surface layer 153 may comprise an intrinsic amorphous silicon layer (i-a-SiH) and n-type amorphous silicon layer (n-a-Si:H) stack followed by a transparent conductive oxide (TCO) layer and/or an ARC layer (e.g., silicon nitride) which can be deposited by use of a physical vapor deposition process (PVD) or chemical vapor deposition process. The stack is generally configured to generate a front surface field effect to reduce surface recombination and promote lateral transport or electron carriers to nearby n+ contacts on the rear-side.

At box 216, as illustrated in FIGS. 1G1 and 2, a conducting layer 163 is deposited over the surface 102 of the substrate 110. In one embodiment, the formed conducting layer 163 is between about 500 and about 50,000 angstroms (Å) thick and contains a metal, such as aluminum, (Al), copper (Cu), silver (Ag), gold (Au), tin (Sn), cobalt (Co) nickel (Ni), zinc (Zn), lead (Pb), molybdenum (Mo), titanium (Ti), tantalum (Ta), vanadium (V), tungsten (W), or chrome (Cr). In one embodiment, the conducting layer 163 contains two layers that are formed by first depositing an aluminum (Al) layer 161 by a physical vapor deposition (PVD) process, or evaporation process, and then depositing a nickel vanadium (NiV) capping layer 162 by use of a PVD deposition process.

At box 218, as illustrated in FIGS. 1H1 and 2, the conducting layer 163 is patterned to electrically isolate desired regions of the substrate 110 to form an interconnecting structure 160. In one embodiment, the regions of the substrate 110 are electrically isolated by forming channels 171 in the conducting layer 163 by one or more laser ablation, patterning and wet or dry etching, or other similar techniques. The channels 171 may be aligned so that bottom of the formed channels 171 is aligned with the dielectric features 111. In general, it is desirable to form or align the channels 171 so that a separate or interdigitated electrical connection structure, or interconnecting structure 160, can be formed to connect the desired p-type or n-type regions of the solar cell device. The channels 171 may be formed by laser ablation.

In another embodiment of the process sequence 200, after the processes at box 212 are performed the process sequence continues on to box 213, as shown in FIGS. 1G2 and 2, in which a dielectric layer 122 is formed on at least one surface of the substrate 110. In one embodiment, the dielectric layer 122 is a silicon oxide layer, such as a silicon dioxide layer, formed on the surface 102 of a silicon containing substrate. The silicon oxide containing dielectric layer 122 may be formed using a conventional thermal oxidation process, such a furnace annealing process, a rapid thermal oxidation process, an atmospheric pressure or low pressure CVD process, a plasma enhanced CVD process, a PVD process, or applied using a sprayed-on, spin-on, roll-on, screen printed, or other similar type of deposition process. In one embodiment, the dielectric layer 122 is a silicon dioxide layer that is between about 50 Å and about 3000 Å thick. In another embodiment the dielectric layer is a silicon dioxide layer that is less than about 2000 Å thick. In one embodiment, the surface 102 is the backside of a formed solar cell device. It should be noted that the discussion of the formation of a silicon oxide type dielectric layer is not intended to be limiting as to the scope of the invention described herein since the dielectric layer 122 could also be formed using other conventional deposition processes (e.g., PECVD deposition) and/or be made of other dielectric materials.

In box 215, as shown in FIGS. 1H2 and 2, the dielectric layer 122 formed on the backside surface 102 of the substrate is etched by conventional means to form a desired pattern of exposed regions 123 that can be used to form the backside contact structure 160 (FIG. 1I2) on the substrate surface. Typical etching processes that may be used to form the patterned exposed regions 123 on the backside surface 102 may include but are not limited to masking (preferably by screen printing) together with wet or dry etch processes, laser ablation techniques, or other similar processes that may be used form a desired pattern in the deposited dielectric layer 122. The exposed regions 123 generally provide surfaces through which electrical connections can be made to the backside surface 102 of the substrate 110.

In one embodiment of the processes performed at box 215, an etchant material, or etch gel, is selectively deposited on the dielectric layer 122 by use of a conventional ink jet printing, rubber stamping, screen printing, or other similar process to form and define the desired regions 123. The deposited pattern etching process generally starts by first depositing an etchant material in a desired pattern on a surface of the substrate 110. In one embodiment, the etchant material comprises ammonium fluoride ($NH_4F$), a solvent that forms a homogeneous mixture with ammonium fluoride, a pH adjusting agent (e.g., BOE, HF), and a surfactant/wetting agent. In one example, the etchant material comprises 20 g of ammonium fluoride that is mixed together with 5 ml of dimethylamine, and 25 g of glycerin, which is then heated to 100° C. until the pH of the mixture reaches about 7 and a homogeneous mixture is formed. It is believed that one benefit of using an alkaline chemistry is that no volatile HF vapors will be generated until the subsequent heating process(es) begins to drive out the ammonia ($NH_3$), thus reducing the need for expensive and complex ventilation and handling schemes prior to performing the heating process(es). After depositing the etchant material in a desired pattern, the substrate is then heated to a temperature of between about 200-300° C. to cause the chemicals in the etchant material to etch the dielectric layer 122. In one embodiment, the etching material and etching process steps performed at box 213 are similar to the etching process discussed in the U.S. Provisional Patent Application Ser. No. 61/048,001 and copending U.S. patent application Ser. Nos. 12/274,023, filed Nov. 19, 2008, which are both herein incorporated by reference in their entirety.

At box 217, as shown in FIGS. 1H2 and 2, after the opposing surface 101 is textured a thin passivation and antireflection layer 153 and/or transparent conductive oxide (TCO) layer 152 are formed thereon. One will note that the preparation of the opposing surface 101 completed at boxes 212-214 and 217 may also be performed prior to performing the process at box 204, or other steps in the process sequence 200, without deviating from the basic scope of the invention described herein.

It is contemplated in one embodiment of the process sequence 200 that the processing steps performed at boxes 213-215 are removed from the overall process sequence. In this configuration, the processing sequence 200 would generally require performing box 217 after performing box 212. However, it is believed that the application of a patterned dielectric layer can help reduce the number of carrier recombination sites that are present at the surface of the substrate 110 by reducing the surface area of the substrate that the deposited conducting layer 163 (Box 219) contacts. Reducing the carrier recombination will improve the overall efficiency of the formed solar cell device.

At box 219, as illustrated in FIGS. 1I2 and 2, a conducting layer 163 is deposited over the surface 102 of the substrate 110. In one embodiment, the formed conducting layer 163 is between about 500 and about 50,000 angstroms (Å) thick and contains a metal, such as aluminum, (Al), copper (Cu), silver (Ag), gold (Au), tin (Sn), cobalt (Co) nickel (Ni), zinc (Zn), lead (Pb), molybdenum (Mo), titanium (Ti), tantalum (Ta), vanadium (V), tungsten (W), or chrome (Cr). In one embodiment, the conducting layer 163 contains two layers that are formed by first depositing an aluminum (Al) layer 161 by a physical vapor deposition (PVD) process, or evaporation process, and then depositing a nickel vanadium (NiV) capping layer 162 by use of a PVD deposition process.

At box 221, as illustrated in FIGS. 1J2 and 2, the conducting layer 163 is patterned to electrically isolate desired regions of the substrate 110 to form an interconnecting structure 160. In one embodiment, the regions of the substrate 110 are electrically isolated by forming channels 171 in the conducting layer 163 by one or more laser ablation, patterning and wet or dry etching, use of a conventional screen printable metal etchant paste, or other similar techniques. The channels 171 may be aligned so that bottom of the formed channels 171 is aligned with the dielectric features 111. In general, it is desirable to form or align the channels 171 so that a separate or interdigitated electrical connection structure, or interconnecting structure 160, can be formed to connect the desired p-type or n-type regions of the solar cell device. The channels 171 may be formed by laser ablation.

Alternate Patterned Solar Cell Formation Process

FIGS. 3A-3L illustrate schematic cross-sectional views of a solar cell substrate 110 during different stages in a processing sequence used to form a backside contact structure 360 (FIG. 3L) on a surface 102 of the solar cell 100. FIG. 4 illustrates a process sequence 400 used to form the active region(s) and/or contact structure on a solar cell. The sequence found in FIG. 4 corresponds to the stages depicted in FIGS. 3A-3L, which are discussed herein. In this configuration of process steps, the processes performed in each of the boxes 402-410 and illustrated in FIGS. 3A-3E and 4 are similar to the processes discussed above in conjunction with each of the boxes 202-210 and FIGS. 1A-1E, and are not discussed below.

Therefore, after performing the processes illustrated in boxes 402-410, at box 412 a texturizing process is performed on the opposing surface 101 of the substrate 110 to form a textured surface 151. In one embodiment, the opposing surface 101 of the substrate 110 is the front side of a solar cell substrate that is adapted to receive sunlight after the solar cell has been formed. An example of an exemplary texturizing process is further described in the U.S. patent application Ser. No. 12/383,350, filed Mar. 23, 2009, which is incorporated by reference.

Figure 3A:
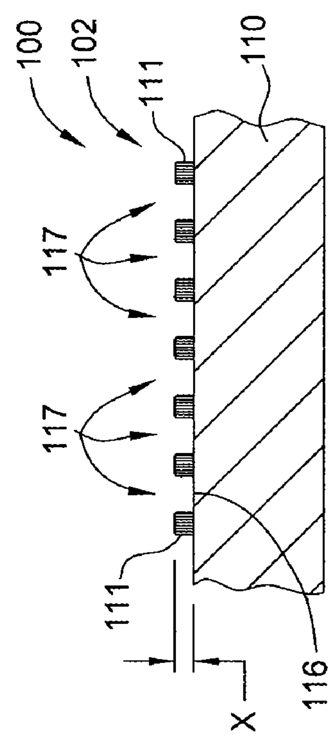
FIGS. 3A-3L illustrate schematic cross-sectional views of a solar cell during different stages in a sequence according to one embodiment of the invention.
Figure 3B:
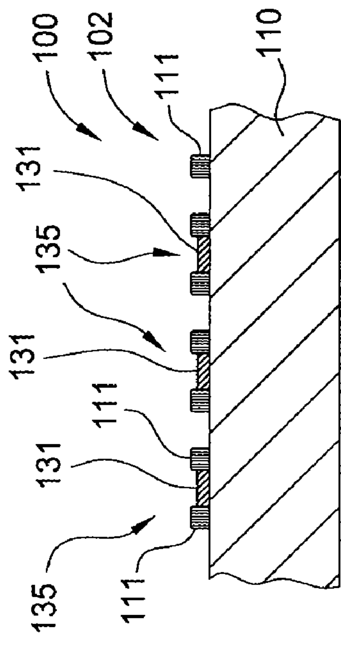
Figure 3C:
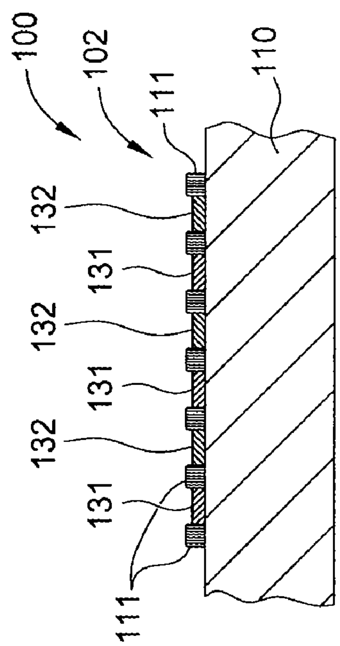
Figure 3D:
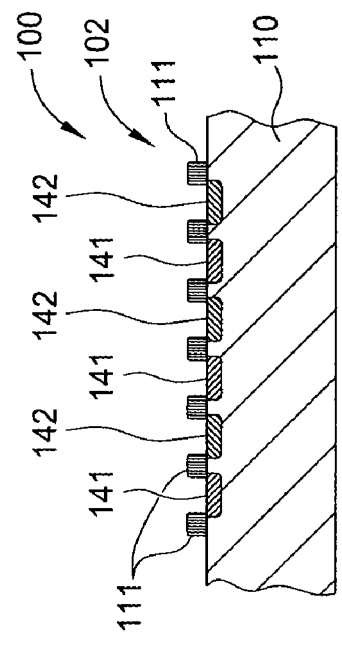
Figure 3F:
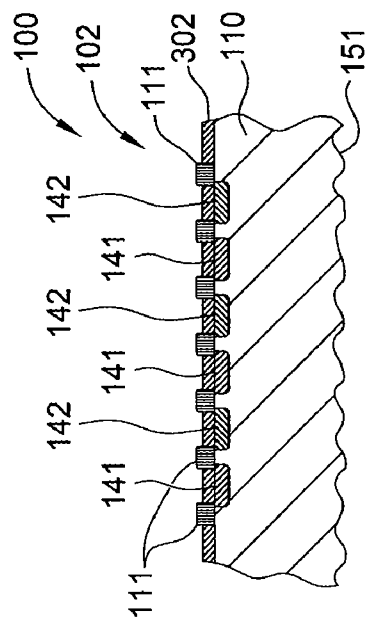

At box 414, as shown in FIG. 3F, a dielectric layer 302 is formed on at least one surface of the substrate 110. In one embodiment, the dielectric layer 302 is a silicon oxide layer, such as a silicon dioxide layer, formed on the surface 102 of a silicon containing substrate. The silicon oxide containing dielectric layer 302 may be formed using a conventional thermal oxidation process, such a furnace annealing process, a rapid thermal oxidation process, an atmospheric pressure or low pressure CVD process, a plasma enhanced CVD process, a PVD process, or applied using a sprayed-on, spin-on, roll-on, screen printed, or other similar type of deposition process. In one embodiment, the dielectric layer 302 is a silicon dioxide layer that is between about 50 Å and about 3000 Å thick. In another embodiment the dielectric layer is a silicon dioxide layer that is less than about 2000 Å thick. In one embodiment, the surface 102 is the backside of a formed solar cell device. It should be noted that the discussion of the formation of a silicon oxide type dielectric layer is not intended to be limiting as to the scope of the invention described herein since the dielectric layer 302 could also be formed using other conventional deposition processes (e.g., PECVD deposition) and/or be made of other dielectric materials.

In cases where a passivation layer has not been formed on the front surface of the solar cell substrate, the process sequence 400 then may include one or more steps (i.e., box 416) that are then performed to form a silicon containing layer thereon. In one embodiment, a silicon nitride (SiN) passivation and antireflection layer, or thin amorphous silicon (a-Si:H) layer or amorphous silicon carbide (a-SiC:H) layer and silicon nitride (SiN) stack is formed on the front surface 101 using a conventional chemical vapor deposition (PECVD) technique using for example, an Applied Materials AKT PECVD system with multiple solar cell substrates supported on a suitable large area carrier.

Figure 3H:
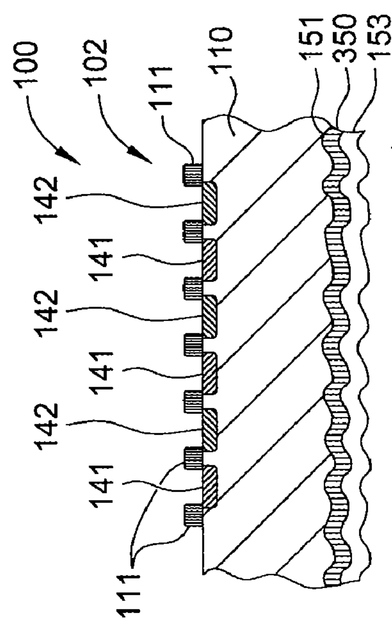
Figure 3E:
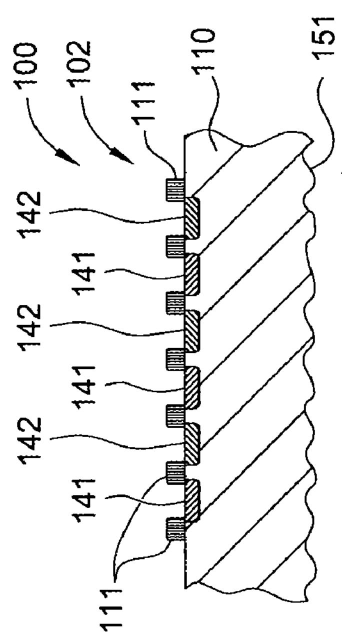
Figure 3G:
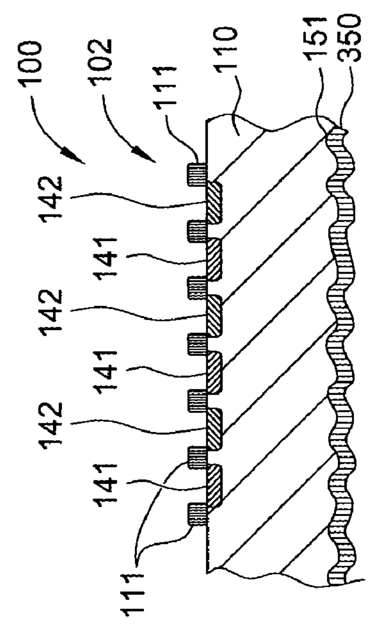

In box 418, as shown in FIGS. 3G, 3H and 4, after the opposing surface 101 is textured, a front surface layer 350, as shown in FIG. 3G, may be formed on the opposing surface 101 of the substrate. In one embodiment, the front surface layer 350 may comprise an intrinsic amorphous silicon layer (i-a-SiH) and n-type intrinsic amorphous silicon layer (n-a-Si:H) stack followed by a transparent conductive oxide (TCO) layer and/or an ARC layer (e.g., silicon nitride) 153, as shown in FIG. 3H) which can be deposited by use of a physical vapor deposition process (PVD) or chemical vapor deposition process. The stack is generally configured to generate a front surface field effect to reduce surface recombination and promote lateral transport or electron carriers to nearby n+ contacts on the rearside.

Figure 3J:
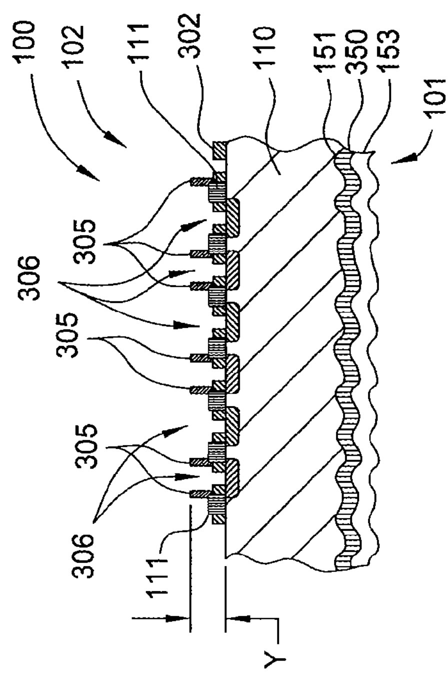
Figure 3L:
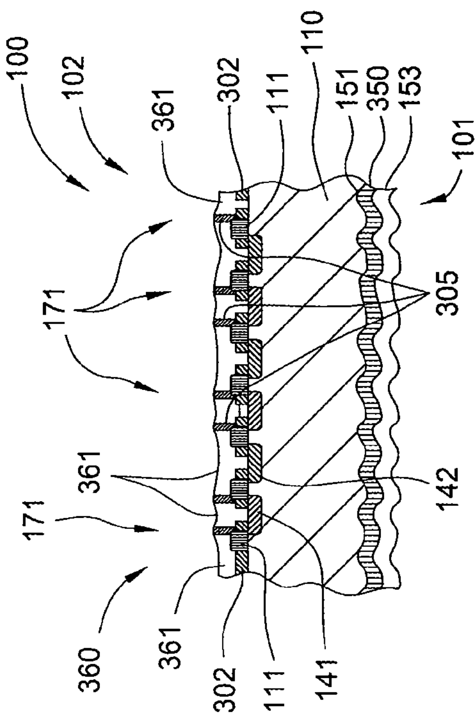
Figure 3I:
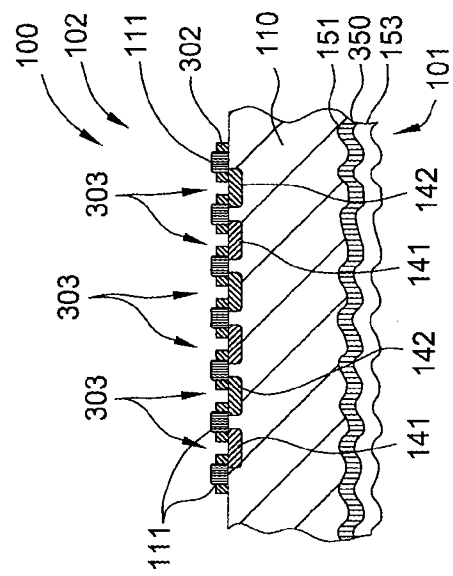

In box 420, as shown in FIGS. 3I and 4, the dielectric layer 302 formed on the backside surface 102 of the substrate is etched by conventional means to form a desired pattern of exposed regions 303 that can be used to form the backside contact structure 360 (FIG. 3L) on the substrate surface. Typical etching processes that may be used to form the patterned exposed regions 303 on the backside surface 102 may include but are not limited to masking (for example by screen printing) together with wet or dry etch processes, laser ablation techniques, or other similar processes that may be used to form a desired pattern in the deposited dielectric layer 302. The exposed regions 303 generally provide surfaces through which electrical connections can be made to the backside surface 102 of the substrate 110.

In one embodiment of the processes performed at box 420, an etchant material, or etch gel, is selectively deposited on the dielectric layer 302 by use of a conventional ink jet printing, rubber stamping, screen printing, or other similar process to form and define the desired regions 303. The deposited pattern etching process generally starts by first depositing an etchant material in a desired pattern on a surface of the substrate 110. In one embodiment, the etchant material comprises ammonium fluoride ($NH_4F$), a solvent that forms a homogeneous mixture with ammonium fluoride, a pH adjusting agent (e.g., BOE, HF), and a surfactant/wetting agent. In one example, the etchant material comprises 20 g of ammonium fluoride that is mixed together with 5 ml of dimethylamine, and 25 g of glycerin, which is then heated to 100° C. until the pH of the mixture reaches about 7 and a homogeneous mixture is formed. It is believed that one benefit of using an alkaline chemistry is that no volatile HF vapors will be generated until the subsequent heating process(es) begins to drive out the ammonia ($NH_3$), thus reducing the need for expensive and complex ventilation and handling schemes prior to performing the heating process(es). After depositing the etchant material in a desired pattern, the substrate is then heated to a temperature of between about 200-300° C. to cause the chemicals in the etchant material to etch the dielectric layer 302.

In one embodiment, the etching material and etching process steps performed at box 420 are similar to the etching process discussed in the U.S. Provisional Patent Application Ser. No. 61/048,001 and copending U.S. patent application Ser. Nos. 12/274,023, filed Nov. 19, 2008, which are both herein incorporated by reference in their entirety. FIG. 3I illustrates the patterned dielectric layer 303 formed after performing steps 402-420 shown in FIG. 4.

In one embodiment, an optional cleaning process, shown in box 422, is then performed on the substrate 110 to remove any undesirable residue and/or form one or more passivated surfaces on the substrate. The cleaning process may be similar or the same as the cleaning process described above at box 202 in FIG. 2. Alternatively, the substrate may be cleaned by any suitable manners.

At box 424, as illustrated in FIGS. 3J and 4, a plurality of dielectric spacers 305 are selectively deposited on the surface 102 of the substrate 110. In one embodiment, the dielectric spacers 305 are formed from a dielectric paste material that is deposited by use of a screen printing process, for example using a Baccini™ screen printer, to form regions on the substrate surface 306 that are laterally isolated from each other. In one embodiment of the process described in box 424, after disposing the dielectric spacers 305 on the surface of the substrate, the substrate is heated to densify the material in the dielectric spacers 305 and form a bond with portions of the substrate surface to form a reliable isolating element. The dielectric spacers 305 may initially be a liquid, paste or gel that is patterned on to the substrate surface in a desired pattern, such as an array of adjacent rectangles, circles, hexagons, or other similarly shaped feature on the surface 102 of the substrate. In one embodiment, the dielectric spacers 305 is a gel or paste that contains particles that contain a material, such as silicon nitride (SiN), silicon oxynitride (SiON), titanium oxide ($TiO_2$), magnesium oxide (MgO), barium oxide (BaO), silicon dioxide ($SiO_2$), silicon carbide ($Si_xC_y$), or other high temperature stable dielectric materials or combinations thereof. Alternatively the material used to form the dielectric spacers, or precursor, may contain soluble components which will convert to a high temperature stable dielectric material after performing a high temperature cure process. The precursor should generally be substantially free of elements prone to diffusion into crystalline silicon at rates comparable to those of typically used dopant atoms such as boron and phosphorus. In one embodiment, after the dielectric spacers 305 are deposited on the surface 116 of the substrate 110 the substrate is heated to a temperature of between about 100 and about 1000° C. In one embodiment, the surface 306 is the backside of a formed solar cell device. In one embodiment, the height "Y" of the dielectric spacers 305 on the surface 102 is between about 0.10 and about 40 micrometers (μm) high.

Figure 3K:
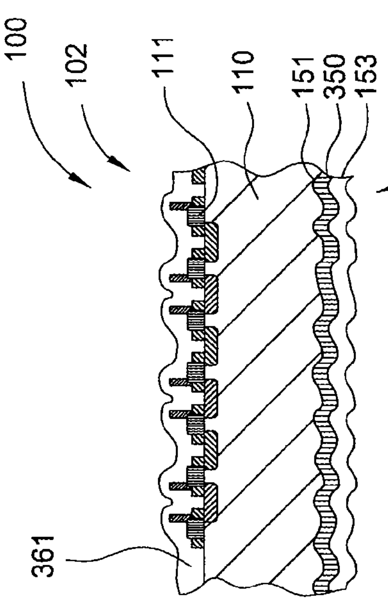

At box 426, as illustrated in FIGS. 3K and 4, a conducting layer 361 is deposited over the surface 102 of the substrate 110. In one embodiment, the formed conducting layer 361 is between about 500 and about 50,000 angstroms (Å) thick and contains a metal, such as aluminum (Al), copper (Cu), silver (Ag), gold (Au), tin (Sn), cobalt (Co), nickel (Ni), zinc (Zn), lead (Pb), palladium (Pd)), titanium (Ti), tantalum (Ta), vanadium (V), tungsten (W), chrome (Cr) and/or molybdenum (Mo).

In one embodiment, the conducting layer 163 is formed by depositing a 2000 Å to 20,000 Å thick layer of aluminum (Al) by a physical vapor deposition (PVD) process or evaporation process. In another embodiment, the conducting layer 163 contains two layers that are formed by first depositing an aluminum (Al) layer by a physical vapor deposition (PVD) process, or evaporation process, and then depositing a nickel vanadium (NiV), tin (Sn), zinc (Zn), or silver (Ag) capping layer by use of a PVD deposition process.

At box 428, as illustrated in FIGS. 3L and 4, the conducting layer 361 is patterned to electrically isolate desired regions of the substrate 110 to form an interconnecting structure 360. In general, the dielectric spacers 305 are used to electrically isolate the portions of conducting layer 163 disposed in the adjacent regions 361. In one configuration, the dielectric spacers 305 are patterned to form a separate or interdigitated electrical connection structure, or interconnecting structure 360, to connect the desired p-type or n-type regions of the solar cell device. In one embodiment, the regions of the substrate 110 are electrically isolated by use of one or more laser ablation, polishing, sanding, use of a conventional screen printable metal etchant paste, and/or wet etching steps, or by applying (as by screen printing) a polymeric etch mask followed by either wet or dry etching. One such structure is discussed in conjunction with FIGS. 9-10, below.

Second Alternate Patterned Solar Cell Formation Process

Figure 6:
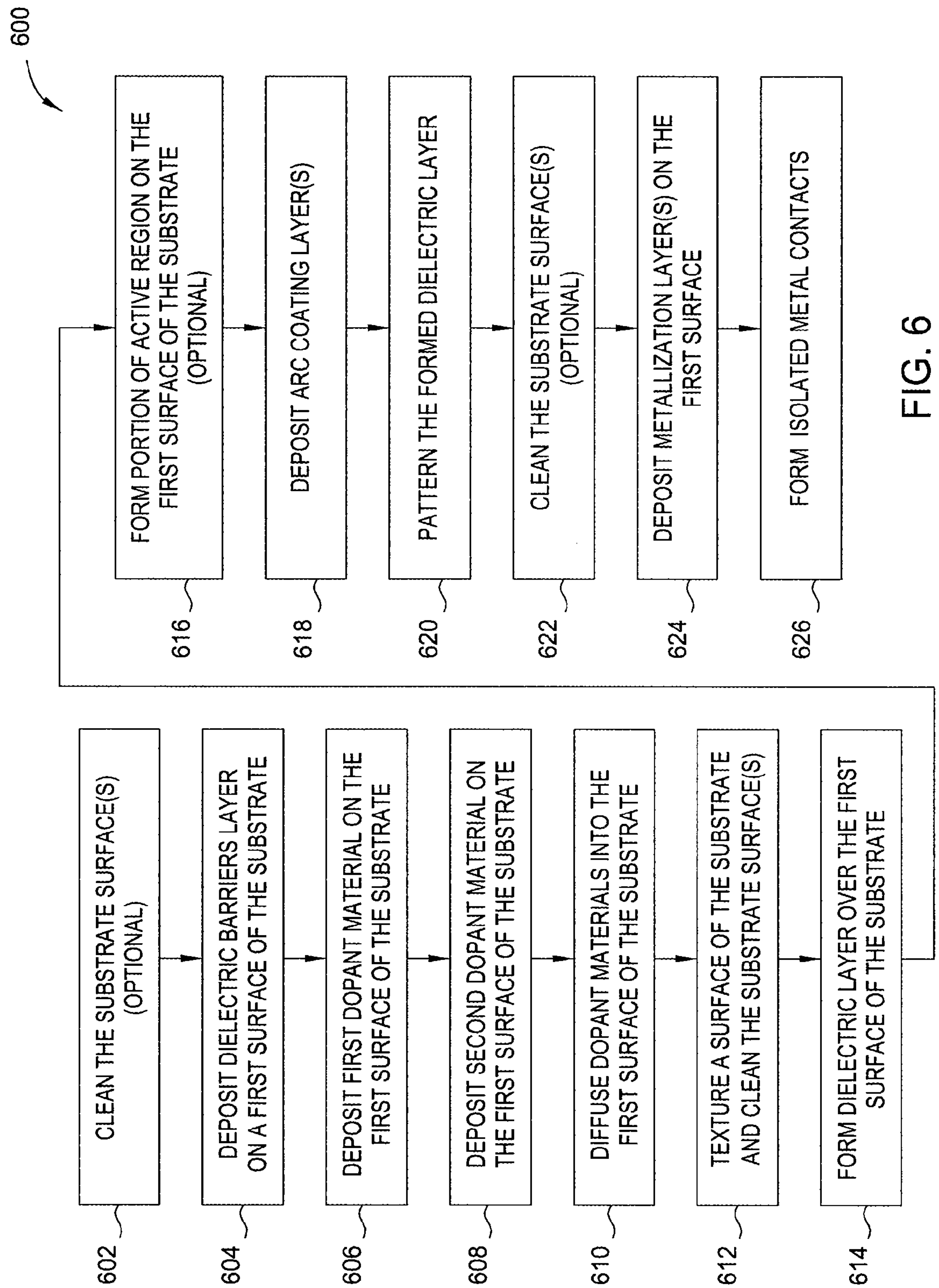
FIG. 6 illustrates a flow chart of methods to metalize a solar cell according to embodiments of the invention.

FIGS. 5A-5J illustrate schematic cross-sectional views of a solar cell substrate 110 during different stages in a processing sequence used to form a contact structure on a surface 102 of the solar cell 500. FIG. 6 illustrates a process sequence 600 used to form the active region(s) and/or contact structure on a solar cell. The sequence found in FIG. 6 corresponds to the stages depicted in FIGS. 5A-5J, which are discussed herein. In this configuration of process steps, the processes performed in each of the boxes 602-610 and illustrated in FIGS. 5A-5D are similar to the processes discussed above in conjunction with each of the boxes 202-212 and FIGS. 1A-1D, and are not discussed below.

Therefore, after performing the processes illustrated in boxes 602-610, at box 612, as shown in FIGS. 5E and 6, a texturizing process is performed on the opposing surface 101 of the substrate 110 to form a textured surface 151. In one embodiment, the opposing surface 101 of the substrate 110 is the front side of a solar cell substrate that is adapted to receive sunlight after the solar cell has been formed. An example of an exemplary texturizing process is further described in the U.S. patent application Ser. No. 12/383,350, filed Mar. 23, 2009, which is incorporated by reference. Also, during at least one part of the processes performed at box 612 the dielectric features 111 are removed from the surface of the 102 of the substrate 110 by use of an etching process, mechanical polishing, mechanical abrasion process, or other similar technique.

At box 614, as shown in FIG. 5F, a dielectric layer 511 is formed or deposited on at least one surface of the substrate 110. In one embodiment, the dielectric layer 511 is a silicon oxide layer formed on the surface 102 of a silicon containing substrate. The silicon oxide containing dielectric layer 511 may be formed using a conventional thermal oxidation process, such a furnace annealing process, a rapid thermal oxidation process, an atmospheric pressure or low pressure CVD process, a plasma enhanced CVD process, a PVD process, or applied using a sprayed-on, spin-on, roll-on, screen printed, or other similar type of deposition process. In one embodiment, the dielectric layer 511 is a silicon dioxide layer that is between about 50 Å and about 3000 Å thick. In another embodiment the dielectric layer 511 is a silicon dioxide layer that is less than about 2000 Å thick. In one embodiment, the surface 102 is the backside of a formed solar cell device. It should be noted that the discussion of the formation of a silicon oxide type dielectric layer is not intended to be limiting as to the scope of the invention described herein since the dielectric layer 511 could also be formed using other conventional deposition processes (e.g., PECVD deposition) and/or be made from other dielectric materials.

In cases where a passivation layer has not been formed on the front surface of the solar cell substrate, the process sequence 600 then may include one or more steps (i.e., box 616) that are then performed to form a silicon layer thereon. In one embodiment, a silicon nitride (SiN) passivation and antireflection layer, or thin amorphous silicon (a-Si:H) layer or amorphous silicon carbide (a-SiC:H) layer and silicon nitride (SiN) stack is formed on the front surface 101. In one example, the deposited layer(s) are formed using a conventional chemical vapor deposition (PECVD) technique using for example, an Applied Materials AKT PECVD system with multiple solar cell substrates supported on a suitable large area carrier.

In box 618, as shown in FIGS. 5G and 6, after the opposing surface 101 is textured, a front surface layer 153 may be formed on the opposing surface 101 of the substrate. In one embodiment, the front surface layer 153 comprises a transparent conductive oxide (TCO) layer and/or ARC layer (e.g., silicon nitride) which are deposited by use of a physical vapor deposition process (PVD), chemical vapor deposition process (CVD), or other similar technique. The front surface layer 153 may be formed by one of the processes and/or comprise one or more of the layers described above.

In box 620, as shown in FIGS. 5H and 6, the dielectric layer 511 formed on the backside surface 102 of the substrate is etched by conventional means to form a desired pattern of exposed regions 512 that can be used to form the backside contact structure 560 (FIG. 5J) on the substrate surface. Typical etching processes that may be used to form the patterned exposed regions 512 on the backside surface 102 may include but are not limited to patterning and dry etching techniques, laser ablation techniques, patterning and wet etching techniques, or other similar processes that may be used form a desired pattern in the deposited dielectric layer 511. The exposed regions 512 generally provide surfaces through which electrical connections can be made to the backside surface 102 of the substrate 110.

In one embodiment of the processes performed at box 620, an etchant material is selectively deposited on the dielectric layer 511 by use of a conventional ink jet printing, rubber stamping, screen printing, or other similar technique, and heated to form and define the desired regions 512. In one embodiment, the etching material and pattern etching process steps performed at box 620 are the same as the etching process(es) discussed in the in the U.S. patent application Ser. No. 12/274,023, which is incorporated by reference in its entirety. FIG. 5H illustrates the patterned dielectric layer 511 formed after performing steps 602-618 shown in FIG. 6.

As shown in box 622, in one embodiment, an optional cleaning process is performed on the substrate 110 after the process performed in box 620 has been completed to remove any undesirable residue and/or form a passivated surface. The cleaning process may be similar or the same as the cleaning process described above at box 202 in FIG. 2 and the process described in conjunction with FIG. 17E. Alternatively, the substrate may be cleaned by any suitable manners.

At box 624, as illustrated in FIGS. 5I and 6, a conducting layer 163 is deposited over the surface 102 of the substrate 110. In one embodiment, the formed conducting layer 163 is between about 500 and about 50,000 angstroms (Å) thick and contains a metal, such as aluminum (Al), silver (Ag), tin (Sn), cobalt (Co), rhenium (Rh), nickel (Ni), zinc (Zn), lead (Pb), palladium (Pd), molybdenum (Mo) titanium (Ti), tantalum (Ta), vanadium (V), tungsten (W), or chrome (Cr). However, in some cases copper (Cu) may be used as a second layer, or subsequent layer, that is formed on a suitable barrier layer (TiW, Ta, etc.). In one embodiment, the conducting layer 163 contains two layers that are formed by first depositing an aluminum (Al) layer 161 by a physical vapor deposition (PVD) process, or evaporation process, and then depositing a nickel vanadium (NiV) capping layer 162 by use of a PVD deposition process.

At box 626, as illustrated in FIGS. 5J and 6, the conducting layer 163 is patterned to electrically isolate desired regions of the substrate 110 to form an interconnecting structure 560. In one embodiment, the regions of the substrate 110 are electrically isolated by forming channels 171 in the conducting layer 163 by one or more laser ablation, patterning and dry etching, use of a conventional screen printable metal etchant paste, or other similar techniques. The channels 171 may be aligned so that bottom of the formed channel 171 is aligned with the dielectric layer 511. In embodiment, it is desirable to form or align the channels 171 so that a separate or interdigitated electrical connection structure, or interconnecting structure 560, can be formed to connect the desired p-type or n-type regions of the solar cell device. The channels 171 may be formed by laser ablation.

Third Alternate Patterned Solar Cell Formation Process

Figure 7B:
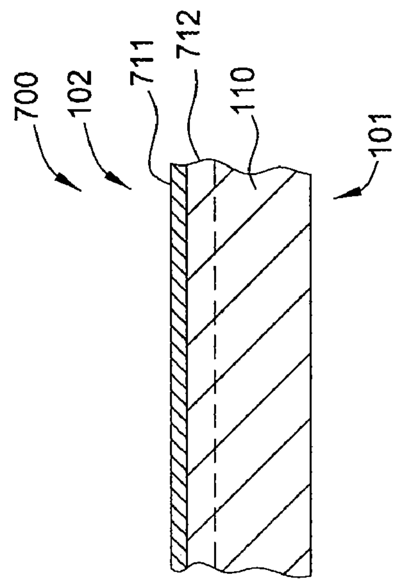
FIGS. 7A-7L illustrate schematic cross-sectional views of a solar cell during different stages in a sequence according to one embodiment of the invention.
Figure 7D:
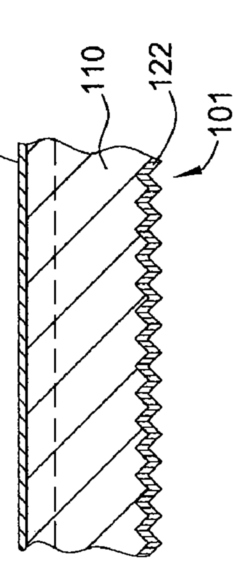

FIGS. 7A-7L illustrate schematic cross-sectional views of a solar cell substrate 110 during different stages in a processing sequence used to form a contact structure 760 on a surface 102 of the solar cell 100. FIG. 8 illustrates a process sequence 800 used to form the active region(s) and/or contact structure on a solar cell. The sequence found in FIG. 8 corresponds to the stages depicted in FIGS. 7A-7L, which are discussed herein.

At box 802, shown in FIG. 8, the surfaces of the substrate 110 are cleaned to remove any undesirable material or roughness. In one embodiment, the clean process may be performed using a batch cleaning process in which the substrates are exposed to a cleaning solution. The cleaning chemistry and cleaning processing steps performed at box 802 is generally the same as the process(es) performed in conjunction with step 202, which is described above.

Figure 7A:
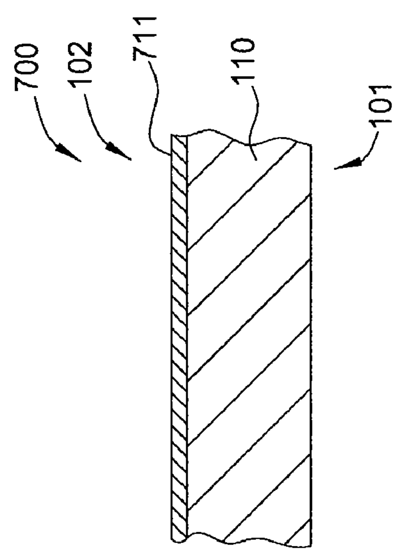
Figure 8:
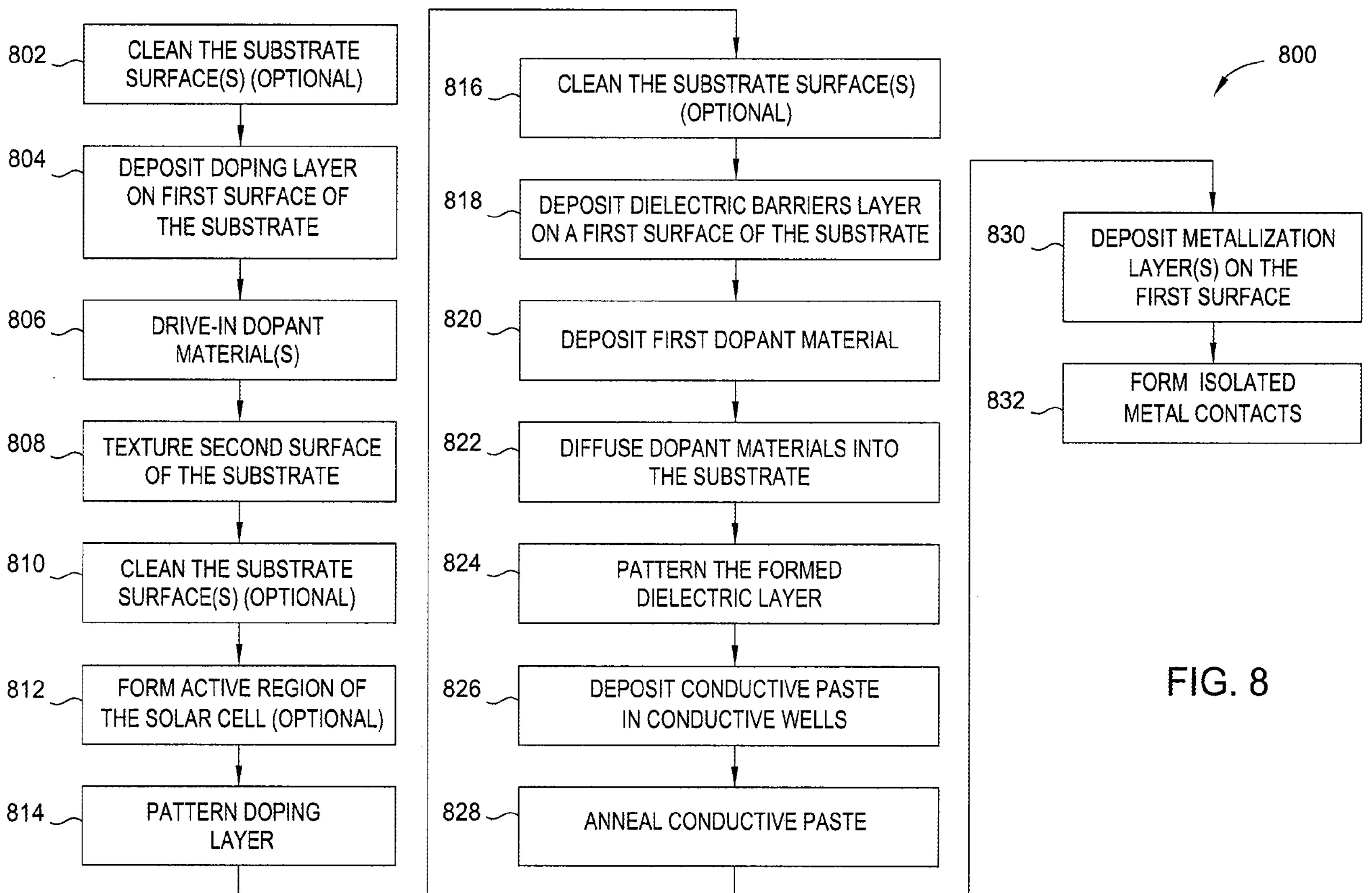
FIG. 8 illustrates a flow chart of methods to metalize a solar cell according to embodiments of the invention.

At box 804, as shown in FIGS. 7A and 8, a doping layer 711 is formed on the backside surface 102 of the substrate 110. In one aspect, the deposited doping layer 711 is used to form a heavily doped region, such as a $p^+$-doped region, or an $n^+$-doped region, on the surface of the solar cell substrate after one or more subsequent thermal processing steps are performed on the substrate. The deposited doping layer 711 may also be used as a chemically resistant layer that protects the backside of the substrate 110 when the front side texturing process (box 808) is performed on the front surface 101 of the substrate. In this case, the doping layer 711 may also provide a stable supporting surface for the substrate, when the front side 101 regions of the solar cell are formed.

In one embodiment, the doping layer 711 is a silicate glass material that has an n-type or a p-type dopant atom disposed in it, such as a phosphosilicate glass (PSG), or a borosilicate glass (BSG) formed on the substrate. The doping layer 711 may be formed using a conventional spin-on, screen printing, ink jet printing, sprayed-on, roll-on, or other similar type of deposition techniques. In one embodiment, the doping layer 711 is a silicate glass layer that is between about 500 Å and about 40 μm thick. In one example, the doping layer 711 is a BSG layer that is disposed on n-type substrate 110. In another example, the doping layer 711 is a PSG layer that is disposed on a p-type substrate 110. In one embodiment, the doping layer 711 is formed from a material that: 1) is generally chemically resistant to the texture etching process chemistry (step 808) and other cleaning process chemistries, 2) is a dielectric material that can be used to electrically isolate various regions formed on the surface 102 of the solar cell device, and 3) provides an amount of a dopant material to the surface of the substrate 110 during one or more thermal processing steps. Deposition of doping layer 711 on the front surface 101 may also be helpful when forming the backside contact structure since it can act as a stable support surface that will not be as easily scratched or damaged during the handling performed during these processes.

At box 806, as shown in FIGS. 7B and 8, the substrate is heated to a temperature greater than about 800° C. to cause the dopant in the doping layer 711 to diffuse into the surface of the substrate 110 to form a doped region 712 within the substrate 110. In one embodiment, the substrate is heated to a temperature between about 800° C. and about 1300° C. in the presence of nitrogen ($N_2$), oxygen ($O_2$), hydrogen ($H_2$), air, or combinations thereof for between about 1 to 120 minutes. The formed doped region 711 can thus be used to form back surface field diffusions for use in a passivated rear surface point contact solar cell structure.

Figure 7C:
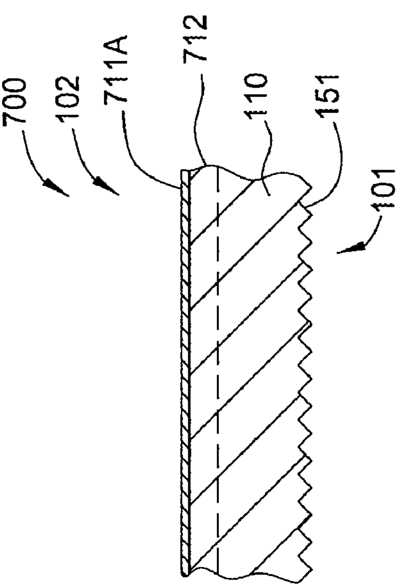

At box 808, a texturizing process is performed on the front surface 101 of the substrate 110 to form a textured surface 151 (FIG. 7C). In one embodiment, the front surface 101 of the substrate 110 is the front side of a solar cell substrate that is adapted to receive sunlight after the solar cell has been formed. As an example, in one texturing process the substrate is immersed in a standard BOE etch chemistry, then an alkaline etching chemistry (e.g., KOH chemistry), and then a dilute HF cleaning chemistry. In some cases the texturizing process is similar to one or more of the processes described above.

In one embodiment, an optional cleaning process, shown in box 810 and FIG. 7C, is performed on the substrate 110 after the process performed in box 808 has been completed. The optional cleaning process is generally used to remove any undesirable residue and/or form a passivation layer on the surface of the substrate. In one embodiment, the clean process may be performed by wetting the substrate with a cleaning solution, such as an SC1 cleaning solution, an SC2 cleaning solution, a dilute HF-last type cleaning solution, an ozonated water solution, a dilute ammonium hydroxide ($NH_4OH$) solution, a hydrogen peroxide ($H_2O_2$) solution, DI water or other suitable and cost effective cleaning process may be used to clean a silicon containing substrate. In one embodiment, the cleaning solution is a hydrofluoric (HF) and ozone ($O_3$) mixture. The cleaning process may be performed on the substrate between about 5 seconds and about 600 seconds, such as about 30 seconds to about 240 second, for example about 120 seconds.

In one embodiment, after performing steps 802-810 it is desirable to tailor the doping layer 711 deposition process and various cleaning/etching steps (e.g., reference numerals 808 and/or 810) so that a portion of the of the doping layer 711, or doping layer 711A, remains on the surface 102 of the substrate and the doping layer has sufficient dielectric properties to act as an insulator between various regions of the formed solar cell device. In one example, the remaining doping layer 711A is between about 100 to 10,000 Å thick and is formed from a silicate glass material, such as a PSG or a BSG material.

In cases where a passivation layer has not been formed on the front surface of the solar cell substrate, the process sequence 800 then may include one or more steps that are then performed to form a silicon layer thereon. In one embodiment, a silicon nitride (SiN) passivation and antireflection layer, or thin amorphous silicon (a-Si:H) layer or amorphous silicon carbide (a-SiC:H) layer and silicon nitride (SiN) stack is formed on the front surface 101 using a conventional chemical vapor deposition (PECVD) technique using for example, an Applied Materials AKT PECVD system with multiple solar cell substrates supported on a suitable large area carrier (i.e., box 812).

Figure 7E:
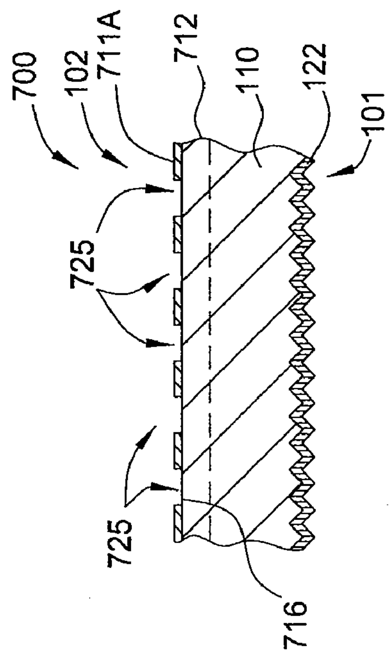

In box 814, as shown in FIGS. 7E and 8, the remaining doping layer 711A is etched to form a desired pattern of exposed regions 725 that can be used to form a connection between the backside contact structure 760 (FIG. 7L) and the substrate surface. Typical etching processes that may be used to form the patterned exposed regions 725 on the backside surface 102 may include but are not limited to masking together with a wet or dry etching technique, laser ablation techniques, or the patterned application of an etchant gel or paste. The exposed regions 725 generally provide surfaces through which electrical connections can be made to the backside surface 102 of the substrate 110.

In one embodiment of the processes performed at box 814, an etchant material is selectively deposited on the doping layer 711A by use of a conventional ink jet printing, rubber stamping, screen printing, or other similar technique and then heated to form and define the exposed regions 725. In one embodiment, the etching material and pattern etching process steps performed at box 814 are the same as the etching processes, as discussed in some of the processes described above. In one example, the etchant material is an ammonium fluoride ($NH_4F$) containing material that is formulated to etch the doping layer 711A. In one example, the etchant material contains: 200 g/l of ammonium fluoride ($NH_4F$), 50 g/l of 2000 MW polyethylene glycol (PEG) and 50 g/l of ethyl alcohol with the remainder of the 1 liter volume being DI water. In another example, one liter of the etchant material contains: 90 milliliters of a 6:1 BOE etching solution, 5 g of 500 MW polyethylene glycol (PEG) and 5 g of ethyl alcohol with the remainder of the volume being DI water. In one embodiment, the etching material and pattern etching process steps performed at box 620 are the same as the etching process(es) discussed in the U.S. patent application Ser. No. 12/274,023, which is incorporated by reference in its entirety, which is incorporated by reference in its entirety. In one embodiment, the etch gel or paste is applied to the doping layer 711A and is heated to a desired temperature, such as between 250° C. and 400° C. In one embodiment, the dopant in the etching material contains a different dopant material (e.g., Al, Ga, In) than the dopant contained in the doped doping layer 711A (e.g., B, P). While the silicon containing components in the doping layer 711A will convert to a volatile $SiF_4$, a residue that is much more concentrated in the contained dopant is formed, or remains on the exposed surface of the substrate. Thus, in a subsequent high temperature diffusion step (e.g., box 822), both the dopant in the unetched doping layer 711A, and the more concentrated dopant residue left over on the surface of the etched openings are driven into the solar cell substrate. It is believed that the concentrated dopant residue remaining at the exposed regions 725 can thus provide a higher doping level in the regions of the substrate below the openings 725. In another embodiment, additional amount of a dopant containing compounds may be added to the etchant formulation to increase the concentration in the residue and ultimately the amount of doping under the contacts. In either case it is generally not desirable to clean the substrate until a high temperature driven step has been performed to avoid the removal of the residual dopant material at the exposed regions. These embodiments provide a simplified approach the formation of selective emitter contacts correlated with higher solar cell efficiencies.

As shown in box 816, in one embodiment, an optional cleaning process is performed on the substrate 110 to remove any undesirable residue and/or form a passivated surface. Examples of various cleaning processes that may be used are discussed above and discussed in conjunction with the FIG. 17E.

Figure 7G:
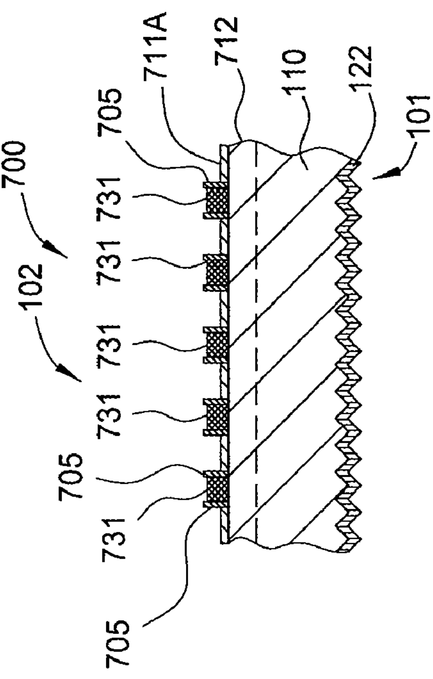
Figure 7F:
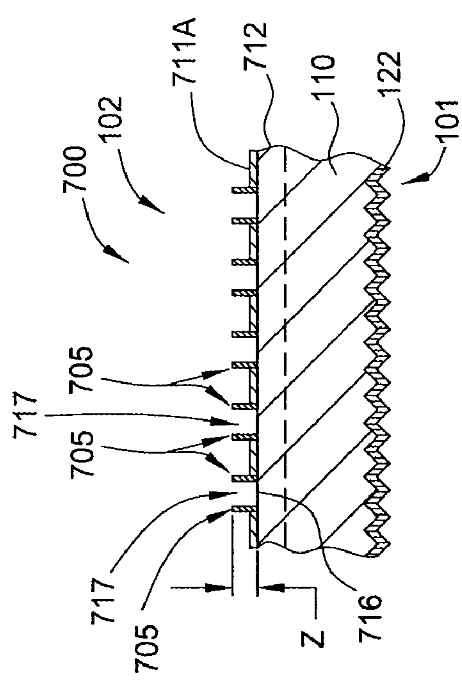

At box 818, as illustrated in FIGS. 7F and 8, a plurality of dielectric spacers 705 are selectively deposited on the surface 102 of the substrate 110 so that the exposed regions 716 on the surface of the substrate are laterally, or horizontally, isolated from other parts of the substrate by the dielectric spacers 705. In one embodiment, the dielectric spacers 705 are formed from a dielectric paste material that is deposited by use of a conventional screen printing to form regions 717 that are at least partially enclosed by the exposed regions 716 and the dielectric spacers 705. In one embodiment, after disposing the dielectric spacers 705, the substrate is heated to a desirable temperature, such as between about 300 and about 500° C., to cause the material in the dielectric spacers 705 to form a bond with portions of the substrate surface and densify to form reliable electrical and physical isolating elements. The dielectric spacers 705 might also be derived from liquid or gel like precursor solutions applied in a patternwise process using ink-jet printing. The dielectric spacers 705 can made from materials similar to the other spacers discussed above, for example, dielectric spacer 305. In one embodiment, the height "Z" of the dielectric spacers 705 on the surface 102 is between about 0.1 and about 50 micrometers (μm) high.

At box 820, as shown in FIGS. 7G and 8, a dopant material 731 is deposited into a plurality of regions 717 formed on the surface 102 of the substrate 110. In one embodiment, the dopant material 731 is a material that is deposited by use of a conventional ink jet printing, rubber stamping, screen printing, or other similar process into the one or more of the regions 717. The dopant material 731 may initially be a liquid, paste or gel that will be used to form a doped region on the substrate which is isolated from the other lateral regions by the dielectric features 705. After disposing the dopant material 731 in the regions 717, the substrate may then be heated to a desirable temperature to assure that the dopant material 731 will remain in the region 717, and cause the dopant material 731 to densify, and/or form a bond with the substrate surface. In one embodiment, the dopant material 731 is a gel or paste that contains a dopant that is an opposite doping type to the substrate. In one case, a p-type dopant, such as, boron (B), aluminum (Al) or gallium (Ga), is used in conjunction with an n-type substrate. In another case, an n-type dopant, such as, phosphorous (P), or arsenic (As), is used in conjunction with an p-type substrate. In one embodiment, after the dopant material 731 is deposited on the exposed regions 716 of the substrate 110 and the substrate is heated to a temperature of between about 80 and about 400° C. In one embodiment, the dopant material 731 is similar to the dopant material 131 or 132 discussed above.

In one embodiment, it is desirable to deposit a capping layer (not shown) over the dopant material 731 prior to performing the processes described in box 822 to prevent volatile components in the dopant material 731 from vaporizing and depositing on unwanted regions of the substrate surface. The capping layer may be formed from similar materials and be selectively deposited using one or more of the processes discussed above.

Figure 7I:
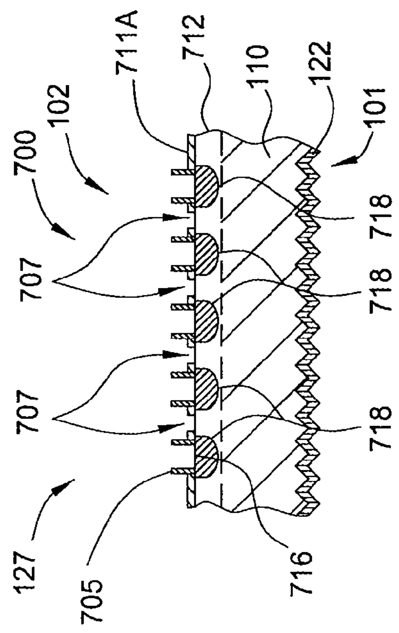
Figure 7K:
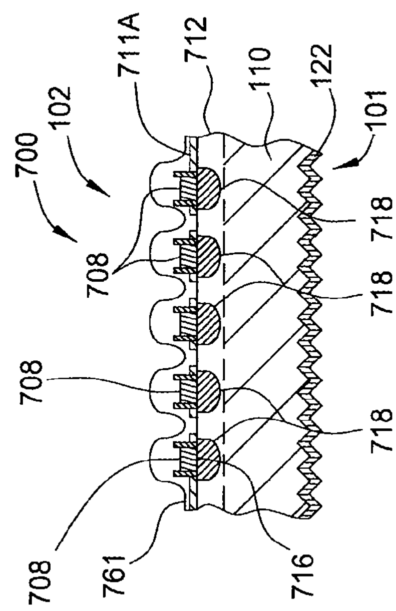
Figure 7H:
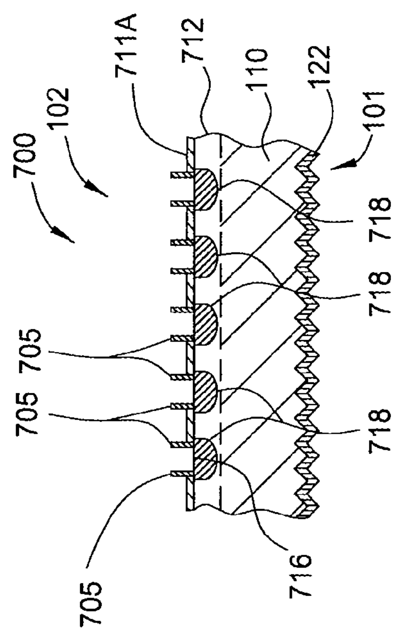

At box 822, as shown in FIGS. 7H and 8, the substrate is heated to a temperature greater than about 800° C. to causes the doping elements in the dopant materials 708 to diffuse into the exposed regions 716 of the substrate 110 to form doped regions 718 within the substrate 110. In one embodiment, the substrate is heated to a temperature between about 800° C. and about 1300° C. in the presence of nitrogen ($N_2$), oxygen ($O_2$), hydrogen ($H_2$), air, or combinations thereof for between about 1 and about 120 minutes. The formed doped region 718 can thus be used to form regions of a point contact type solar cell. In one embodiment, it is desirable to select a dopant material 731 that can partially volatilize to allow some doping of the front surface 101 of the substrate 110 during the drive in process(es) performed at box 822. In one example, the dopant material 731 contains a phosphorous.

At box 824, as illustrated in FIGS. 7I and 8, an etchant material is selectively deposited on portions of the doping layer 711A by use of a conventional ink jet printing, rubber stamping, screen printing, or other similar process so that a patterned and defined regions 707 can be formed in the doping layer 711A. In one embodiment, the etching material and pattern etching process steps performed at box 824 are the same as the patterning and etching processes, discussed above (e.g., step 420 discussed above). Also, in one embodiment, an optional cleaning process, may performed on the substrate 110 after the process performed in box 824 has been completed, to remove any undesirable residue and/or form a passivated surface. Examples of various cleaning processes that may be used in box 824 are further discussed above.

Figure 7J:
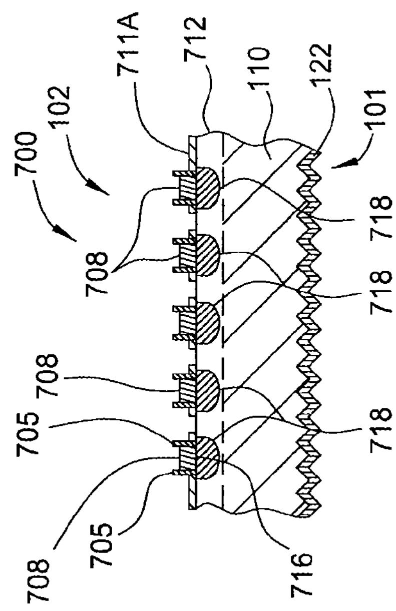

At box 826, as illustrated in FIGS. 7J and 8, a patterned conducting material 709 is deposited into the regions 717 on the surface 102 of the substrate 110 by use of a conventional ink jet printing, rubber stamping, screen printing, or other similar process technique. In one embodiment, the formed conducting material 709 is a metal paste that is isolated from the other portions of the substrate surface by the dielectric spacers 705. In one configuration, the conducting material 708 is a paste that contains a metal, such as aluminum (Al), aluminum (Al), silver (Ag), tin (Sn), cobalt (Co), rhenium (Rh), nickel (Ni), zinc (Zn), lead (Pb), palladium (Pd), molybdenum (Mo) titanium (Ti), tantalum (Ta), vanadium (V), tungsten (W), or chrome (Cr). However, in some cases copper (Cu) may be used as a second layer, or subsequent layer, that is formed on a suitable barrier layer (TiW, Ta, etc.).

At box 828, as shown in FIG. 8, the substrate is heated to a desired temperature to causes the conducting material 709 to densify and form a bond to the exposed regions 716 on the substrate surface. In one embodiment, the substrate is heated to a temperature between about 200° C. and about 900° C. for between about 1 and about 10 minutes so that a good ohmic contact can be formed between the densified conducting material 709 and the surface of the exposed regions 716.

At box 830, as illustrated in FIGS. 7K and 8, a conducting layer 761 is deposited over the surface 102 of the substrate 110. In one embodiment, the formed conducting layer 761 is between about 20,000 and about 50,000 angstroms (Å) thick and contains a metal, such as aluminum (Al), silver (Ag), tin (Sn), cobalt (Co), rhenium (Rh), nickel (Ni), zinc (Zn), lead (Pb), palladium (Pd), molybdenum (Mo) titanium (Ti), tantalum (Ta), vanadium (V), tungsten (W), or chrome (Cr). However, in some cases copper (Cu) may be used as a second layer, or subsequent layer, that is formed on a suitable barrier layer (e.g., TiW, Ta). In another embodiment, the conducting layer 761 is formed by depositing a 500 to about 50,000 Å thick layer of aluminum (Al) by evaporation or physical vapor deposition (PVD) process. In another embodiment, the conducting layer 761 contains two layers that are formed by first depositing an aluminum (Al) layer by evaporation or physical vapor deposition (PVD) process and then depositing a nickel vanadium (NiV), tin (Sn), silver (Ag) or other solderable capping metal or alloy by use of a PVD deposition process.

Figure 7L:
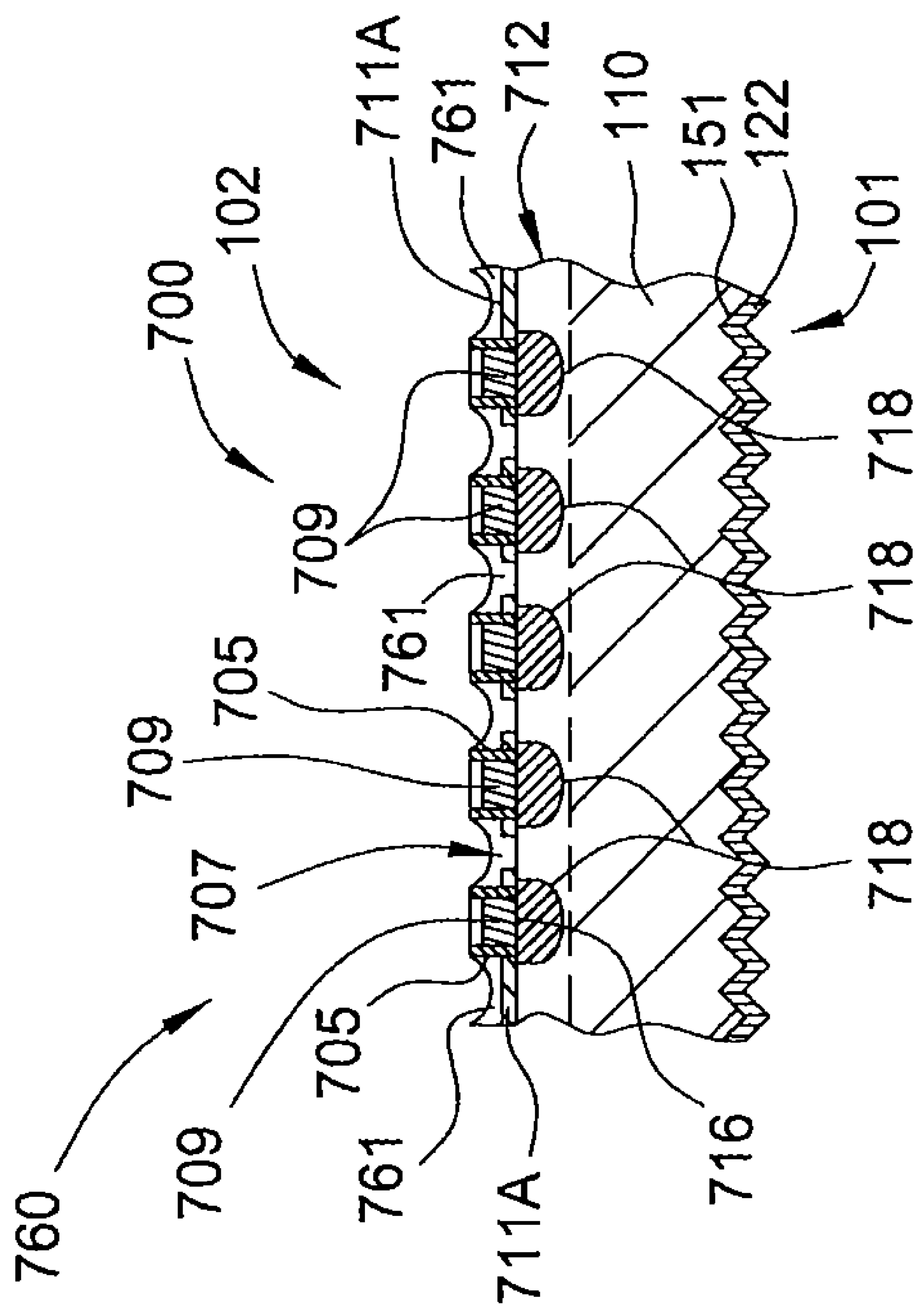

At box 832, as illustrated in FIGS. 7L and 8, the conducting layer 761 is patterned to electrically isolate desired regions of the substrate 110 to form an interconnecting structure 760. In one embodiment, the regions of the substrate 110 are electrically isolated by use of one or more laser ablation, polishing, sanding, masking and wet or dry etching, or other similar techniques. In general, the dielectric spacers 705 are used to electrically isolate the portions of conducting layer 761 disposed in the adjacent regions. In one configuration, the dielectric spacers 705 are patterned to form separate or interdigitated electrical connection structure, or interconnecting structure 760, to connect the desired p-type or n-type regions of the solar cell device. One such structure is discussed in conjunction with FIGS. 9-10, below.

Fourth Alternate Patterned Solar Cell Formation Process

Figure 11B:
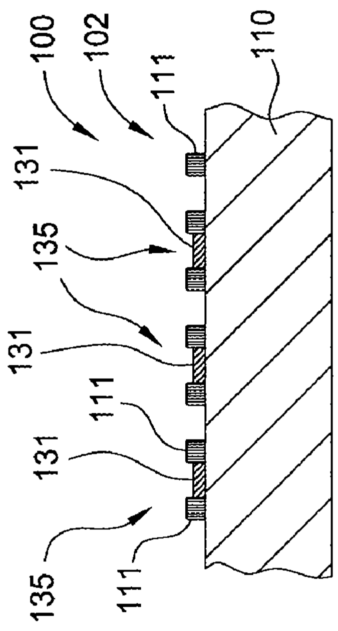
FIGS. 11A-11H illustrate schematic cross-sectional views of a solar cell during different stages in a sequence according to one embodiment of the invention.
Figure 11D:
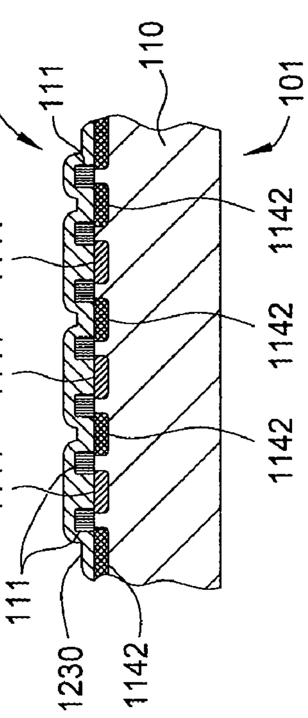
Figure 11A:
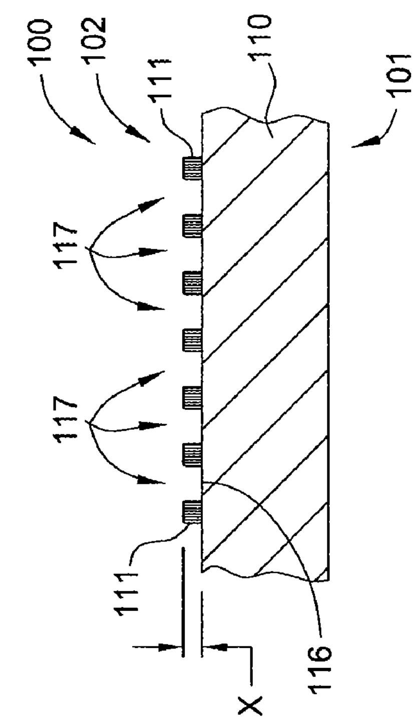

FIGS. 11A-11H illustrate schematic cross-sectional views of a solar cell substrate 110 during different stages in a processing sequence used to form a contact structure on a surface 102 of the solar cell 1100. FIG. 12 illustrates a process sequence 1200 used to form the active region(s) and/or contact structure on a solar cell. The sequence found in FIG. 12 corresponds to the stages depicted in FIGS. 11A-11H, which are discussed herein. In this configuration of process steps, the processes performed in each of the boxes 1202-1206 are similar to the processes discussed above in conjunction with each of the boxes 202-206 and FIGS. 1A-1B, and are not discussed below.

However, in one embodiment of the process(es) performed in box 1206, it is desirable to deposit an un-doped silicate glass (USG) (not shown) over the first dopant material 131 to cap and thus prevent the first dopant material from vaporizing and leaving the surface of the solar cell substrate 110 during one or more subsequent thermal processing steps. In one embodiment, the undoped silicate glass (USG) is deposited using a ink jet printing, rubber stamping, screen printing, or other similar process.

Figure 11C:
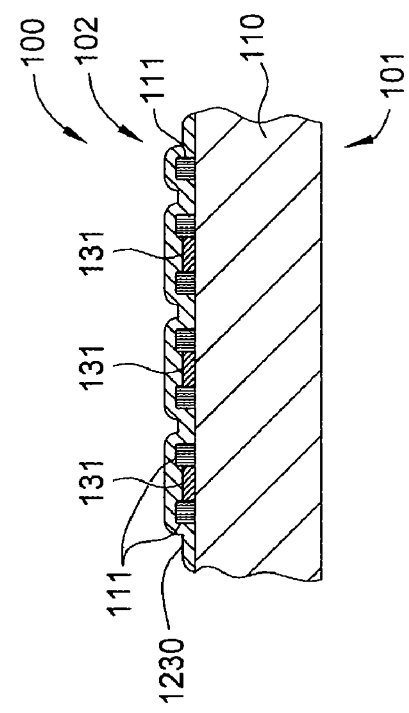
Figure 12:
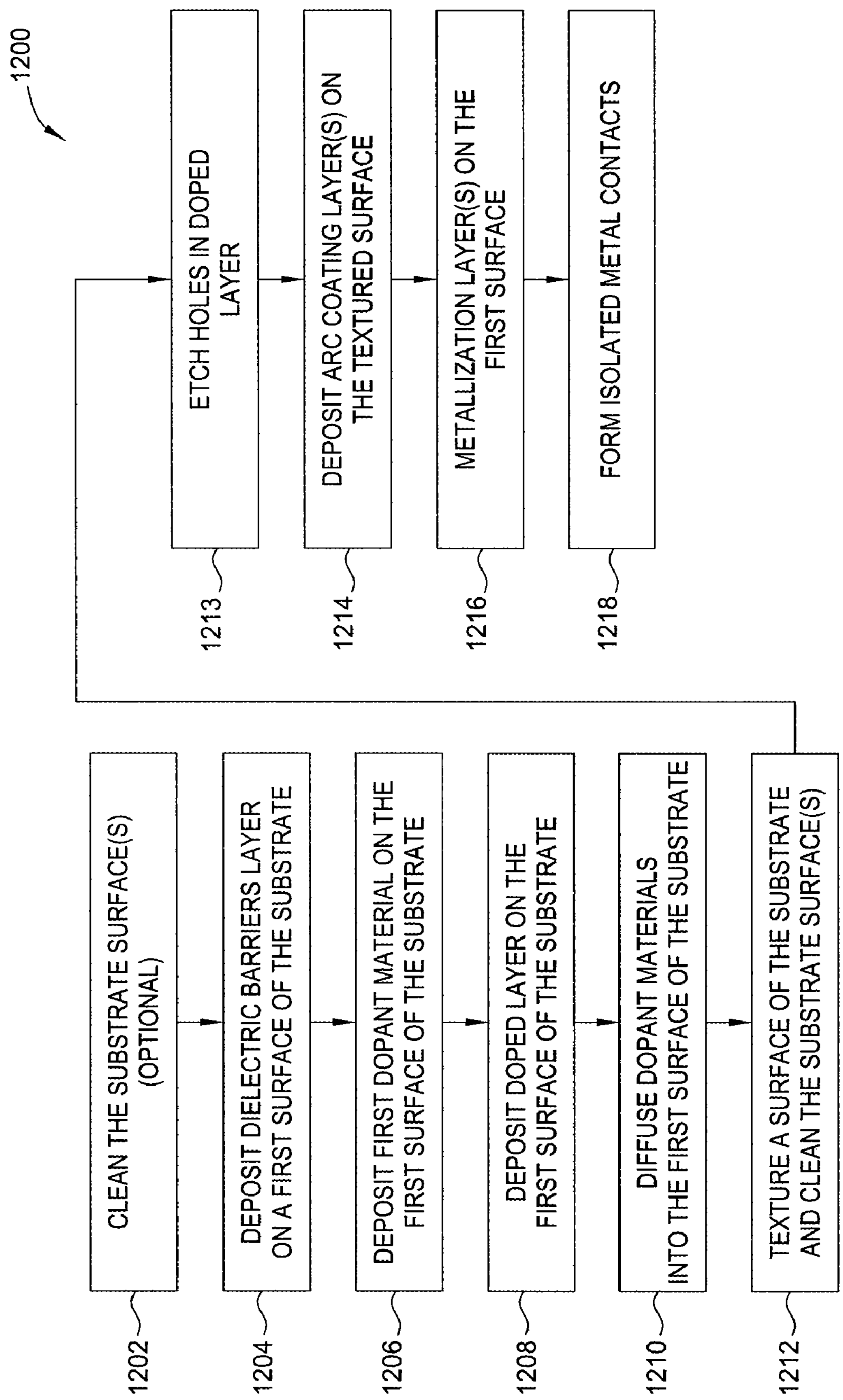
FIG. 12 illustrates a flow chart of methods to metalize a solar cell according to embodiments of the invention.

After performing the processes illustrated in boxes 1202-1206, at box 1208, as shown in FIGS. 11C and 12, a doped layer 1230 is deposited over the surface 102 of the solar cell 1100. The doped layer 1230 is advantageously used as an etch mask that minimizes and/or prevents the surface 102 from being etched during the subsequent texturizing process performed at box 1212, which is used to roughen the opposing surface 101. In general, the etch selectivity of the doped layer 1230 to the exposed material on the opposing surface 101 should be relatively high to prevent material loss from the various regions formed on the surface 102 during the texturizing process. In one example, the etch selectivity of the material on the opposing surface 101 to the doped layer 1230 is at least about 100:1. In one embodiment, the deposited doped layer 1230 is an amorphous silicon containing layer that is about a 500 Å thick and contains a p-type dopant, such as boron (B). In one embodiment, the doped layer 1230 is a PECVD deposited BSG layer that is formed over the surface 102 of the solar cell 1110. In one example, the doped layer 1230 is configured so that after performing subsequent thermal processing steps a doped region is formed having a sheet resistance of less than about 50 Ohms per square (Ω/□) and/or has a doping level greater than about $10^{18}$ atoms/$cm^3$ at the surface of the substrate.

In another embodiment of the process performed at box 1208, as shown in FIGS. 11C and 12, the deposited doped layer 1230 is a doped amorphous silicon carbide (a-SiC) layer that is formed over the surface 102 of the solar cell 1110. In one embodiment, an amorphous SiC layer is formed using a PECVD process at a temperature of about 200° C. to minimize the amount of vaporization of the dopant material, such as phosphorous (P) from the previously deposited first dopant material 131. In one example, the doped layer 1230 is deposited using a gas mixture containing trimethylborane (TMB), silane ($SiH_4$) and hydrogen ($H_2$).

In yet another embodiment of the process performed at box 1208, as shown in FIGS. 11C and 12, the deposited doped layer 1230 is a doped amorphous silicon (a-Si) layer that is formed over the surface 102 of the solar cell 1110. In one embodiment, the doped amorphous silicon layer is an amorphous silicon hydride (a-Si:H) layer is formed at a temperature of about 200° C. to minimize the amount of vaporization of the dopant material, such as phosphorous (P) from the previously deposited first dopant material 131. In one example, the doped layer 1230 is deposited using a gas mixture containing diborane ($B_2H_6$), silane ($SiH_4$) and hydrogen ($H_2$).

At box 1210, as shown in FIGS. 11D and 12, the substrate is heated to a temperature greater than about 800° C. to cause the doping elements in the first dopant material 131 and the doping elements contained in the doped layer 1230 to diffuse into the surface 116 of the substrate 110 to form a first doped region 1141 and a second doped region 1142, respectively, within the substrate 110. In one example, the first dopant material 131 contains an n-type dopant and the doped layer 1230 contains a p-type dopant that forms a p-type region and an n-type region, respectively, within the substrate 110. In one embodiment, the substrate is heated to a temperature between about 800° C. and about 1300° C. for between about 1 and about 120 minutes. In one example, the substrate is heated in a rapid thermal annealing (RTA) chamber in a nitrogen ($N_2$) rich environment to a temperature of about 1000° C. for about 5 minutes. In one embodiment, the formed first doped region 1141 and second doped region 1142 can thus be used to form regions of a point contact type solar cell.

In another embodiment of the process performed at box 1210, the substrate diffusion process is a two step diffusion process. In the first step the substrate is heated to a temperature greater than about 800° C. in a nitrogen ($N_2$) rich environment to prevent oxidation of the various exposed components on the surface of the substrate 110. Next, after a sufficient period of time, such as achieve a desired dopant diffusion depth, then a nitrogen ($N_2$) and oxygen ($O_2$) mixture may be injected into the diffusion chamber to oxidize and consume the silicon material contained in an amorphous SiC containing doped layer 1230 by the end of the process step. In one example, the second step is performed at a temperature greater than about 800° C.

An optional cleaning process may then be performed on the substrate 110 after the process performed at box 1210 has been completed to remove any undesirable residue from the substrate surfaces (e.g., surfaces 101 and/or 102). The cleaning process may be similar or the same as the cleaning process described above at box 202 in FIG. 2. Alternatively, the substrate may be cleaned by any suitable manners.

Figure 11F:
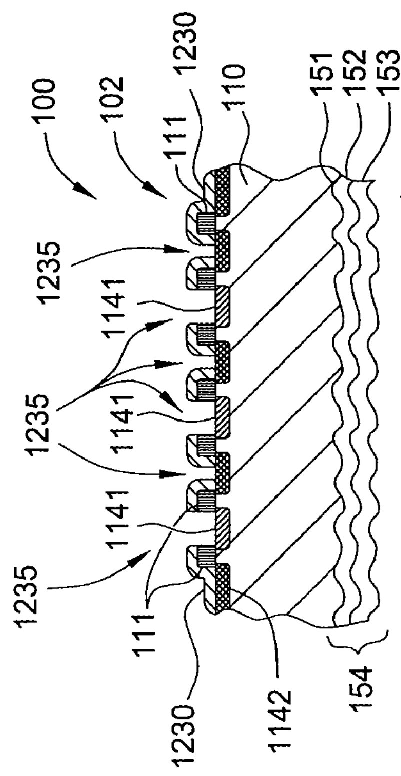
Figure 11H:
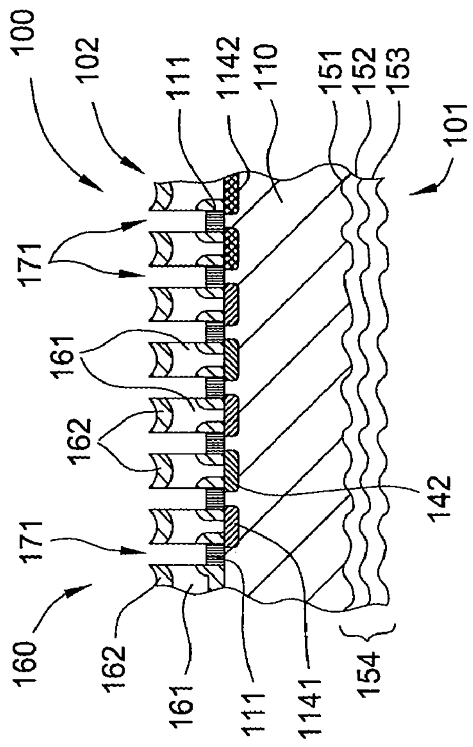
Figure 11E:
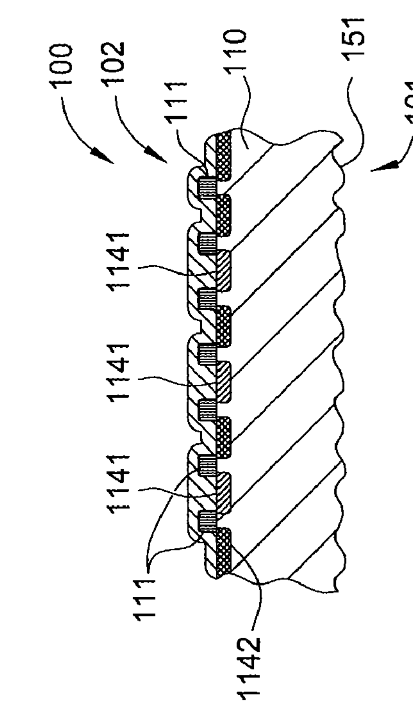

At box 1212, a texturizing process is performed on the opposing surface 101 of the substrate 110 to form a textured surface, which is similar to the textured surface illustrated in FIG. 11E (i.e., reference numeral 151). In one embodiment, the opposing surface 101 of the substrate 110 is the front side of a solar cell substrate that is adapted to receive sunlight after the solar cell has been formed. In general, the use of an alkaline silicon wet etching chemistry is utilized when using a p-type doped layer 1230, due to the high etch selectivity between the doped layer 1230 and the exposed material found on the opposing surface 101. Alkaline chemistries are generally effective when used in combination with a p-type doped layer 1230, since doped p-type layers are depleted of electrons thus limiting their ability to react with the etching chemistry. An example of an exemplary texturizing process is further described in the Provisional patent application Ser. No. 12/383,350, filed Mar. 23, 2009, which is incorporated by reference. Also, during at least on part of the processes performed at box 612 the dielectric features 111 are removed from the surface of the 102 of the substrate 110 by use of an etching process, mechanical polishing, mechanical abrasion process, or other similar technique.

In box 1213, as shown in FIGS. 11F and 12, the doped layer 1230 formed on the backside surface 102 of the substrate is etched by conventional means to form a desired pattern of exposed regions 1235 that can be used to form the backside contact structure 160 (FIG. 11H) on the substrate surface. Typical etching processes that may be used to form the patterned exposed regions 1235 on the backside surface 102 may include but are not limited to patterning and dry etching techniques, laser ablation techniques, patterning and wet etching techniques, or other similar processes that may be used form a desired pattern in the doped layer 1230. The exposed regions 1235 generally provide surfaces through which electrical connections can be made to the backside surface 102 of the substrate 110.

At box 1214, as shown in FIGS. 11F and 12, after the opposing surface 101 is textured a thin passivation and antireflection layer 153 and/or transparent conductive oxide (TCO) layer 152 are formed thereon. One will note that the preparation of the opposing surface 101 completed at boxes 1212 and 1214 may also be performed prior to performing the process at box 1204, or other steps in the process sequence 200, without deviating from the basic scope of the invention described herein.

Figure 11G:
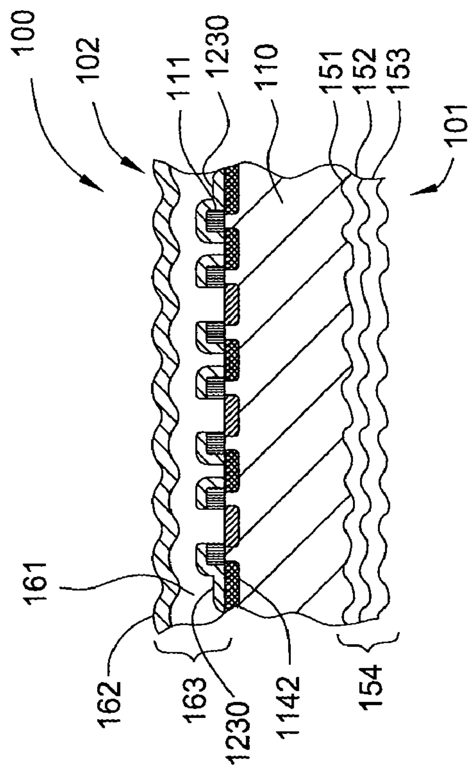

The following steps 1216-1218 and illustrated in FIGS. 11G-11H are similar to the processes discussed above in conjunction with each of the boxes 216-218 and FIGS. 1G-1H, and are not discussed further herein.

Fifth Alternate Patterned Solar Cell Formation Process

Figure 13B:
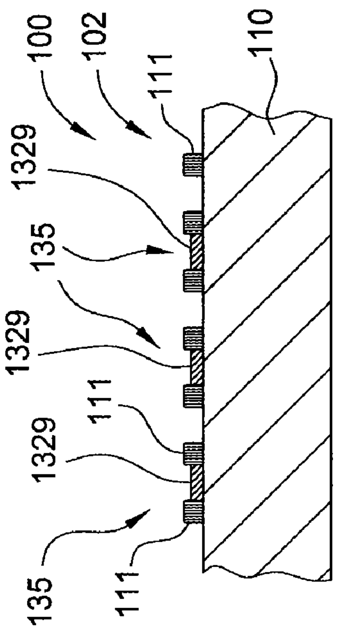
FIGS. 13A-13L illustrate schematic cross-sectional views of a solar cell during different stages in a sequence according to one embodiment of the invention.
Figure 13D:
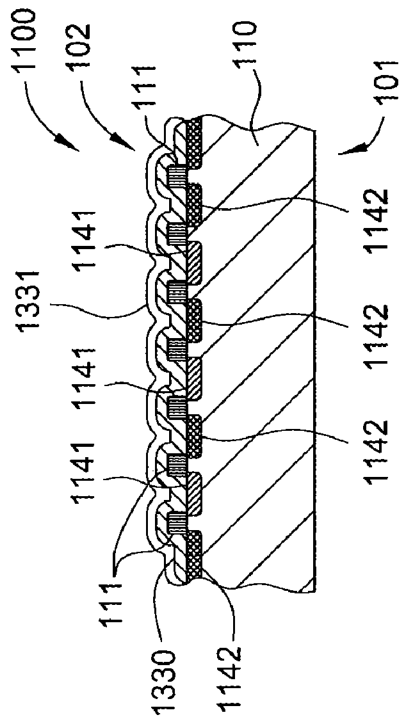

FIGS. 13A-13L illustrate schematic cross-sectional views of a solar cell substrate 110 during different stages in a processing sequence used to form a contact structure on a surface 102 of the solar cell 1300. FIG. 14 illustrates a process sequence 1400 used to form the active region(s) and/or contact structure on a solar cell. The sequence found in FIG. 14 corresponds to the stages depicted in FIGS. 13A-13L, which are discussed herein. The sequence found in FIG. 14 is not intended to limit the scope of the invention described herein, since one skilled in the art would appreciate that the order and/or number of steps could be altered in some cases without affecting the basic solar cell formation process and solar cell structure that is described herein. Some of the embodiments of the invention described herein are believed to have a significant advantage over conventional solar cell formation processes since the process sequences disclosed herein generally do not require the use of lithographic, masking, through mask etching and/or rinsing steps to form the patterned all back contact solar cell structure.

At box 1402, the surfaces of the substrate 110 are cleaned to remove any undesirable material or roughness. In one embodiment, the clean process may be performed using a batch cleaning process in which the substrates are exposed to a cleaning solution. The cleaning process may be similar or the same as the cleaning process described above at box 202 in FIG. 2. Alternatively, the substrate may be cleaned by any suitable manners.

Figure 13A:
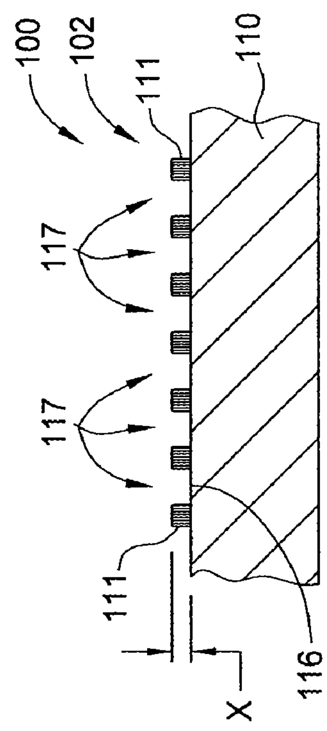
Figure 14:
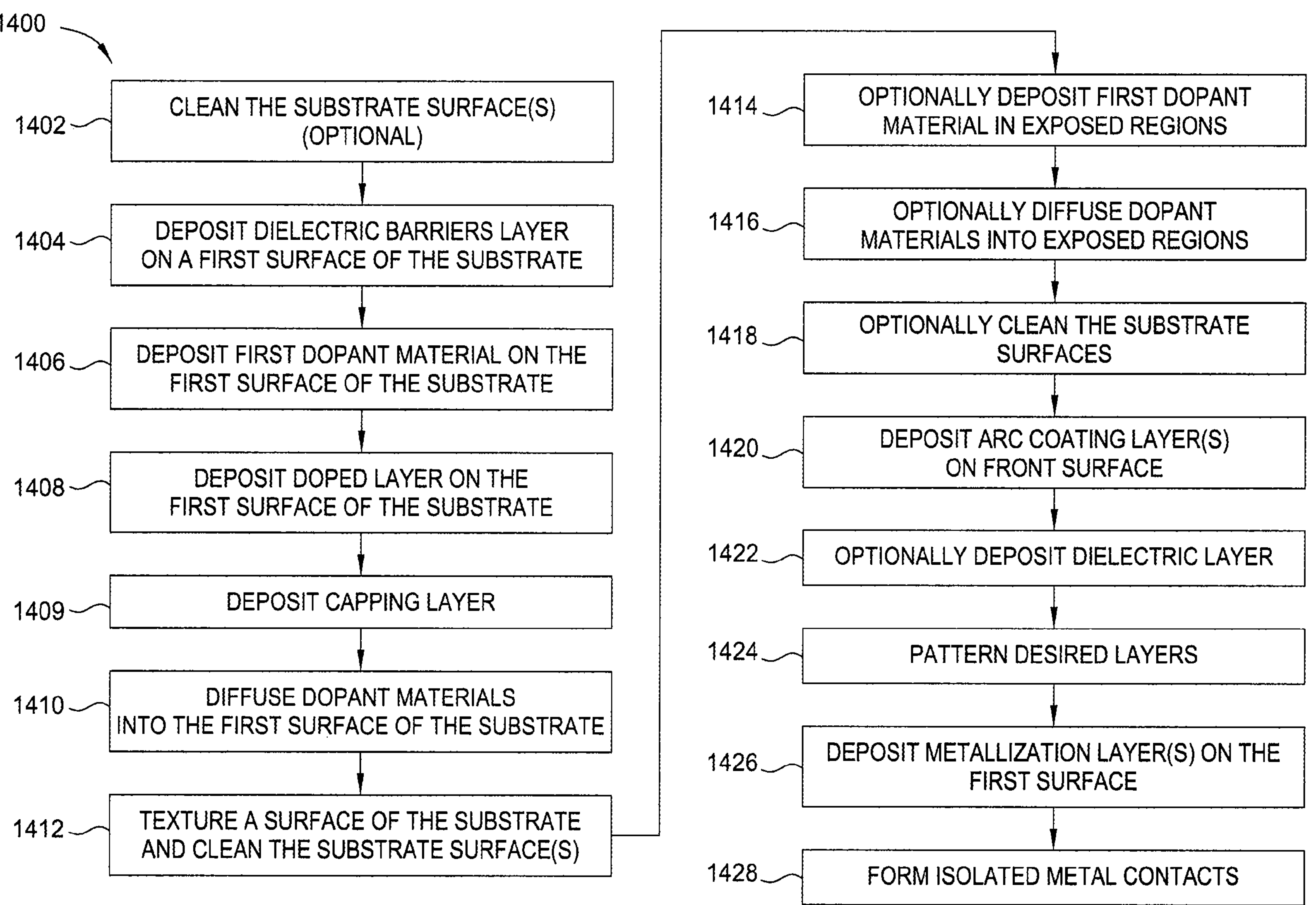
FIG. 14 illustrates a flow chart of methods to metalize a solar cell according to embodiments of the invention.

At box 1404, as shown in FIGS. 13A and 14, dielectric features 111 are deposited on a surface 102 of the substrate 110. In one embodiment, the dielectric features 111 are formed from a dielectric paste material that is deposited by use of a conventional ink jet printing, rubber stamping, screen printing, or other similar process to form regions on the substrate surface 116 that are laterally isolated from each other (i.e., isolated regions 117). The process of forming the dielectric features 111 on the substrate 110, and its material properties and physical characteristics are similarly described above in conjunction with FIG. 1A, and thus are not re-recited herein.

At box 1406, as shown in FIGS. 13B and 14, a first dopant material 1329 is deposited into a plurality of the isolated regions 117 formed on the surface 116 of the substrate 110. In one embodiment, the first dopant material 1329 is deposited or printed in a desired pattern by the use of ink jet printing, rubber stamping, screen printing, or other similar process into one or more of the isolated regions 117. The first dopant material 1329 may initially be a liquid, paste, or gel that will be used to form a doped region, which is isolated from the other isolated regions 117 by the dielectric features 111. In some cases, after disposing the first dopant material 1329 in the isolated regions 117, the substrate is heated to a desirable temperature to assure that the first dopant material 1329 will remain in the isolated region 117, and cause the dopant material 1329 to cure, densify, and/or form a bond with the substrate surface. In one embodiment, the first dopant material 1329 is a gel or paste that contains an n-type dopant. Typical n-type dopants used in silicon solar cell manufacturing are elements, such as, phosphorus (P), arsenic (As), or antimony (Sb). In one embodiment, the first dopant material 1329 is phosphorous containing dopant paste that is deposited on the surface 116 of the substrate 110 and the substrate is heated to a temperature of between about 80 and about 500° C. In one embodiment, the first dopant material 1329 may contain materials selected from a group consisting of phosphosilicate glass precursors, phosphoric acid ($H_3PO_4$), phosphorus acid ($H_3PO_3$), hypophosphorous acid ($H_3PO_2$), and/or various ammonium salts thereof. In one embodiment, the first dopant material 1329 is a gel or paste that contains between about 6 and about 30 atomic % of phosphorous. In one example, the first dopant material 1329 is configured so that after performing subsequent thermal processing steps a doped region is formed having a sheet resistance of less than about 50 Ohms per square (Ω/□) and/or has a doping level greater than about $10^{18}$ atoms/cm$^3$ at the surface of the substrate.

In one embodiment of the process(es) performed in box 1406, it is desirable to deposit an un-doped silicate glass (USG) (not shown) over the first dopant material 1329 to cap, and thus prevent the first dopant material from vaporizing and leaving the surface of the solar cell substrate 110 during one or more subsequent thermal processing steps. In one embodiment, the undoped silicate glass (USG) is deposited using an ink jet printing, rubber stamping, screen printing, or other similar process.

In an alternate embodiment, at box 1406 an inert spacer material is deposited into a plurality of the isolated regions 117 formed on the surface 116 of the substrate 110 in place of a first dopant material 1329. In one embodiment, the inert spacer material is a gel or paste that contains an undoped dielectric material, such as an un-doped silicate glass (USG). In one embodiment, the inert spacer material is deposited or printed in a desired pattern by the use of ink jet printing, rubber stamping, screen printing, or other similar process into the one or more of the isolated regions 117. The inert spacer material may initially be a liquid, paste, or gel that will be used to form a doped region, which is isolated from the other isolated regions 117 by the dielectric features 111. In some cases, after disposing the inert spacer material in the isolated regions 117, the substrate is heated to a desirable temperature to assure that the inert spacer material will remain in the isolated region 117, and cause the inert spacer material to cure, densify, and/or form a bond with the substrate surface. In one embodiment, it is desirable to form the inert spacer material from a material that is etched during the subsequent texturization process (box 1412) to provide an exposed region of the surface of the substrate on which further processing can be performed.

Figure 13C:
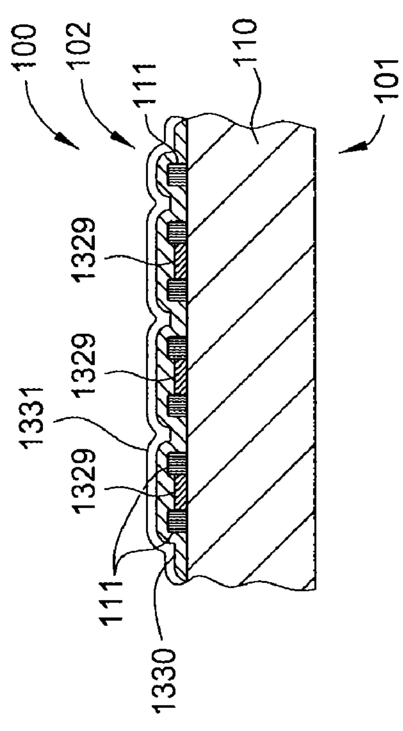

After performing the processes illustrated in boxes 1402-1406, at box 1408, and as shown in FIG. 13C, a doped layer 1330 is deposited over the surface 102 of the solar cell 1300. The doped layer 1330 is advantageously used as an etch mask that minimizes and/or prevents the surface 102 from being etched during the subsequent surface texturing process performed at box 1412, which is used to roughen the opposing surface 101. In general, the etch selectivity of the doped layer 1330 to the exposed material on the opposing surface 101 should be relatively high to prevent material loss from the various regions formed on the surface 102 during the texturizing process. In one example, the etch selectivity of the material on the opposing surface 101 to the doped layer 1330 is at least about 100:1. In one embodiment, the deposited doped layer 1330 is an amorphous silicon containing layer that is about 50 and about 500 Å thick and contains a p-type dopant, such as boron (B). In one embodiment, the doped layer 1330 is a PECVD deposited BSG layer that is formed over the surface 102 of the solar cell 1310. In one example, the doped layer 1330 is configured so that after performing subsequent thermal processing steps a doped region is formed having a sheet resistance of less than about 50 Ohms per square (Ω/□) and/or has a doping level greater than about $10^{18}$ atoms/cm$^3$ at the surface of the substrate.

In one embodiment of the process performed at box 1408, the deposited doped layer 1330 is a doped amorphous silicon (a-Si) layer that is formed over the surface 102 of the solar cell 1300. In one embodiment, the doped amorphous silicon layer is an amorphous silicon hydride (a-Si:H) layer is formed at a temperature of about 200° C. to minimize the amount of vaporization of the dopant material, such as phosphorous (P) from the previously deposited first dopant material 1329. In one example, the doped layer 1330 is deposited using a gas mixture containing diborane ($B_2H_6$), silane ($SiH_4$) and hydrogen ($H_2$). In one embodiment, the deposited doped layer 1330 is a doped amorphous silicon (a-Si) layer that is less than about 500 Å thick and contains a p-type dopant, such as boron (B). In one example, the doped amorphous silicon (a-Si) layer is formed in a PECVD chamber that uses about a 20% trimethyl-borane (TMB or $B(OCH_3)_3$) to silane ($SiH_4$) molar ratio during processing to form about a 200 Å thick film. It is believed that using a doped amorphous silicon film has advantages over other conventional doped silicon oxides, since the diffusion rate of the dopant atoms from a deposited amorphous silicon film is much higher than from a doped oxide film allowing greater doping depths to be achieved during similar thermal processing steps, and there is no tendency to intermix the oxides with the substrate material during the subsequent thermal processes.

In another embodiment of the process performed at box 1408, the deposited doped layer 1330 is a doped amorphous silicon carbide (a-SiC) layer that is formed over the surface 102 of the solar cell 1300. In one embodiment, an amorphous SiC layer is formed using a PECVD process at a temperature of about <400° C. to minimize the amount of vaporization of the dopant material, such as phosphorous (P) from the previously deposited first dopant material 1329. In one embodiment, an amorphous SiC layer is formed using a PECVD process at a temperature of less than about 200° C. In one example, the doped layer 1330 is deposited using a gas mixture containing trimethyl-borane (TMB or $B(CH_3)_3$), silane ($SiH_4$) and hydrogen ($H_2$).

At box 1409, as illustrated in FIG. 13C, a capping layer 1331 is deposited over the surface of the doped layer 1330. The capping layer 1331 is advantageously used to minimize the migration of the dopant atoms contained within the doped layer 1330 or the first dopant material 1329 to undesirable regions of the substrate, such as the front surface 101, during the subsequent solar cell formation processing steps. In one embodiment, the capping layer 1331 is a dielectric layer that is formed at a sufficient density and thickness to minimize or prevent the migration of dopant atoms within the layers disposed below the capping layer 1331 from moving to other regions of the solar cell. In one example, the capping layer 1331 comprises a silicon oxide, a silicon nitride or a silicon oxynitride containing material. In one embodiment, the capping layer 1331 is a silicon dioxide layer that is greater than about 1000 Å thick. In one embodiment, the capping layer 1331 is a silicon dioxide layer that is deposited using a PECVD deposition process. The capping layer 1331 can also be formed from a material that minimizes and/or prevents the surface 102 from being etched during the subsequent texturizing process performed at box 1412.

At box 1410, as shown in FIGS. 13D and 14, the substrate is heated to a temperature greater than about 800° C. to causes the doping elements in the first dopant material 1329 and the doping elements contained in the doped layer 1330 to diffuse into the surface 116 of the substrate 110 to form a first doped region 1141 and a second doped region 1142, respectively, within the substrate 110. Thus, the formed first doped region 1141 and second doped region 1142 can thus be used to form regions of a point contact type solar cell. In one example, the first dopant material 1329 contains an n-type dopant and the doped layer 1330 contains a p-type dopant that forms an n-type region and a p-type region, respectively, within the substrate 110. In one embodiment, the substrate is heated to a temperature between about 800° C. and about 1300° C. in the presence of nitrogen ($N_2$), oxygen ($O_2$), hydrogen ($H_2$), air, or combinations thereof for between about 1 and about 120 minutes. In one example, the substrate is heated in a rapid thermal annealing (RTA) chamber in a nitrogen ($N_2$) rich environment to a temperature of about 1000° C. for about 5 minutes.

In another embodiment of the process performed at box 1410, the substrate diffusion process is a two step diffusion process. In the first step the substrate is heated to a temperature greater than about 800° C. in a nitrogen ($N_2$) rich environment to prevent oxidation of the various exposed components on the surface of the substrate 110. Next, after a sufficient period of time, such as achieve a desired dopant diffusion depth, then a nitrogen ($N_2$) and oxygen ($O_2$) mixture may be injected into the diffusion chamber to oxidize and consume the silicon material contained in an amorphous SiC containing doped layer 1330 by the end of the process step. In one example, the second step is performed at a temperature greater than about 800° C.

Figure 13E:
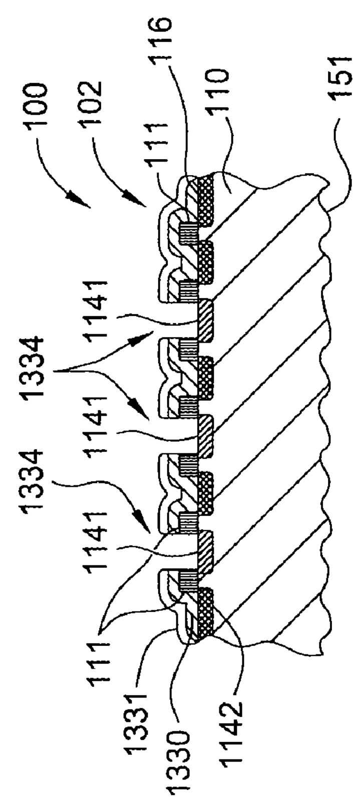

At box 1412, a texturizing process is performed on the opposing surface 101 of the substrate 110 to form a textured surface, which is similar to the textured surface illustrated in FIG. 13E (i.e., reference numeral 151). In one embodiment, the opposing surface 101 of the substrate 110 is the front side of a solar cell substrate that is adapted to receive sunlight after the solar cell has been formed. In general, the use of an alkaline silicon wet etching chemistry is preferred when using a p-type doped layer 1330, due to the high etch selectivity between the doped layer 1330 and/or capping layer 1330 and the exposed material found on the opposing surface 101. Alkaline chemistries are generally effective when used in combination with a p-type doped layer 1330, since doped p-type layers are depleted of electrons thus limiting its ability to react with the etching chemistry. In one embodiment, the silicon wet etching chemistry is an alkaline solution having a wetting agent added therein, which is maintained at a temperature between about 65° C. and about 95° C. during the texturing process. In one embodiment, the alkaline solution for etching the silicon substrate may be an aqueous potassium hydroxide (KOH), sodium hydroxide (NaOH), aqueous ammonia ($NH_4OH$), tetramethylammonium hydroxide (TMAH; or $(CH_3)_4NOH$) or other similar basic solution, and the wetting agent is polyethylene glycol (PEG), sodium dodecyl sulfate (SDS), polypropylene glycol (PPG), copolymer of polyethylene glycol (PEG) or polypropylene glycol (PPG). An example of an exemplary texturizing process is further described in the Provisional patent application Ser. No. 12/383,350, filed Mar. 23, 2009, which is incorporated by reference.

It has been found that using an alkaline texture etching process, such as a potassium hydroxide (KOH) and polyethylene glycol (PEG) etching chemistry, that the doped layer 1330 and capping layer 1331 disposed over the isolated regions 117 that had the first doped material 1329 disposed therein can be easily etched away to create the exposed regions 1334. The exposed regions 1334 are generally regions of the surface of the substrate 110 that may contain at least trace amounts of the n-type dopants driven-in during the processes performed at box 1410. It is believed that in configurations where the first dopant material 1329 contains an n-type dopant, that the alkaline etching chemistry will preferentially attack the n-type regions, such as the areas of the doped layer 1330, capping layer 1331 and substrate surfaces (e.g., reference numeral 116) that were adjacent to the first dopant material 1329 during the diffusion process (box 1410) are removed. In one embodiment, during at least one part of the processes performed at box 1412, the dielectric features 111 are removed (not shown) from the surface of the 102 of the substrate 110 by use of a chemical etching process, mechanical polishing, mechanical abrasion process, or other similar technique.

Figure 13F:
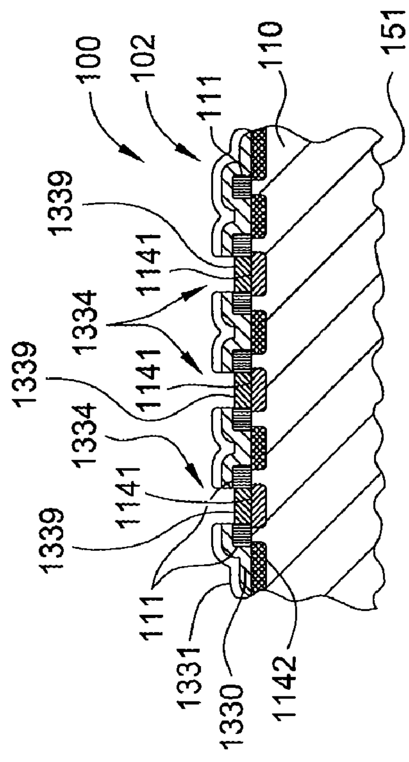

At box 1414, as shown in FIGS. 13F and 14, optionally a dopant material 1339 is deposited into the plurality of exposed regions 1334 formed on the surface of the substrate 110. The dopant material 1339 may be added to the exposed regions 1334 to assure that texturing process (e.g., box 1412) did not remove too much of the n-type dopant in the exposed first doped regions 1141 and/or form a desirable doping profile within these regions after performing a subsequent thermal processing step. In one embodiment, the dopant material 1339 is deposited or printed in a desired pattern by the use of ink jet printing, rubber stamping, screen printing, or other similar process into the one or more of the exposed regions 1334 using the process described above in conjunction with box 1406. The dopant material 1339 may be the same or similar to the first dopant material 1329 and is deposited on the exposed regions using the methods discussed above.

However, in one embodiment, the dopant material 1339 is a doped metal containing ink material that is selectively deposited within the exposed regions 1334 by use of a conventional ink jet printing, screen printing, rubber stamping or other similar process. In one embodiment, metal containing ink is a metal containing ink, such as nickel that contains an amount of an n-type dopant. In one embodiment, the doped metal containing ink material is a nickel containing ink that may contain materials selected from a group consisting of phosphoric acid ($H_3PO_4$), phosphorus acid ($H_3PO_3$), hypophosphorous acid ($H_3PO_2$), and/or various ammonium salts thereof. The doped metal containing ink material is generally formulated to metalize the exposed regions 1334 of the substrate 110. In one embodiment, the doped metal containing ink material primarily contains: 10 grams of nickel acetate ($Ni(OOCCH_3)_2.4H_2O$), and 10 grams of 42% hypophosphorous acid ($H_3PO_2$). In one embodiment, the doped metal containing ink material contains: 10 grams of nickel acetate ($Ni(OOCCH_3)_2.4H_2O$), 10 grams of 42% hypophosphorous acid ($H_3PO_2$), 10 grams of polyphosphoric acid ($H_6P_4O_{13}$), 3 grams of ammonium fluoride ($NH_4F$) and 2 g of 500 MW Polyethylene glycol (PEG). In yet another embodiment, the doped metal containing ink material contains: 10 grams of nickel acetate ($Ni(OOCCH_3)_2.4H_2O$), 10 grams of 42% hypophosphorous acid ($H_3PO_2$), and 3 grams of ammonium fluoride ($NH_4F$), which is used to etch and clean-up the exposed regions 1334. In one embodiment, it may be desirable to add a desirable amount of methanol or ethanol to the doped metal containing ink material containing solution.

Figure 13G:
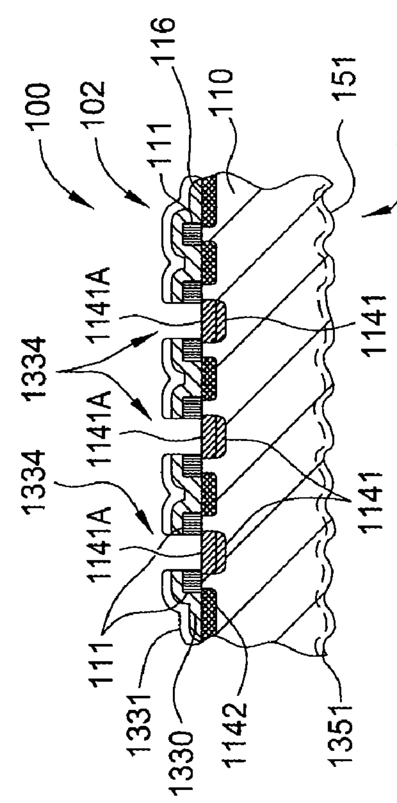

At box 1416, as shown in FIGS. 13G and 14, the substrate is optionally heated to a temperature greater than about 800° C. to causes the doping elements in the dopant material 1339 to diffuse into the surface 116 of the substrate 110 to form a first doped region 1141 within the substrate 110. Thus, the formed first doped region 1141 can be used to form the n-type region of a point contact type solar cell. In one example, the dopant material 1339 contains an n-type dopant and the doped layer 1330 contains a p-type dopant that forms an n-type region and a p-type region, respectively, within the substrate 110. In one embodiment, the substrate is heated to a temperature between about 800° C. and about 1300° C. in the presence of nitrogen ($N_2$), oxygen ($O_2$), hydrogen ($H_2$), air, or combinations thereof for between about 1 and about 120 minutes during the box 1416 processing. In one example, the substrate is heated in a rapid thermal annealing (RTA) chamber in a nitrogen ($N_2$) rich environment to a temperature of about 1000° C. for about 5 minutes. In another embodiment of the process performed at box 1416, the substrate diffusion process is a two step diffusion process, as discussed above in conjunction with box 1410. One benefit of additionally performing the processes within boxes 1414 and 1416 is the ability to form a lightly dope region 1351 on the front surface 101, due to the vaporization and migration of the exposed dopant material 1339 (e.g., phosphorous) to the front surface 101 during the box 1416 processing step(s) that are performed in a thermal processing chamber (e.g., furnace, RTP chamber). The lightly dope region 1351 can be helpful in forming a more effective passivation layer on the front surface 101 of the substrate.

Next, at box 1418, an optional cleaning process may then be performed on the substrate 110 after the process(es) performed after boxes 1402-1410, or boxes 1402-1416, have been completed to remove any undesirable residue on the substrate surfaces (e.g., surfaces 101 and/or 102). The cleaning process may be similar or the same as the cleaning process described above at box 202 in FIG. 2 and/or discussed below in conjunction with FIG. 17E. Alternatively, the substrate may be cleaned by any suitable manners.

Figure 13H:
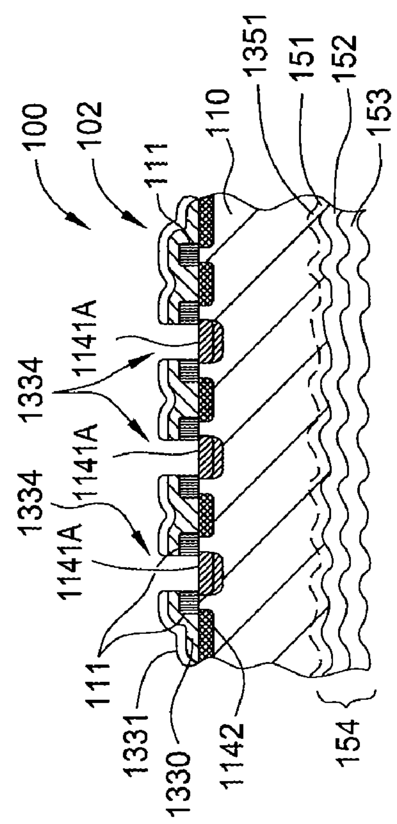

At box 1420, as shown in FIGS. 13H and 14, after the surface 151 of the opposing surface 101 is textured, an antireflection layer 154 is formed thereon. In one embodiment, the antireflection layer 154 comprises a thin passivation/antireflection layer 153 (e.g., silicon oxide, silicon nitride layer). In one embodiment, a silicon nitride (SiN) passivation and antireflection layer, or thin amorphous silicon (a-Si:H) layer or amorphous silicon carbide (a-SiC:H) layer and silicon nitride (SiN) stack is formed on the front surface 101 using a conventional chemical vapor deposition (PECVD) technique using for example, an Applied Materials AKT PECVD system with multiple solar cell substrates supported on a suitable large area carrier. In one embodiment, the passivation/antireflection layer 153 may comprise an intrinsic amorphous silicon (i-a-Si:H) layer and/or n-type amorphous silicon (n-type a-Si:H) layer stack followed by a transparent conductive oxide (TCO) layer and/or an ARC layer (e.g., silicon nitride), which can be deposited by use of a physical vapor deposition process (PVD) or chemical vapor deposition process (e.g., PECVD). The formed stack is generally configured to generate a front surface field effect to reduce surface recombination and promote lateral transport or electron carriers to nearby n+ doped contacts on the backside of the substrate. While FIG. 11H illustrates an antireflection layer 154 that contains a thin passivation/antireflection layer 153 and a TCO layer 152 this configuration is not intended to be limiting as to the scope of the invention described herein, and is only intended to illustrate one example of an antireflection layer 154. One will note that the preparation of the opposing surface 101 completed at boxes 1412 and 1420 may also be performed prior to performing the process(es) at box 1404, or other steps in the process sequence 200, without deviating from the basic scope of the invention described herein.

Figure 13J:
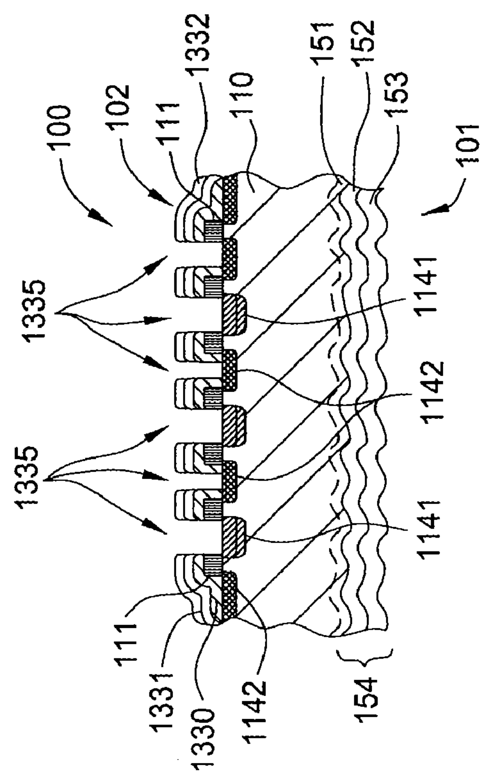
Figure 13L:
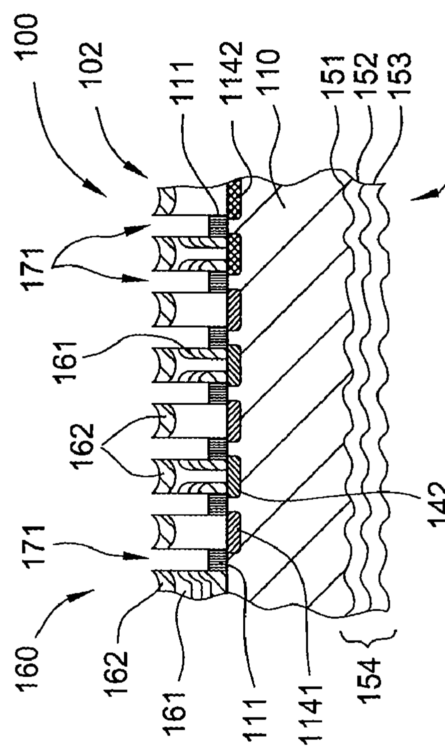
Figure 13I:
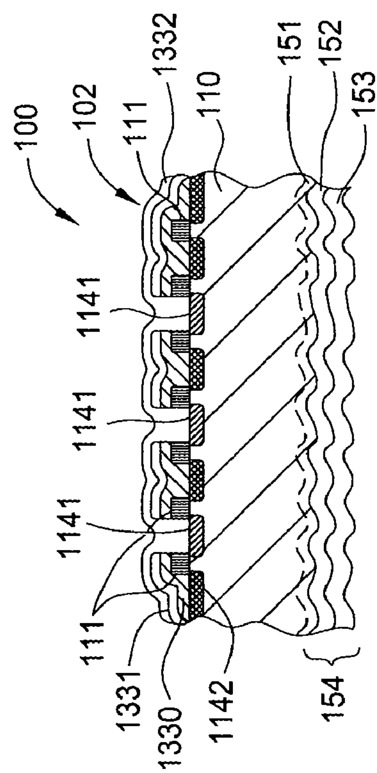

At box 1422, as shown in FIG. 13I, optionally a dielectric layer 1332 is formed over surface 102 so that electrically isolated regions can be provided between the various formed n-type and p-type regions in the formed solar cell device. The formation of the dielectric layer 1332 may be necessary since at least a portion of the capping layer 1331 may be damaged or removed during the processes performed in boxes 1412-1418. In one embodiment, the dielectric layer 1332 is a silicon oxide layer, that may be formed using a conventional thermal oxidation process, such a furnace annealing process, a rapid thermal oxidation process, an atmospheric pressure or low pressure CVD process, a plasma enhanced CVD process, a PVD process, or applied using a sprayed-on, spin-on, roll-on, screen printed, or other similar type of deposition process. In one embodiment, the dielectric layer 1332 is a silicon dioxide layer that is between about 50 Å and about 3000 Å thick. In another embodiment the dielectric layer is a silicon dioxide layer that is less than about 2000 Å thick. In one embodiment, the surface 102 is the backside of a formed solar cell device. It should be noted that the discussion of the formation of a silicon oxide type dielectric layer is not intended to be limiting as to the scope of the invention described herein since the dielectric layer 1332 could also be formed using other conventional deposition processes (e.g., PECVD deposition) and/or be made of other dielectric materials.

In another embodiment, the dielectric layer 1332 comprises a multilayer film stack, such as a silicon oxide/silicon nitride layer stack (e.g., a silicon oxide layer (e.g., layer(s) ~20 Å to ~3000 Å thick) and a silicon nitride layer (e.g., layer(s) ~100 Å to ~1000 Å thick)), an amorphous silicon/silicon oxide layer stack (e.g., amorphous silicon layer (e.g., ~30 to 100 Å thick) and silicon oxide layer (e.g., ~100 to 3000 Å thick)), or an amorphous silicon/silicon nitride stack (e.g., amorphous silicon layer (e.g., ~30 to 100 Å thick) and silicon nitride layer (e.g., ~100 to 1000 Å thick)). In one example, a 50 Å amorphous silicon layer is deposited on a silicon substrate using a CVD process, and then a 750 Å silicon nitride layer is deposited using a CVD or PVD process. In another example, a 50 Å silicon oxide layer is formed using a rapid thermal oxidation process on a silicon substrate, and then a 750 Å silicon nitride is deposited on the silicon oxide layer using a CVD or PVD process. An example of a deposition chamber and/or process that may be adapted to form an amorphous silicon layer, silicon nitride, or silicon oxide discussed herein are further discussed in the commonly assigned and copending U.S. patent application Ser. Nos. 12/178,289, filed Jul. 23, 2008, and the commonly assigned U.S. patent application Ser. No. 12/202,213, filed Aug. 29, 2008, which are both herein incorporated by reference in their entirety.

In box 1424, as shown in FIGS. 13J and 14, regions of the dielectric layer 1332, the capping layer 1331, and/or the doped layer 1330 are etched by conventional means to form a desired pattern of exposed regions 1335 that can be used to form the backside contact structure 160 (FIG. 13L) on the substrate surface. Typical etching processes that may be used to form the patterned exposed regions 1335 on the backside surface 102 may include but are not limited to patterning and dry etching techniques, laser ablation techniques, patterning and wet etching techniques, or other similar processes that may be used to form a desired pattern in the capping layer 1331 and doped layer 1330. The exposed regions 1335 generally provide surfaces through which electrical connections can be made to the backside surface 102 of the substrate 110. An example of a process that can be used to form one or more patterned layers is further discussed in the commonly assigned and copending U.S. patent application Ser. Nos. 12/274,023, filed Nov. 19, 2008, which is herein incorporated by reference in its entirety.

Figure 13K:
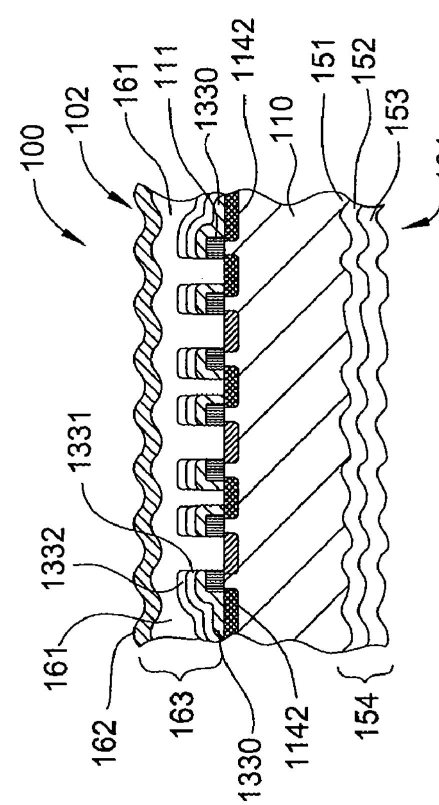

At box 1426, as illustrated in FIGS. 13K and 14, a conducting layer 163 is deposited over the surface 102 of the substrate 110. In one embodiment, the formed conducting layer 163 is between about 500 and about 50,000 angstroms (Å) thick and contains a metal, such as aluminum (Al), silver (Ag), tin (Sn), cobalt (Co), rhenium (Rh), nickel (Ni), zinc (Zn), lead (Pb), palladium (Pd), molybdenum (Mo) titanium (Ti), tantalum (Ta), vanadium (V), tungsten (W), or chrome (Cr). However, in some cases copper (Cu) may be used as a second layer, or subsequent layer, that is formed on a suitable barrier layer (TiW, Ta, etc.). In one embodiment, the conducting layer 163 contains two layers that are formed by first depositing an aluminum (Al) layer 161 by a physical vapor deposition (PVD) process, or evaporation process, and then depositing a nickel vanadium (NiV) capping layer 162 by use of a PVD deposition process.

At box 1428, as illustrated in FIGS. 13L and 14, the conducting layer 163 is patterned to electrically isolate desired regions of the substrate 110 to form an interconnecting structure 160. In one embodiment, the regions of the substrate 110 are electrically isolated by forming channels 171 in the conducting layer 163 by one or more laser ablation, patterning and wet or dry etching, or other similar techniques. The channels 171 may be formed by laser ablation. The channels 171 may be aligned so that bottom of the formed channels 171 is aligned with the dielectric features 111. In general, it is desirable to form or align the channels 171 so that a separate or interdigitated electrical connection structure, or interconnecting structure 160, can be formed to connect the desired p-type or n-type regions of the solar cell device.

Sixth Alternate Patterned Solar Cell Formation Process

FIGS. 15A-15L illustrate schematic cross-sectional views of a solar cell substrate 110 during different stages in a processing sequence used to form a contact structure on a surface 102 of the solar cell 1500. FIG. 16 illustrates a process sequence 1600 used to form the active region(s) and/or contact structure on a solar cell. The sequence found in FIG. 16 corresponds to the stages depicted in FIGS. 15A-15L, which are discussed herein.

Figure 15A:
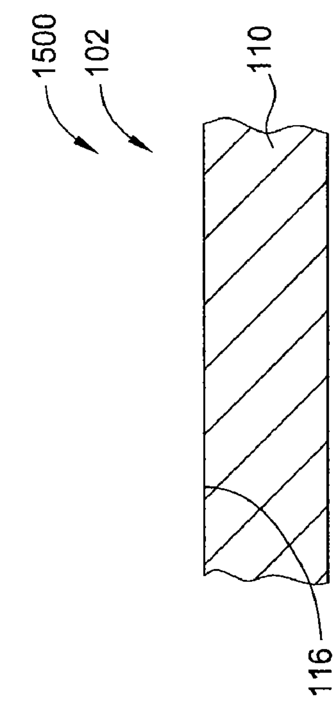
Figure 16:
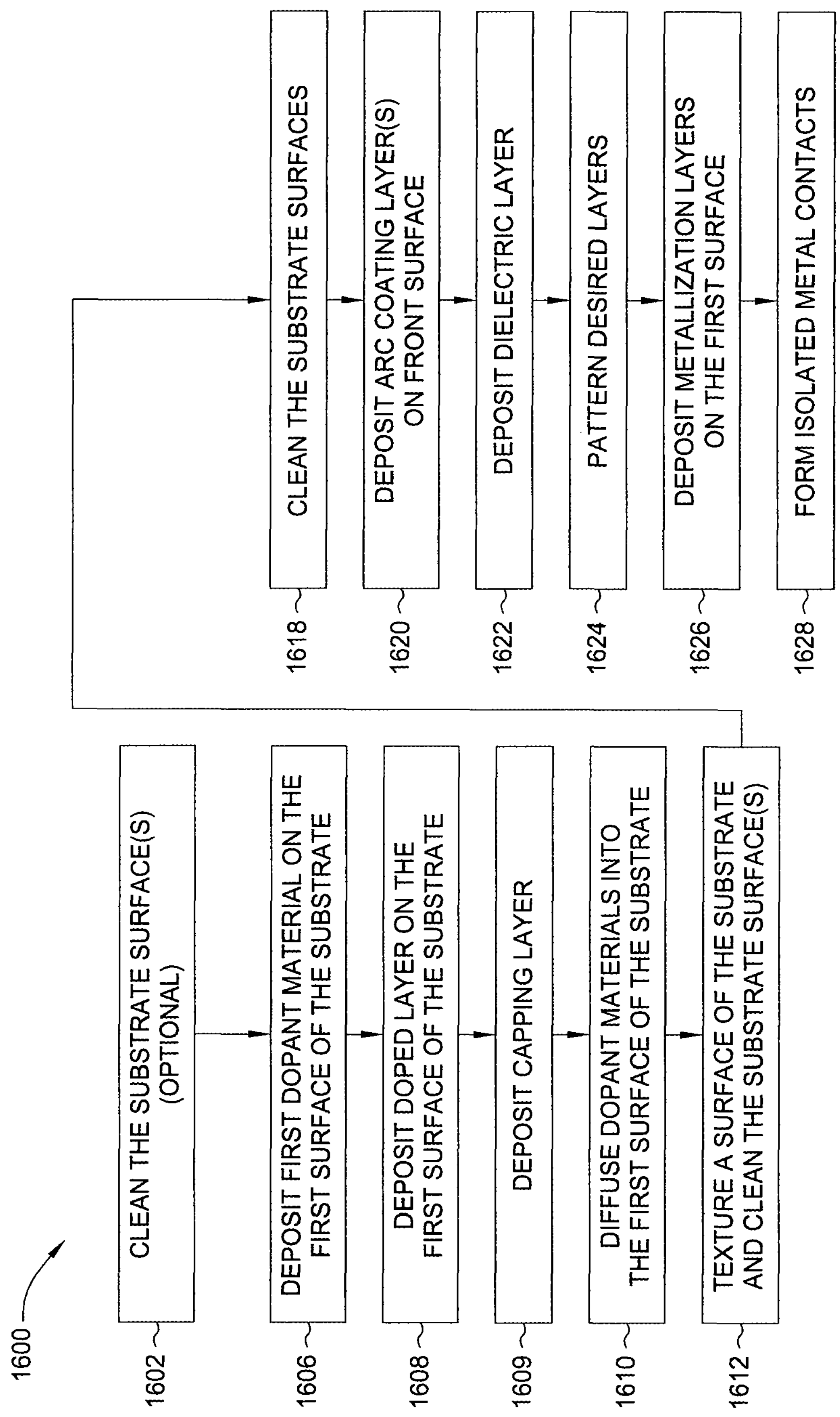
FIG. 16 illustrates a flow chart of methods to metalize a solar cell according to embodiments of the invention.

At box 1602, and as shown in FIG. 15A, the surfaces of the substrate 110 are cleaned to remove any undesirable material or roughness. In one embodiment, the clean process may be performed using a batch cleaning process in which the substrates are exposed to a cleaning solution. The substrates can be cleaned using a wet cleaning process in which, they are sprayed, flooded, or immersed in a cleaning solution. The cleaning process may be similar or the same as the cleaning process described above at box 202 in FIG. 2. Alternatively, the substrate may be cleaned by any suitable manners.

Figure 15B:
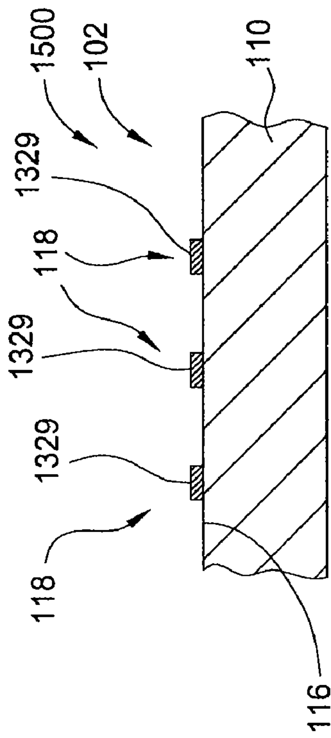

At box 1606, as shown in FIGS. 15B and 16, a first dopant material 1329 is deposited into a plurality of the isolated regions 118 formed on the surface 116 of the substrate 110. In one embodiment, the first dopant material 1329 is deposited or printed in a desired pattern by the use of ink jet printing, rubber stamping, screen printing, or other similar process. The first dopant material 1329 may initially be a liquid, paste, or gel that will be used to form a doped region. In some cases, after disposing the first dopant material 1329 to form the isolated regions 118, the substrate is heated to a desirable temperature to assure that the first dopant material 1329 will remain on the surface 116, and cause the dopant material 1329 to cure, densify, and/or form a bond with the surface 116. In one embodiment, the first dopant material 1329 is a gel or paste that contains an n-type dopant. Typical n-type dopants used in silicon solar cell manufacturing are elements, such as, phosphorus (P), arsenic (As), or antimony (Sb). In one embodiment, the first dopant material 1329 is phosphorous containing dopant paste that is deposited on the surface 116 of the substrate 110 and the substrate is heated to a temperature of between about 80 and about 500° C. In one embodiment, the first dopant material 1329 may contain materials selected from a group consisting of phosphosilicate glass precursors, phosphoric acid ($H_3PO_4$), phosphorus acid ($H_3PO_3$), hypophosphorous acid ($H_3PO_2$), and/or various ammonium salts thereof. In one embodiment, the first dopant material 1329 is a gel or paste that contains between about 6 and about 30 atomic % of phosphorous. In one example, the dopant material 1329 is configured so that after performing subsequent thermal processing steps a doped region is formed having a sheet resistance of less than about 50 Ohms per square (Ω/□) and/or has a doping level greater than about $10^{18}$ atoms/cm$^3$ at the surface of the substrate.

In one embodiment of the process(es) performed in box 1606, it is desirable to deposit an un-doped silicate glass (USG) (not shown) over the surfaces of the deposited first dopant material 1329 to cap, and thus prevent the first dopant material from vaporizing and leaving the surface of the solar cell substrate 110 during one or more subsequent thermal processing steps. In one embodiment, the undoped silicate glass (USG) is deposited using an ink jet printing, rubber stamping, screen printing, or other similar process.

In an alternate embodiment, at box 1606 an inert spacer material is deposited on the surface 116 to form a plurality of the isolated regions 118 on the substrate 110 in place of a first dopant material 1329. In one embodiment, the inert spacer material is a gel or paste that contains an undoped dielectric material, such as the dielectric layer 111 or the dielectric spacers 305 described above.

Figure 15C:
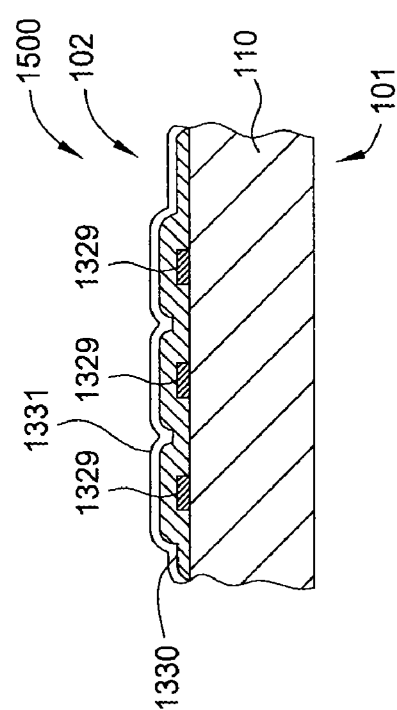

At box 1608, and as shown in FIG. 15C, a doped layer 1330 is deposited over the surface 102 of the solar cell 1500. The doped layer 1330 is advantageously used as an etch mask that minimizes and/or prevents the surface 102 from being etched during the subsequent surface texturing process performed at box 1612, which is used to roughen the opposing surface 101. In general, the etch selectivity of the doped layer 1330 to the exposed material on the opposing surface 101 should be relatively high to prevent material loss from the various regions formed on the surface 102 during the texturizing process. In one example, the etch selectivity of the material on the opposing surface 101 to the doped layer 1330 is at least about 100:1. In one embodiment, the deposited doped layer 1330 is an amorphous silicon containing layer that is about 50 and about 500 Å thick and contains a p-type dopant, such as boron (B). In one embodiment, the doped layer 1330 is a PECVD deposited BSG layer that is formed over the surface 102 of the solar cell 1500. In one example, the doped layer 1330 is configured so that after performing subsequent thermal processing steps a doped region is formed having a sheet resistance of less than about 50 Ohms per square (Ω/□) and/or has a doping level greater than about $10^{18}$ atoms/$cm^3$ at the surface of the substrate.

In one embodiment of the process performed at box 1608, the deposited doped layer 1330 is a doped amorphous silicon (a-Si) layer that is formed over the surface 102 of the solar cell 1500. In one embodiment, the doped amorphous silicon layer is an amorphous silicon hydride (a-Si:H) layer is formed at a temperature of about 200° C. to minimize the amount of vaporization of the dopant material, such as phosphorous (P) from the previously deposited first dopant material 1329. In one example, the doped layer 1330 is deposited using a gas mixture containing diborane ($B_2H_6$), silane ($SiH_4$) and hydrogen ($H_2$). In one embodiment, the deposited doped layer 1330 is a doped amorphous silicon (a-Si) layer that is less than about 500 Å thick and contains a p-type dopant, such as boron (B). In one example, the doped amorphous silicon (a-Si) layer is formed in a PECVD chamber that uses about a 20% trimethyl-borane (TMB or $B(OCH_3)_3$) to silane ($SiH_4$) molar ratio, which in this example is equal to atomic ratio, during processing to form about a 200 Å thick film. It is believed that using a doped amorphous silicon film has advantages over other conventional doped silicon oxides, since the diffusion rate of the dopant atoms from a deposited amorphous silicon film is much higher than from a doped oxide film allowing greater doping depths, and no tendency to intermix the oxides with the substrate material during the subsequent thermal processes.

In another embodiment of the process performed at box 1608, the deposited doped layer 1330 is a doped amorphous silicon carbide (a-SiC) layer that is formed over the surface 116 of the solar cell 1500. In one embodiment, an amorphous SiC layer is formed using a PECVD process at a temperature of about <400° C. to minimize the amount of vaporization of the dopant material, such as phosphorous (P) from the previously deposited first dopant material 1329. In one embodiment, an amorphous SiC layer is formed using a PECVD process at a temperature of less than about 200° C. In one example, the doped layer 1330 is deposited using a gas mixture containing trimethyl-borane (TMB or $B(CH_3)_3$), silane ($SiH_4$) and hydrogen ($H_2$).

At box 1609, as illustrated in FIG. 15C, a capping layer 1331 is deposited over the surface of the doped layer 1330. The capping layer 1331 is advantageously used to minimize the migration of the dopant atoms contained within the doped layer 1330 or the first dopant material 1329 to undesirable regions of the substrate, such as the front surface 101, during the subsequent solar cell formation processing steps. In one embodiment, the capping layer 1331 is a dielectric layer that is formed at a sufficient density and thickness to minimize or prevent the migration of dopant atoms within the layers disposed below the capping layer 1331 from moving to other regions of the solar cell. In one example, the capping layer 1331 comprises a silicon oxide, a silicon nitride or a silicon oxynitride containing material. In one embodiment, the capping layer 1331 is a silicon dioxide layer that is greater than about 1000 Å thick. In one embodiment, the capping layer 1331 is a silicon dioxide layer that is deposited using a PECVD deposition process. The capping layer 1331 can also be formed from a material that minimizes and/or prevents the surface 102 from being etched during the subsequent texturizing process performed at box 1612.

Figure 15D:
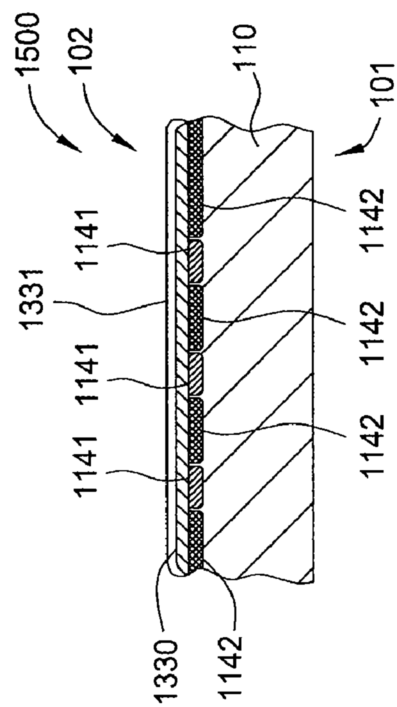

At box 1610, as shown in FIGS. 15D and 16, the substrate is heated to a temperature greater than about 800° C. to causes the doping elements in the first dopant material 1329 and the doping elements contained in the doped layer 1330 to diffuse into the surface 116 of the substrate 110 to form a first doped region 1141 and a second doped region 1142, respectively, within the substrate 110. Thus, the formed first doped region 1141 and second doped region 1142 can thus be used to form regions of a point contact type solar cell. In one example, the first dopant material 1329 contains an n-type dopant and the doped layer 1330 contains a p-type dopant that forms an n-type region and a p-type region, respectively, within the substrate 110. In one embodiment, the substrate is heated to a temperature between about 800° C. and about 1300° C. in the presence of nitrogen ($N_2$), oxygen ($O_2$), hydrogen ($H_2$), air, or combinations thereof for between about 1 and about 120 minutes. In one example, the substrate is heated in a rapid thermal annealing (RTA) chamber in a nitrogen ($N_2$) rich environment to a temperature of about 1000° C. for about 5 minutes.

At box 1611, as shown in FIGS. 15E and 16, an etching mask material 1551 is deposited over the isolated regions 118 of the substrate over which the first dopant material 1329 was deposited. In general, the etching mask material 1551 is a material that will not be significantly attacked by the chemistry used in the subsequent texturizing process and can be deposited in a desired pattern on the surface of the substrate. In one example, the etching mask material 1551 is deposited in a desired pattern using a screen printing, inkjet printing, spray-on, roll-on or other desirable process. The etching mask material 1551 is generally used to prevent the chemistry used in the subsequent texturizing process from attacking or removing all or large portions of the material found in the formed first doped regions 1141 (box 1610). In one example, the etching mask material 1551 is a silicone containing material or a polyvinylpyridine ($C_4H_9(C_6H_7N)n$) containing material. In one example, the etching mask material 1551 is formed from a mixture containing about 5 grams of 100,000 molecular weight polyvinylpyridine, 1 ml of acetic acid, and about 20 grams for glycerin that is heated until it forms a gel. It is generally desirable to form the etching mask material 1551 from a material that can be easily removed during the later cleaning process (box 1618), but not be significantly attacked during the subsequent texturization process (box 1612).

In one embodiment, as shown in FIG. 15E, the etching mask material 1551 is deposited so that it only partially covers the first doped region 1141 so that a portion of the first doped regions 1141 can be removed during the subsequent texturizing process. In one configuration, the formed first doped regions 1141 and deposited etching mask material 1551 are both circular in shape and have a diameter $D_1$ and diameter $D_2$, respectively. In one example, the diameter $D_1$ is about 2 mm in size and the diameter $D_2$ is about 1 mm in size, so that an etched region 1555 (FIGS. 15F and 15G) is created during the subsequent texturizing process. In this example, the width of the etched region would be approximately about 0.5 mm, and form an annular trench shaped structure. The etched region 1555, which may have a depth $D_3$ (FIG. 15G) that is about a few microns deep, is generally formed to help electrically isolate the formed first doped regions 1141 and the formed second doped region 1142 in the formed solar cell device 1500.

At box 1612, as shown in FIGS. 15F and 16, a texturizing process is performed on the opposing surface 101 of the substrate 110 to form a textured surface 151. In one embodiment, the opposing surface 101 of the substrate 110 is the front side of a solar cell substrate that is adapted to receive sunlight after the solar cell has been formed. As noted above, use of an alkaline silicon wet etching chemistry during the texturizing process, which are discussed above, is generally preferred when using a p-type doped layer 1330, due to the high etch selectivity between the doped layer 1330 and/or capping layer 1331 and the exposed material found on the opposing surface 101. In general, since the lateral dimension (e.g., diameter $D_2$) of the etching mask material 1551 is much greater than the thickness of the doped layer 1330 (e.g., ~200 Å), the thickness of the capping layer 1331 (e.g., ~2000 Å) and the depth $D_3$ of the etched region 1555 (e.g., ~5 μm) so that the amount of material removed from the first doped regions 1141 that is underneath the etching mask material 1551 will be negligible during the texturizing process. Therefore, in one configuration, after performing the texturing process most of the formed first doped regions 1141 will remain unaffected by the texture etching process.

Next, at box 1618, as shown in FIGS. 15G and 16, a cleaning process is performed on the substrate 110 after the texturizing process has been completed to remove the etching mask material 1551, doped layer 1330, and the capping layer 1331 from the surface 102 of the substrate. FIG. 15G is close-up side cross-sectional view of a single first doped region 1141 that has been cleaned using the steps described in box 1618 and having an etched region 1555 that is formed on the surface of the substrate during the texturizing process. In one embodiment, the clean process may be performed by wetting the substrate with a cleaning solution to clean the surface of the substrate before the subsequent deposition sequence is performed on the various regions of the substrate. The cleaning process may be similar or the same as the cleaning process described above at box 202 in FIG. 2 and/or the processes described in conjunction with FIG. 17E. Alternatively, the substrate may be cleaned by any suitable manners.

At box 1620, as shown in FIGS. 15H and 16, an antireflection layer 154 is formed on the surface 151 of the opposing surface 101. In one embodiment, the antireflection layer 154 comprises a thin passivation/antireflection layer 153 (e.g., silicon oxide, silicon nitride layer). In another embodiment, the antireflection layer 154 comprises a thin passivation/antireflection layer 153 (e.g., silicon oxide, silicon nitride layer) and a transparent conductive oxide (TCO) layer 152. In one embodiment, the passivation/antireflection layer 153 may comprise an intrinsic amorphous silicon (i-a-Si:H) layer and/or n-type amorphous silicon (n-type a-Si:H) layer stack followed by a transparent conductive oxide (TCO) layer and/or an ARC layer (e.g., silicon nitride), which can be deposited by use of a physical vapor deposition process (PVD) or chemical vapor deposition process. The formed stack is generally configured to generate a front surface field effect to reduce surface recombination and promote lateral transport or electron carriers to nearby n+ doped contacts on the backside of the substrate.

While FIG. 15H illustrates an antireflection layer 154 that contains a thin passivation/antireflection layer 153 and a TCO layer 152 this configuration is not intended to be limiting as to the scope of the invention described herein, and is only intended to illustrate one example of an antireflection layer 154. One will note that the preparation of the opposing surface 101 completed at boxes 1612 and 1620 may also be performed prior to performing the process(es) at box 1604, or other steps in the process sequence 200, without deviating from the basic scope of the invention described herein.

Figure 15J:
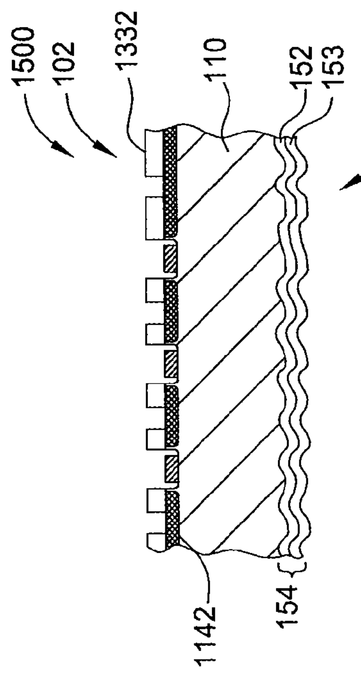
Figure 15L:
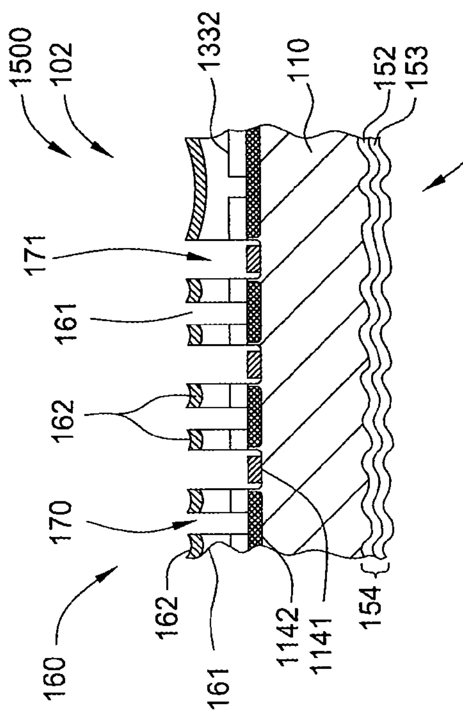
Figure 15I:
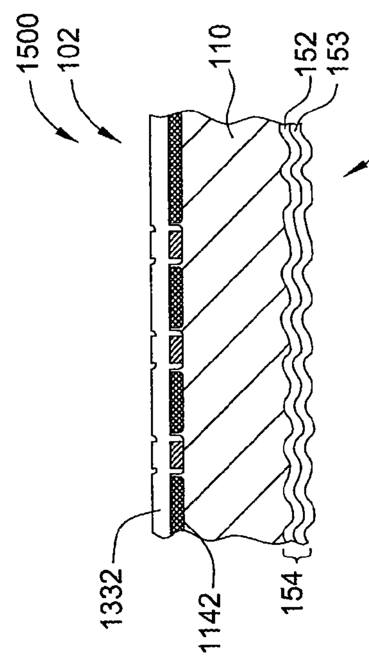

At box 1622, as shown in FIG. 15I, a dielectric layer 1332 is formed over surface 102 so that electrically isolated regions can be provided between the various formed n-type and p-type regions in the formed solar cell device. The types of materials and processes of forming the dielectric layer 1332 are further described above in conjunction with box 1422.

In box 1624, as shown in FIGS. 15J and 16, regions of the dielectric layer 1332, the capping layer 1331, and/or the doped layer 1330 are etched by conventional means to form a desired pattern of exposed regions 1335 that can be used to form the backside contact structure 160 (FIG. 15L) on the substrate surface. Typical etching processes that may be used to form the patterned exposed regions 1335 on the backside surface 102 may include but are not limited to patterning and dry etching techniques, laser ablation techniques, patterning and wet etching techniques, or other similar processes that may be used to form a desired pattern in the capping layer 1331 and doped layer 1330. The exposed regions 1335 generally provide surfaces through which electrical connections can be made to the backside surface 102 of the substrate 110. An example of a dry etching process that can be used to form one or more patterned layers is further discussed in the commonly assigned and copending U.S. patent application Ser. Nos. 12/274,023, filed Nov. 19, 2008, which is herein incorporated by reference in its entirety.

Figure 15K:
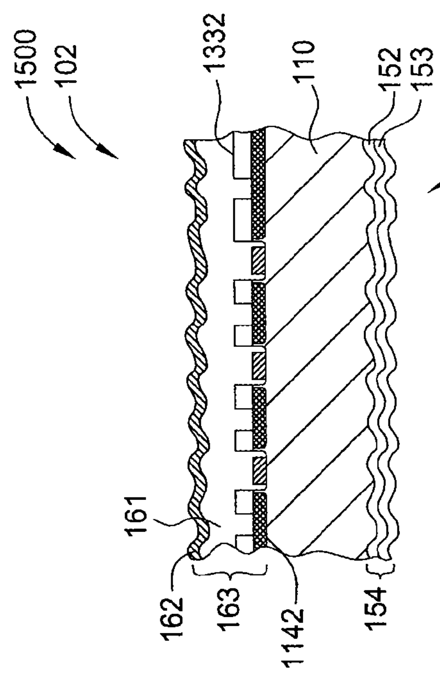

At box 1626, as illustrated in FIGS. 15K and 16, a conducting layer 163 is deposited over the surface 102 of the substrate 110. In one embodiment, the formed conducting layer 163 is between about 500 and about 50,000 angstroms (Å) thick and contains a metal, such as aluminum (Al), silver (Ag), tin (Sn), cobalt (Co), rhenium (Rh), nickel (Ni), zinc (Zn), lead (Pb), palladium (Pd), molybdenum (Mo) titanium (Ti), tantalum (Ta), vanadium (V), tungsten (W), or chrome (Cr). However, in some cases copper (Cu) may be used as a second layer, or subsequent layer, that is formed on a suitable barrier layer (e.g., TiW, Ta, etc.). In one embodiment, the conducting layer 163 contains two layers that are formed by first depositing an aluminum (Al) layer 161 by a physical vapor deposition (PVD) process, or evaporation process, and then depositing a nickel vanadium (NiV) capping layer 162 by use of a PVD deposition process.

At box 1628, as illustrated in FIGS. 15L and 16, the conducting layer 163 is patterned to electrically isolate desired regions of the substrate 110 to form an interconnecting structure 160. In one embodiment, the regions of the substrate 110 are electrically isolated by forming channels 171 in the conducting layer 163 by one or more laser ablation, patterning and wet or dry etching, or other similar techniques. In general, it is desirable to form or align the channels 171 so that a separate or interdigitated electrical connection structure, or interconnecting structure 160, can be formed to connect the desired p-type or n-type regions of the solar cell device.

Seventh Alternate Patterned Solar Cell Formation Process

FIGS. 17A-17I are schematic cross-sectional views of a solar cell substrate 110 that illustrate stages of an alternate version of the processing sequence used to form the solar cell 1500, which is discussed in conjunction with FIGS. 15 and 16. As shown in FIG. 17A-17D, a solar cell device 1500 is formed using processes that are similarly described in FIGS. 15A-D and 16, and thus are not re-recited here again.

Figure 17B:
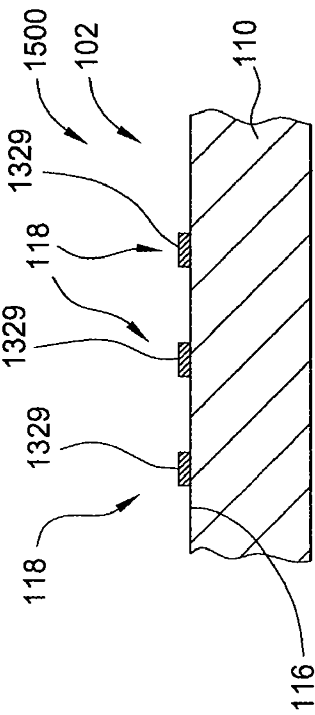
Figure 17D:
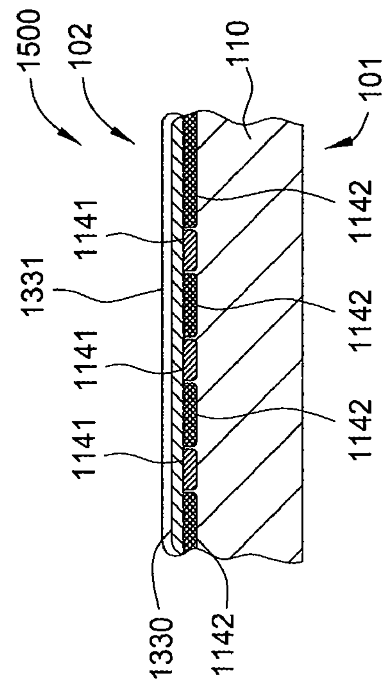
Figure 17A:
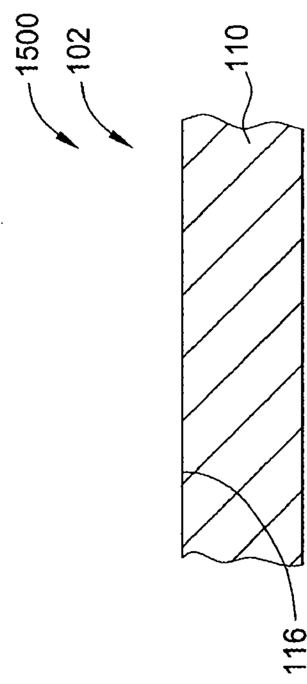
Figure 17C:
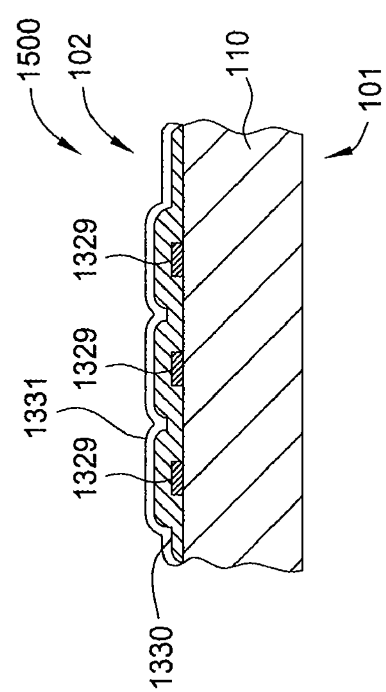
Figure 17E:
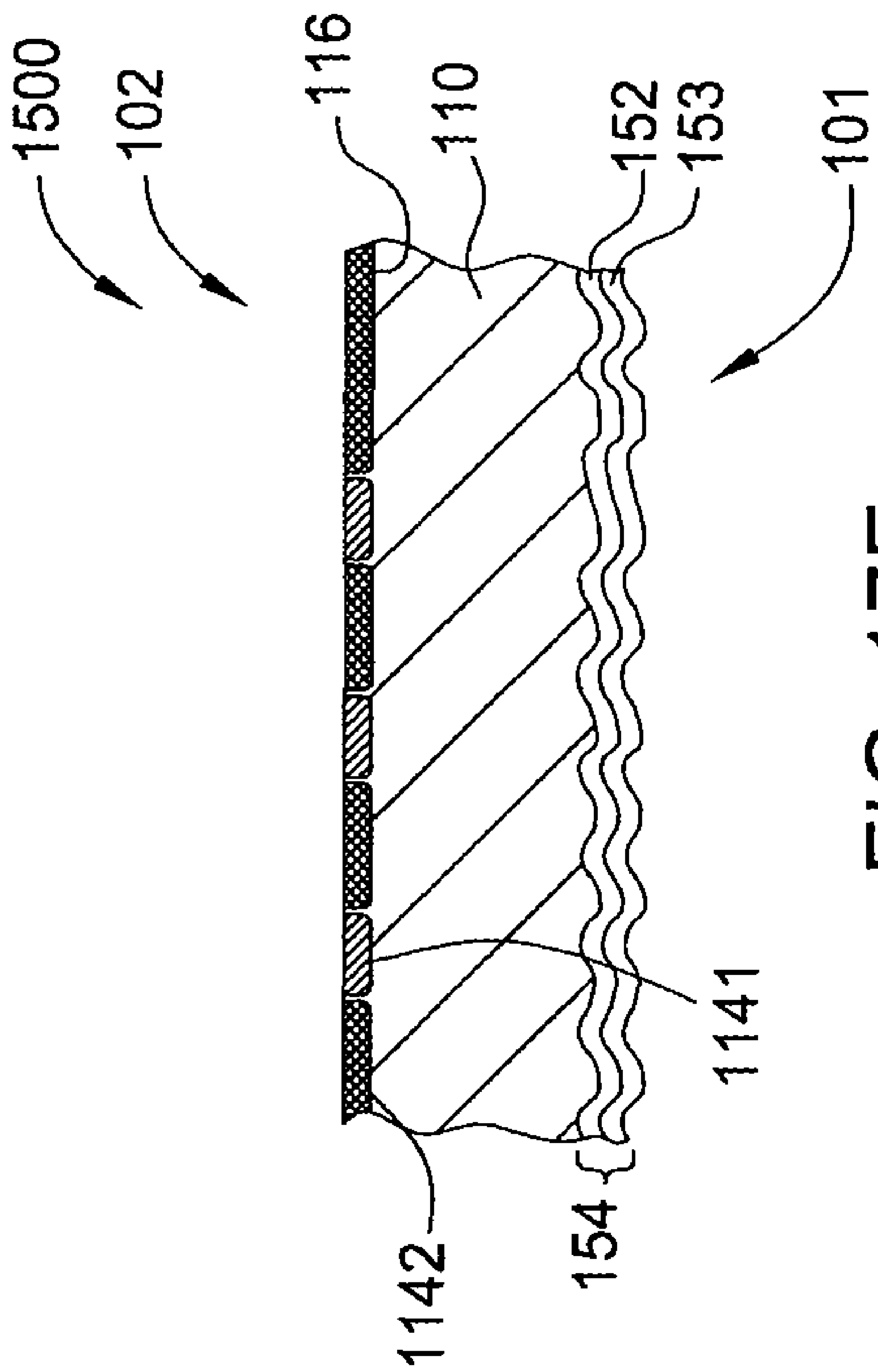

After performing the processes at box 1610, in which the substrate is heated to cause the doping elements to form a first doped region 1141 and a second doped region 1142 within the substrate 110, a texturization process (e.g., box 1612) is performed on the opposing surface 101 of the substrate 110 to form a textured surface, as shown in FIG. 17E. The texturing process may be performed by any suitable manner discussed above in conjunction with box 1612 in FIG. 16. In one embodiment, it is desirable to make sure that the surface 116 is unaffected by the texture etch process by using a conventional physical mask (e.g., tape or other masking material) to reduce the possibility of etching the surface 116. In one embodiment, the capping layer 1331 material and thickness are selected so that the formed first doped regions 1141 and the second doped regions 1142 remain relatively un-textured by the texture etching process. In one embodiment, the thickness of the capping layer 1331 (e.g., ~2000 Å of silicon dioxide) is selected so that the amount of material removed from the first doped regions 1141 and/or second doped regions 1142 will be negligible during the texturizing process.

Next, in a subsequent step, a cleaning process is performed on the substrate 110 after the texturizing process has been completed to remove the doped layer 1330, and the capping layer 1331 from the surface 102 of the substrate. In one embodiment, the clean process may be performed by wetting the substrate with a cleaning solution to clean the surface of the substrate before the subsequent deposition sequence is performed on the various regions of the substrate. The cleaning process may be similar to the cleaning process described above at box 202 in FIG. 2. Alternatively, the substrate may be cleaned using a cleaning chemistry that comprises ozone ($O_3$), such as an ozone containing gas, vapor, or liquid. In one example, the front and back surface of the substrate 110 is exposed to a cleaning solution that comprises a dissolved ozone ($O_3$) containing solution having an etchant solution disposed therein. In one configuration, the etchant solution is an acid or alkaline containing solution, such as, for example, an hydrofluoric acid (HF) or an potassium hydroxide (KOH) containing solution. In one embodiment, an HF-last type cleaning solution or other suitable and cost effective cleaning solution may be used as well to clean the substrate surfaces. It has been found that carbon and/or oxygen residual materials that are commonly found in the precursor materials used to form the doped layer 1330 (e.g., trimethylboron), dopant paste component materials, and/or other similarly deposited materials, which are left on the surface of the substrate 110, can adversely affect the electrical performance (e.g., carrier lifetime) of the solar cell device and film quality of the subsequently formed layers. Accordingly, a cleaning process may be performed to remove a desired amount of the surface (e.g., reference numeral 116) of the substrate to assure that the residual contaminants are removed to improve the solar cell device performance. In one embodiment, the cleaning process may be performed to etch and remove the doped layer 1330 and the capping layer 1331 and a portion of the upper surface 116 that contains the first doped region 1141 and the second doped region 1142. In one embodiment, the portion of the surface 116 removed during the cleaning process is less than about 0.5 μm from the surface of the substrate, such as between about 0.1 μm and about 0.4 μm, for example, about 0.3 μm.

In an alternate embodiment, the chemical concentrations and/or time of the texturizing process (e.g., box 1612), and the thickness of the capping layer 1331 and/or doped layer 1330 are configured so that the opposing surface 101 is sufficiently textured, the doped layer 1330 and capping layer 1331 are removed from the surface 116, and a portion of the upper surface 116 (e.g., <0.5 μm) is removed during the texturization process performed at box 1612. In this configuration, a second cleaning step as discussed above may not be required.

After cleaning the surface of the substrate, an antireflection layer 154 can be formed on the surface 151 of the opposing surface 101, as shown in FIG. 17E. In one embodiment, the antireflection layer 154 comprises a thin passivation/antireflection layer 153 (e.g., silicon oxide, silicon nitride layer) as discussed above. The manufacturing process, film structure and film quality of the antireflection layer 154 are similarly configured as the antireflection layer 154 described above with referenced to FIG. 15H.

Subsequently, a dielectric layer 1332 is formed over surface 102, as shown in FIG. 17F, so that electrically isolated regions can be provided between the various formed n-type and p-type regions in the formed solar cell device. The types of materials and processes of forming the dielectric layer 1332 are further described above in conjunction with box 1422 or 1622.

After the dielectric layer 1332 is formed on the substrate surface 102, regions of the dielectric layer 1332, the capping layer 1331, and/or the doped layer 1330 are etched by conventional means to form a desired pattern of exposed regions 1335, as shown in FIG. 17G, that can be used to form the backside contact structure 160 (FIG. 17I) on the substrate surface. Typical etching processes that may be used to form the patterned exposed regions 1335 on the backside surface 102 may include but are not limited to patterning and dry etching techniques, laser ablation techniques, patterning and wet etching techniques, or other similar processes that may be used to form a desired pattern in the capping layer 1331 and doped layer 1330. The exposed regions 1335 generally provide surfaces through which electrical connections can be made to the backside surface 102 of the substrate 110. An example of a dry etching process that can be used to form one or more patterned layers is further discussed in the commonly assigned and copending U.S. patent application Ser. Nos. 12/274,023, filed Nov. 19, 2008, which is herein incorporated by reference in its entirety.

After the etching process, a conducting layer 163 is deposited over the surface 102 of the substrate 110, as shown in FIG. 17H. The conducting layer 163 may be manufactured by any suitable manner described above, or conventionally available in the art. The configuration of the conducting layer 163 is similarly configured as the conducting layer 163 described above with referenced to FIGS. 1-16.

After the conducting layer 161 is formed on the substrate surface, the conducting layer 163 is patterned to electrically isolate desired regions of the substrate 110 to form an interconnecting structure 160, as shown in FIG. 17I. In one embodiment, the regions of the substrate 110 are electrically isolated by forming channels 171 in the conducting layer 163 by one or more laser ablation, patterning and wet or dry etching, or other similar techniques. In general, it is desirable to form or align the channels 171 so that a separate or interdigitated electrical connection structure, or interconnecting structure 160, can be formed to connect the desired p-type or n-type regions of the solar cell device.

Alternate Doping process

One aspect of the invention includes a method of doping desired regions of a solar cell device using a dielectric patterning process to form heavily doped regions within portions of the patterned dielectric material. In general, the techniques described herein are used to form heavily doped regions at the exposed regions in the patterned dielectric layer. In one embodiment, an etching material is disposed over portions of an undoped dielectric layer to etch and form an exposed region. In one example, the undoped dielectric layer is a blanket dielectric layer, such as a silicon dioxide containing material formed over a surface of the solar cell substrate. In one embodiment, the etching material comprises a dielectric etchant and an amount of a dopant containing material. In one example, the etchant material may further contain an ammonium fluoride ($NH_4F$) containing material that is formulated to etch the dielectric layer. In one example, the etchant material contains: 200 g/l of ammonium fluoride ($NH_4F$), 50 g/l of 2000 MW polyethylene glycol (PEG) and 50 g/l of ethyl alcohol with the remainder of the 1 liter volume being DI water. In another example, one liter of the etchant material contains: 6:1 BOE etching solution, 7.5% $H_3PO_2$, ammonium fluoride ($NH_4F$) and 500 MW polyethylene glycol (PEG) in DI water. Additional components in the etching solution are generally selected so as to promote effective "wetting" of the dielectric layer while minimizing the amount of spreading that can affect the formed pattern in the dielectric layer. While polyethylene oxide (i.e., polyethylene glycol) based materials and other related materials work well as a surfactant in the etchant material, they also decompose at temperatures over 250° C. to form volatile byproducts thereby avoiding the need for a post-rinse step to clean the substrate surface after heating the substrate in the next step.

After selectively deposited etchant material on the dielectric layer the substrate is then heated up to about 400° C. during which most or all of the dielectric material is converted to volatile etch products (i.e., $SiF_4$) to form exposed regions in the undoped dielectric layer, but leaving behind the less volatile dopant additives that was contained in the etchant material. The high concentration of the remaining dopant atoms can thus be advantageously used to form a heavily doped region by then driving the residual material into the underlying substrate material during a subsequent high temperature diffusion step.

In another embodiment, an etching material is applied to a dopant containing dielectric layer (e.g., dielectric layer 711), such as a phosphosilicate or borosilicate glass layer, before the high temperature diffusion step. Following volatilization of most of the silicon dioxide components by conversion to $SiF_4$ due to the reaction of the dielectric material with the etching material, a concentrated residue of the dopant material is formed or remains on the exposed surface. Thus in a subsequent high temperature diffusion step, both the dopant in the (unetched) doped layers, for example, BSG or PSG layers and the more concentrated dopant residue present at the surface of the etched openings are driven in the solar cell substrate. In another embodiment, additional dopant atom containing compounds are added to the etchant formulation to increase the concentration in the residue and ultimately the differential degree of doping under the contacts. In one embodiment, the dopant in the etching material contains a dopant of another type than the dopant (e.g., Al, Ga, In) contained in the doped dielectric layer (e.g., B, P). These embodiments provide a simplified approach the formation of selective emitter contacts correlated with higher solar cell efficiencies.

Interconnect Structures

Figure 9B:
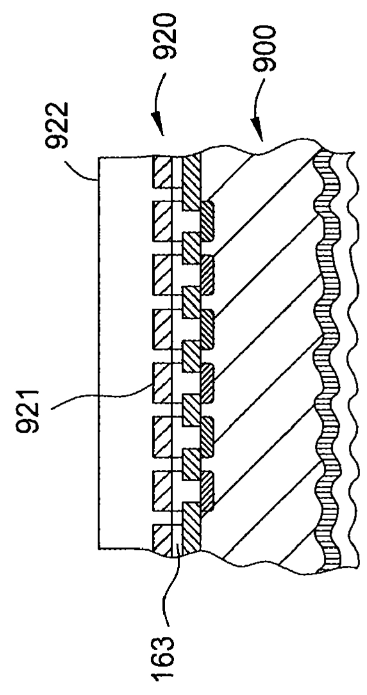
FIGS. 9A-9C schematically illustrates an interconnecting structure according to embodiments of the invention.
Figure 9C:
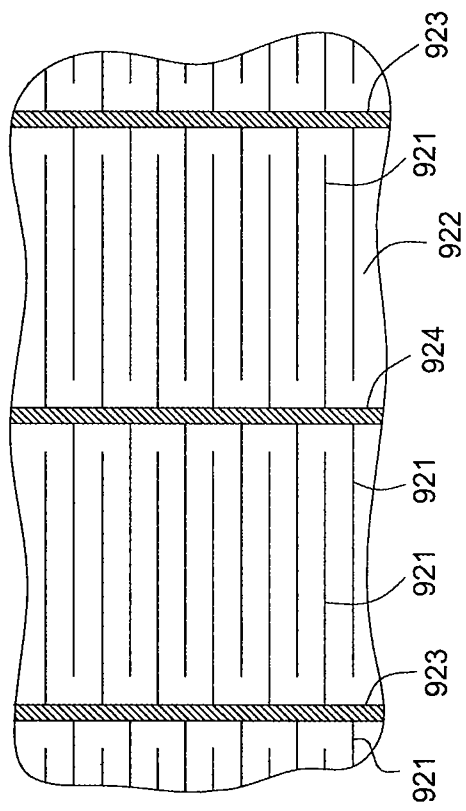
Figure 9A:
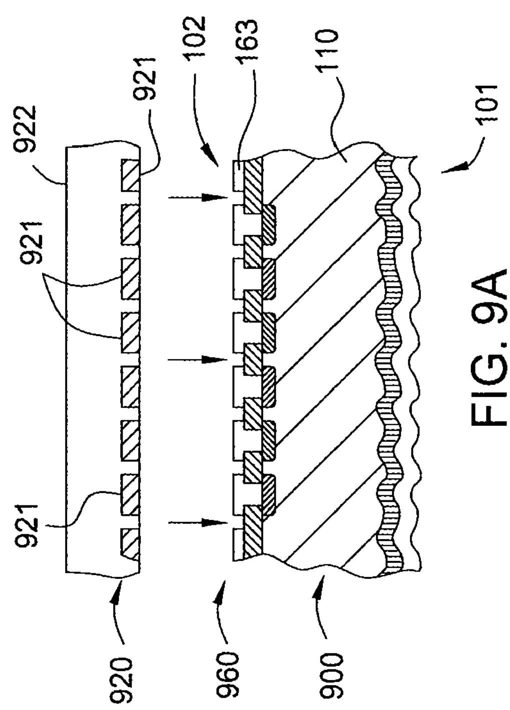

FIG. 9A-9C illustrate various embodiments of an external interconnect structure 920 that can be used to inexpensively interconnect portions of a solar cell device 900 by reducing the time required to form the conductive components in an interconnecting structure 960 formed on the solar cell device 900. In one embodiment, the interconnecting structure 960 is similar to the structures discussed above in conjunction with reference numerals 160, 360, 560 or 760. FIG. 9B illustrates an assembled solar cell device 900 in which the external interconnect structure 920 is bonded to the interconnecting structure 960, and thus all of the desired electrical interconnections on at least one side of the solar cell have been formed. In general the use of a external interconnect structure 920 can also help to improve substrate throughput in the solar cell formation processing sequence and reduce the intrinsic or extrinsic stress created in the thin solar cell substrates by reducing the required thickness of the deposited conducting layer(s) 163 on the surface of the substrate. The stress induced in a solar cell device by the deposited metal layers can also reduce the device yield.

FIG. 9A illustrates is a cross-sectional side view of an external interconnect structure 920 and solar cell device 900 that has an interconnecting structure 960 formed on a side of the solar cell device. In one example, the solar cell device 900 is similar to the structure formed and described in conjunction with FIGS. 5A-5J and 6. In general, interconnecting structure 960 in the formed solar cell device 900 contains a patterned array of conductive features 901 that are electrically connected to desired portions of the solar cell device and designed to carry a part of the generated current when the solar cell is exposed to sunlight. The external interconnect structure 920 generally contains a patterned metal structure 921 that is disposed on, attached, or bonded to a substrate 922. In one embodiment, the substrate 922 is a flexible element that supports the patterned metal structure 921 and allows the external interconnect structure 920 to conform to shape of the interconnecting structure 960 formed on the formed solar cell device 900 when they are attached. In one example, the substrate 922 is a compliant piece of polymeric material, such as a sheet of a polyimide material, or other similar materials. In general, the external interconnect structure 920 is designed to carry the bulk of the generated current when the solar cell device 900 is exposed to sunlight The patterned metal structure 921 is generally a conductive material that is either integrally formed or deposited on a surface the substrate 922 by use of a PVD, CVD, screen printing, electroplating, evaporation or other similar deposition technique. The patterned metal structure 921 may contain a metal, such as aluminum (Al), copper (Cu), silver (Ag), tin (Sn), nickel (Ni), zinc (Zn), or lead (Pb) that is between about 100,000 Å thick.

Referring to FIGS. 9A and 9B, the external interconnect structure 920 is bonded to the interconnecting structure 960 by first applying the external interconnect structure 920 to the interconnecting structure 960 and then applying enough heat to cause the conductive parts of the patterned metal structure 921 to form a bond with the interconnecting structure 960. In one embodiment, a solder type material is disposed between a surface of the patterned metal structure 921 or the interconnecting structure 960 to form a reliable electrical contact between these components. During the bonding process, as shown in FIG. 9A, the external interconnect structure 920 is positioned and aligned to the solar cell substrate so that when the external interconnect structure 920 and the interconnecting structure 960 are bonded together the solar cell device is desirably connected.

FIG. 9C is a plan view of one embodiment of the external interconnect structure 920 in which separate patterned metal structures 921 are formed into an interdigitated pattern that are each used to separately connect the n-type regions and the p-type regions of a solar cell device together. In one embodiment, as shown in FIG. 9C, each of the patterned metal structure 921 elements are connected to a buss line, such as busslines 923, 924. In this configuration each of the buss lines 923, 924 are sized to collect the current passing through each of the patterned metal structure 921 lines from their respective regions of the solar cell device.

Alternate Interconnect Structure(s)

Figures 10A, 10B, 10C, 10D:
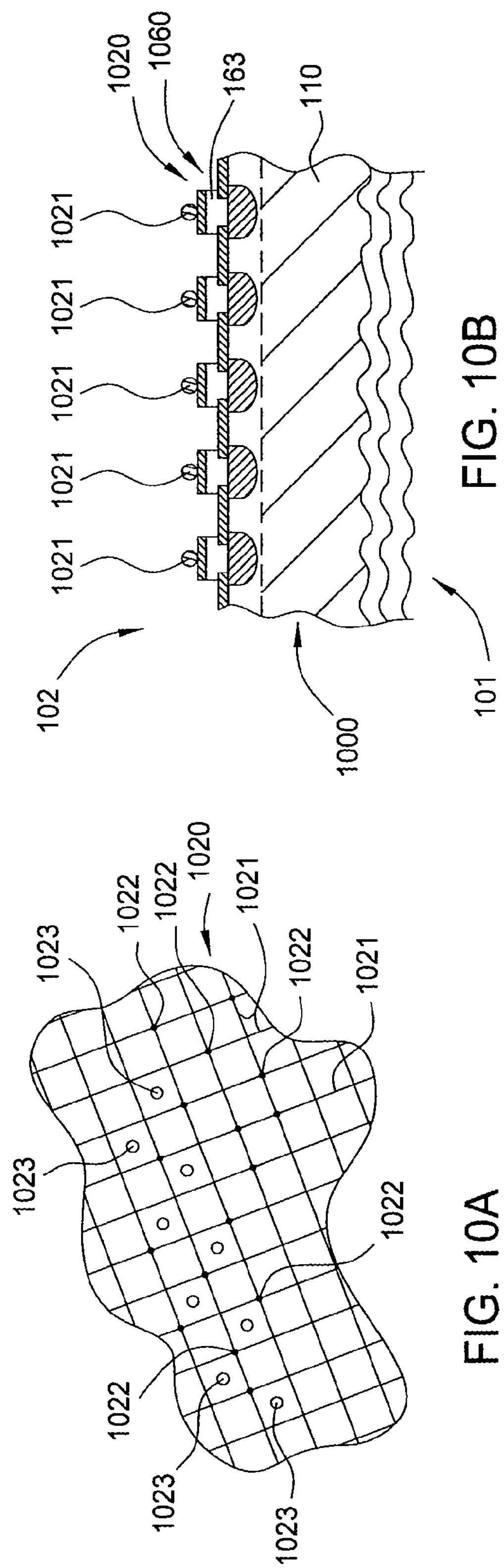
FIG. 10A-10D illustrates an interconnecting structure according to embodiments of the invention.

FIG. 10A-10D illustrate various embodiments of a external interconnect structure 1020 that can be used to inexpensively interconnect portions of a solar cell device 1000 (FIG. 10B) by reducing the time required to form the conductive components in an interconnecting structure 1060 formed on the solar cell device 1000. In one embodiment, the interconnecting structure 1060 is similar to the structures discussed above in conjunction with reference numerals 160, 360, 560 or 760. FIG. 10A is a plan view of an external interconnect structure 1020 that is formed from an array of conductive elements 1021 that are formed in a desired pattern to mate with interconnecting structure 1060 elements of a solar cell device 1000. In one embodiment, the conductive elements 1021 form a wire mesh that is bonded to the surface of the interconnecting structure 1060 to carry the bulk of the current created by a the solar cell device. In general the external interconnect structure 1020 can help to improve substrate throughput in the solar cell formation processing sequence, improve the deposited material utilization, and reduce the intrinsic or extrinsic stress created in the thin solar cell substrates by reducing the required thickness of the deposited conducting layer(s) 163 on the surface of the substrate. The stress induced in a solar cell device by the deposited metal layers can also reduce the device yield.

FIG. 10B is a side cross-sectional view of a external interconnect structure 1020 in which the conductive elements 1021 are configured to contact desired portions of the conducting layer 163 in the interconnecting structure 1060. In one embodiment, the conductive elements 1021 are bonded to the conducting layer 163 using a solder material that is disposed between the conductive elements 1021 and the conducting layer 163. In another embodiment, portions of the conductive elements 1021 are welded to the conductive layer 163 to form a desirable electrical connection. In one case, the conductive elements 1021 are tack welded to the conductive layer 163 at multiple points 1022 (FIG. 10A). In this case it is desirable to form the conductive elements 1021 and the conducting layer 163 from materials that are compatible and/or weldable. In one example, the conductive elements 1021 and the conducting layer 163 are both formed from, or coated with, an aluminum, copper, silver, nickel, tin or zinc material (or alloys thereof) that can be readily laser beam welded together at various points 1022 across the surface of a solar cell device.

Referring to FIG. 10C, in one embodiment, the n-type and p-type regions of the interconnecting structure 1060 are separately connected to two electrically isolated conductive elements 1021A, 1021B. In this case, the isolated conductive elements 1021A is connected to one region of the solar cell device, while the isolated conductive elements 1021B is connected to another region of the solar cell device 1000. In one embodiment, the isolated conductive elements 1021A and isolated conductive elements 1021B are electrically isolated from each other, and from other external devices (not shown), by use of insulating sheets 1024A, 1024B that may be bonded to or affixed to each of the conductive elements 1021A, 1021B. The insulating sheets 1024A, 1024B may be formed from a thin sheet of a polymeric material, such as a polyimide sheet. While FIG. 10C depicts a solar cell device similar to the solar cell device 700 (FIG. 7L), which is used to describe various aspects of the external interconnect structure 1020, this configuration is not intended to be limiting to the scope of the invention described herein.

In one embodiment, the insulating sheets 1024A, 1024B may have a plurality of registering features 1023 (FIGS. 10A and 10C) that are used to align the conductive elements 1021A, 1021B to desired regions of the interconnecting structure 1060. In one embodiment, the registering features 1023 are holes formed in the insulating sheet 1024A that is adapted to mate with dielectric spacers 705 to align the insulating sheet 1024A and conductive element 1021A to desired portions of the conductive layer 163. In this configuration, the insulating sheet 1024B can then be positioned to mate with the conducting material 709 to connect these regions of the interconnecting structure 1060.

FIG. 10D is a side cross-sectional view of two solar cell devices 1000A, 1000B that are connected in series, or in parallel, to each other using the conductive elements 1021A, 1021B. In this case, the interconnection between two or more solar cell devices can be easily made. In one embodiment, a conductive element 1021 that is attached to a junction in one solar cell device 1000A is connected to a junction on an opposing type in a second solar cell device 1000B to form a serial electrical connection between the two solar cells. In one embodiment, as shown in FIG. 10D, the conductive elements 1021A in the solar cell 1000A is connected to the conductive elements 1021B, which is connected to a desired portion of solar cell 1000B.

Exemplary Apparatus and Production Line for Solar Cell Devices Manufacture

Figure 18A:
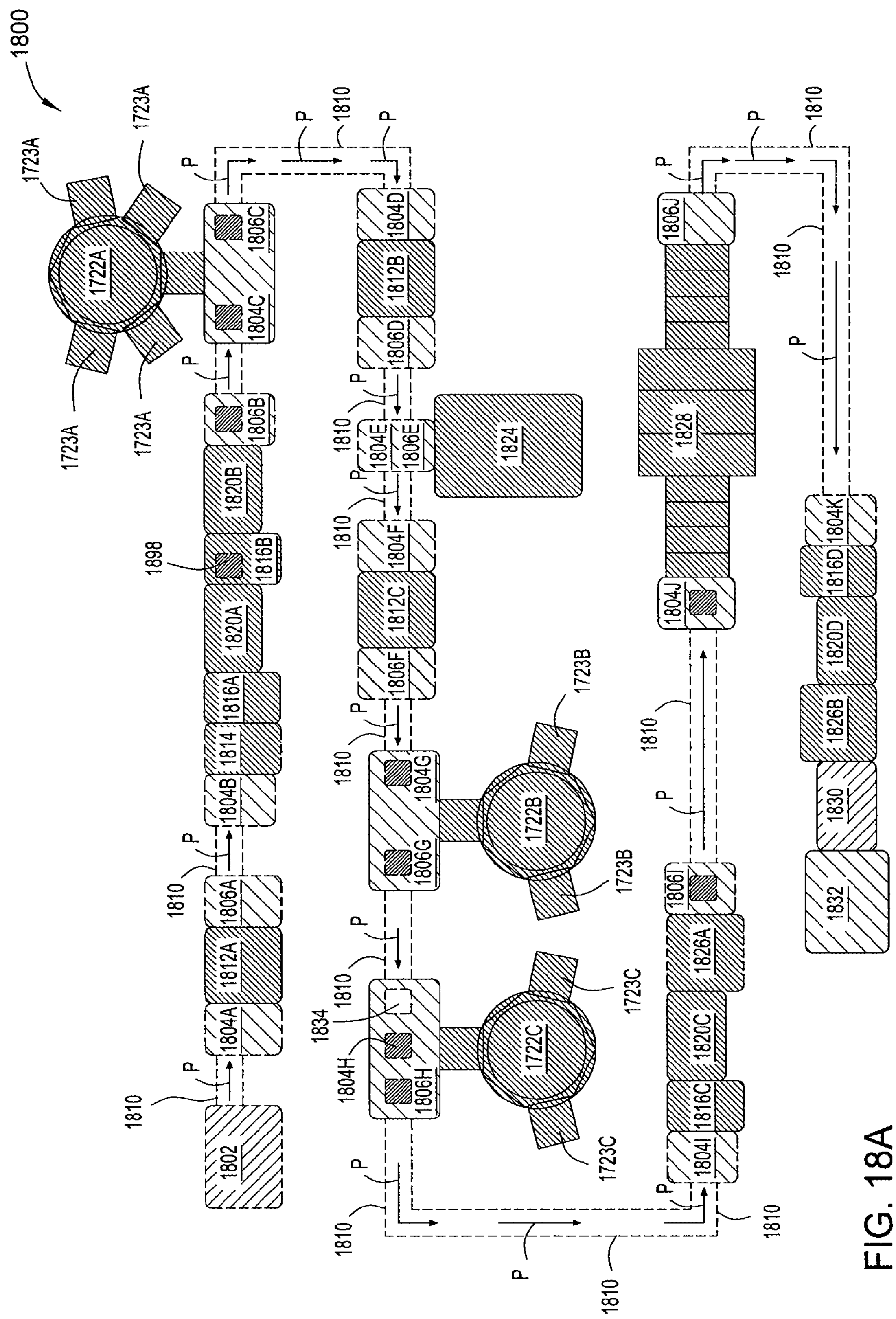
FIG. 18A illustrates a plan view of a solar cell production line according to one embodiment described herein.

FIG. 18A depicts a plan view of a solar cell production line 1800 according to one embodiment of the invention described herein. The production line 1800 includes a substrate tester 1802 that can receive and test substrates to be loaded into the production line 1800 for processing. In one embodiment, the substrate tester 1802 may inspect, test and analyze the substrate to determine if the substrate is in a state ready for processing. After the substrate is inspected or tested in the substrate tester 1802, the substrate is then transferred to a first substrate loader 1804A that is used to receive and orient the substrate so that it is ready for processing into an attached processing chamber. In the exemplary embodiment depicted in FIG. 18A, the first substrate loader 1804A is coupled to a wet processing chamber 1812A to transfer the substrate into the wet processing chamber 1812A to perform a cleaning process, such as the processes described in box 1602. After the cleaning process is performed on the substrate surface, the substrate may be unloaded using a first substrate unloader 1806A that is configured to receive the substrate from the wet cleaning chamber 1812A and transfer the substrate to other processing module(s) disposed along a path "P" of the production line 1800 using a plurality of transfer conveyors 1810, as shown in FIG. 18A. In the embodiment wherein the cleaning process on the substrate is optional, the substrate may be transferred through the first substrate loader 1804A, the first wet processing chamber 1812A, and the first unloader 1806A to a subsequent processing module, such as a second substrate loader 1804B positioned to load a laser scanning/processing tool 1814. Alternatively, the first wet processing chamber 1812A and the first set of substrate loader 1804A and unloader 1806A may be removed from the production line 1800 if a cleaning process is not required at this stage. Exemplary configurations of the substrate loader 1804A and the unloader 1806A are described below with reference to FIG. 20.

Subsequently, the substrate may be transferred to the second substrate loader 1804B to perform different processes as needed on the substrate. The laser scanning/processing tool 1814 may be coupled to the second substrate loader 1804B. The laser scanning/processing tool 1814 provides a laser source that can emit electromagnetic radiation to the substrate surface to create a reference mark on the surface of the substrate so that the referenced mark(s) can be used to determine the precise position of the substrate 110 in a subsequent process. The laser scanning/processing tool 1814 then removes portions of the layers formed on the substrate in a desired pattern as programmed in the tool 1814. In one embodiment, a laser source disposed in the laser scanning/processing tool 1814 may use a Nd:vanadate (Nd:$YVO_4$) source, a infrared (IR) source, or any other suitable laser source having a desired wavelength to inspect, pattern or process the substrate. Following patterning, the patterned surface of the substrate 110 may be inspected by an optional inspection device (not shown) prior to further processing as needed.

After the substrate has been processed in the laser scanning/processing tool 1814 the substrate is then transferred to a first screen printing system 1816A to print or paste desired patterns on the substrate surface. Detail configuration and functions of the screen printing system 1816 are described below with reference to FIGS. 19A-19B. Subsequently, the substrate is transferred to a first drying chamber 1820A to dry out the silk screened pattern formed on the substrate. Detail configurations of the drying chamber 1820 are discussed below with reference to FIG. 19D. In one embodiment, the process performed in the drying chamber 1820A and screen printing system 1816A are integrated together, such as in a SoftLine tool manufactured by Baccini, SpA a division of Applied Materials, Inc. of Santa Clara Calif. Subsequently, the substrate may be further transferred to a second screen printing system 1816B and a second drying chamber 1820B to print and form a desirable pattern on the substrate. The second screen printing system 1816B may include an alignment device 1826 disposed therein to align and detect precise position of the substrate, or previously deposited pattern, so as to provide desired alignment of the screen printed patterns on the substrate. After the second print process is performed in the second screen printing system 1816B, the substrate is transferred to the second drying chamber 1820B to dry out the screen printed patterns formed on the substrate, as similarly configured in the first drying chamber 1820A. It is noted that the number of the screen printing systems 1816A, 1816B and the drying chambers 1820A, 1820B may be varied as needed. After the printing and drying process, the substrate is transferred to the substrate unloader 1806B to be unloaded for further transfer to a subsequent processing module disposed in the production line 1800 for further processing.

The substrate is then transferred to a third substrate loader 1804C that is coupled to a first deposition chamber 1722A disposed in the production line 1800. In one embodiment, the first deposition chamber 1722A may comprise one or more chemical vapor deposition (CVD) chambers, one or more PVD chambers, one or more annealing chambers and/or any other suitable chambers that may be used to deposit layers of material or process the substrate. In one embodiment, the first deposition chamber 1722A is cluster tool having a plurality of plasma enhanced chemical vapor deposition (PECVD) chambers 1723A capable of depositing one or more desired layers on the substrate surface. Suitable plasma enhanced chemical vapor deposition chambers are available from Applied Materials, Inc., located in Santa Clara, Calif. It is contemplated that other deposition chambers, such as hot wire chemical vapor deposition (HWCVD), low pressure chemical vapor deposition (LPCVD), physical vapor deposition (PVD), evaporation, or other similar devices, including those from other manufacturers, may be utilized to practice the present invention. After the desired film layers are formed on the substrate surface, the substrate may be unloaded from the first deposition chamber 1722A through the third substrate unloader 1806C and transferred back to a transfer conveyor 1810 so that it can be transferred to the next process module disposed in the production line 1800.

Subsequently, the substrate is transferred on the transfer conveyor 1810 along the predefined path "P" to a second wet processing chamber 1812B disposed along the production line 1800. The substrate may be loaded into the second wet processing chamber 1812B through the fourth substrate loader 1804D. After performing the desired cleaning process in the second wet processing chamber 1812B, the substrate may be unloaded from the substrate unloader 1806D, as similarly configured in the first substrate loader 1804A, the first wet processing chamber 1812A and the first substrate unloader 1806A described above.

Subsequently, the substrate may be further transferred to a thermal processing chamber 1824 disposed downstream from the second wet processing chamber 1812B in the production line 1800. Similar to the load/unload configurations discussed above, the substrate may be loaded into the thermal processing chamber 1824 through a fifth substrate loader 1804E coupled thereto and unloaded from the thermal processing chamber 1824 through a fifth substrate unloader 1806E. The thermal processing chamber 1824 may be any type of suitable thermal system that can provide heat to the substrate surface at a desired temperature. In one embodiment, the thermal processing chamber 1824 is a heating chamber that can provide heat to a substrate surface at a temperature greater than about 500 degrees Celsius, such as greater than about 700 degrees Celsius, for example greater than about 800 degrees Celsius. The heat provided in the thermal processing chamber 1824 assists driving and diffusing dopant elements previously deposited on the substrate surface (from the patterns and deposition layers provided from the previous screen printing systems 1816A, 1816B, and the deposition chamber 1722A) to a desired depth within the substrate to form doped regions within the substrate, as described in the solar cell manufacturing methods associated with FIGS. 1-17. In one embodiment, the thermal processing chamber 1824 is a rapid thermal processing (RTP) chamber. Alternatively, the thermal processing chamber 1824 may be any type of suitable thermal processing chamber conventionally available in the art.

After the thermal process is performed in the thermal processing chamber 1824, the substrate may then be transferred to a third wet processing chamber 1812C to clean and/or texture the front and/or back surface of the substrate. As described with respect to the first and second wet processing chambers 1812A and 1812B, the substrate may be loaded into the third wet processing chamber 1812C through a sixth substrate loader 1804F and unloaded from the third wet processing chamber 1812C through a sixth substrate unloader 1806F, as described below with respect to FIG. 20. The cleaning process as performed in the third wet processing chamber 1812C may be utilized to clean contaminants, dopant residuals, and other sources of impurities found on the substrate. It has been found that carbon and/or oxygen residual materials that are commonly found in the precursor materials used to form the doped layers (e.g., trimethylboron), dopant paste component materials, and/or other similarly deposited materials, which are left on the surface of the substrate, can adversely affect the electrical performance (e.g., carrier lifetime) of the solar cell device and film quality of subsequently formed layers. Therefore, the cleaning process utilized to perform in the third wet processing chamber 1812C may be configured to specifically clean the oxygen and/or carbon residuals remaining on the substrate surface. Alternatively, other types of the surface contaminants, residuals, or impurities may also be cleaned as needed by utilizing different cleaning solutions. In one embodiment, the cleaning solution used in the third wet processing chamber 1812C may comprise using an ozone ($O_3$) containing gas, vapor, liquid, ozonated water solution, dissolved ozone ($O_3$) supplied from a tank, or other suitable ozone ($O_3$) containing materials to clean both the front and back surface of the substrate. Furthermore, HF-last type cleaning solution or other suitable and cost effective cleaning solutions may be used as well to clean the substrate surfaces.

After the cleaning process performed in the third wet processing chamber 1812C, the substrate is subsequently transferred to a second deposition chamber 1722B to deposit a dielectric layer, such as a passivation layer on a first surface (i.e. front surface) of the substrate. In one embodiment, the substrate may be loaded and unloaded from the second deposition chamber 1722B through a seventh substrate loader 1804G and a seventh substrate unloader 1806G. The second deposition chamber 1722B may be a cluster tool having a plurality of plasma enhanced chemical vapor deposition (PECVD) chambers capable of depositing one or more desired layers on the substrate surface. One suitable plasma enhanced chemical vapor deposition chamber is available from Applied Materials, Inc., located in Santa Clara, Calif. It is contemplated that other deposition chambers, such as hot wire chemical vapor deposition (HWCVD), low pressure chemical vapor deposition (LPCVD), physical vapor deposition (PVD), evaporation, or other similar devices, including those from other manufacturers, may be utilized to practice the present invention.

After the desired film layer is formed on a first surface of the substrate, the substrate is then transferred to a third deposition chamber 1722C disposed downstream from the second deposition chamber 1722B along the production line 1800. The third deposition chamber 1722C may be similar to or the same as the first and the second deposition chambers 1722A, 1722B, described above. Prior to the deposition process performed in the third deposition chamber 1722C, the substrate may be flipped to allow the deposition process to perform on a second surface of the substrate (i.e., a rear surface). The substrate may be flipped by a flip mechanism 1834 disposed near an eighth substrate loader 1804H and unloader 1806H in the production line 1800. The substrate may be flipped to deposit a rear passivation layer on the second surface of the substrate. It is noted that the order of the second deposition chamber 1722B and the third deposition chamber 1722C may be reversed or rearranged in any order as the film layers formed on the first or the second surface of the substrate may be deposited in any order as needed. In one embodiment, the third deposition chamber 1722C is a cluster tool having a plurality of plasma enhanced chemical vapor deposition (PECVD) chambers 1723C capable of depositing one or more desired layers on the substrate surface, as discussed above with respect to the first and the second deposition chambers 1722A, 1722B. Accordingly, other deposition chambers, such as hot wire chemical vapor deposition (HWCVD), low pressure chemical vapor deposition (LPCVD), physical vapor deposition (PVD), evaporation, or other similar devices, including those from other manufacturers, may be utilized to practice the present invention as well.

After the passivation layers are formed on the first and the second surface of the substrate, the substrate is then transferred back to a transfer conveyor 1810 disposed in the production line 1800. The transfer conveyor 1810 then carries the substrate to the next module for processing. The substrate may then be transferred to a ninth substrate loader 18041 for loading into a third screen printing system 1816C to conduct a printing process. In this particular configuration, the printing material, ink, gel, or paste used in this step may be configured to be an etchant material that can be printed or disposed on the substrate surface. After depositing the etchant material in a desired pattern on the substrate surface, the substrate is then transferred to and heated in a third drying chamber 1820C disposed downstream from the third screen printing system 1816C. The substrate may be heated to a temperature of between about 200-300° C. in the third drying chamber 1820C to direct the chemicals in the etchant material to etch the film layers on the substrate surface to form desired patterns thereon. In one embodiment, the etching material and etching process steps as performed in the third screen printing system 1816C and the drying chamber 1820C are similar to the process steps discussed above with referenced to FIGS. 1-17. After the printing and the drying process performed in the screen printing system 1816C and the drying chamber 1820C, an optional rinse process may be performed in a rinse tool 1826A disposed downstream from the drying chamber 1820C along the production line 1800.

After the substrate is unloaded from a ninth substrate unloader 18061, the substrate is then transferred to a metal deposition chamber 1828 to form a conducting layer on the surface of the substrate. The substrate may be loaded and unloaded from the metal deposition chamber 1828 through the tenth substrate loader 1804J and the tenth substrate unloader 1806J. The metal deposition chamber 1828 may be an ATON™ PVD 5.7 tool available from Applied Materials in Santa Clara, Calif. in which one or more processing steps are performed to deposit the conducting layers on the surfaces the substrate, as discussed above.

After the conducting layer is formed on the substrate surfaces in the metal deposition chamber 1828, the substrate is then transferred to a final set of a screen printing system 1816D and a drying chamber 1820D (the fourth set shown in FIG. 18A) to do the final metal print process on the substrate surface. Materials may then be pasted on the substrate surfaces to form desired features and structures on the substrate surfaces to complete the solar cell devices manufacture process. The screen printing process and the drying process performed in the screen printing system 1816D and the drying chamber 1820D are configured similarly to the first, second, and third screen printing systems (1816A-1816C) and drying chambers (1820A-1820C) discussed above. After the printing and drying processes, the substrate may be transferred to a second rinse tool 1826B disposed next to the drying chamber 1820D to rinse the substrate surface, if necessary.

After the processes have been completed and performed on the substrate, the substrate may be transferred to a cell tester 1830 and a cell sorter 1832 to perform the final test and inspection process to complete the solar cell device manufacturing process. The substrate may be tested and analyzed on various regions of solar cell devices formed on the substrate in an automated fashion. After the test and analysis process are performed and completed, the substrate may be removed from the production line 1800.

In one exemplary embodiment, the method of forming the solar cell devices formed on the substrate depicted in FIGS. 17A-17I may utilize the production line 1800 depicted in FIG. 18A. As discussed above, after the substrate is transferred to the production line 1800, a cleaning and/or texturing process may be performed on the substrate in the first wet cleaning chamber 1812A. After the cleaning process, the first dopant material 1329 (FIG. 17B) may be formed in the first screen printing system 1816A and/or the second screen printing system 1816B and then dried in the first or the second drying chamber 1820A, 1820B. Subsequently, the substrate may be transferred to the first deposition chamber 1722A to form the doped layer 1330 and the capping layer 1331 (FIG. 17C) in the first deposition chamber 1722A (FIG. 18A). After deposition of the doped layer 1330 and the capping layer 1331 on the substrate surface, an optional cleaning process may be performed in the second wet processing chamber 1812B (FIG. 18A) to clean the substrate surfaces. After the optional cleaning process, the substrate is then transferred into the thermal system 1824 (FIG. 18A) to heat the substrate. The heat transmitted to the substrate surface diffuses and drives the dopants in the first dopant material 1329 and the doped layer 1330 into the substrate surface (FIG. 17D). After the thermal process is performed in the thermal system 1824, a wet cleaning process is performed on the substrate surface in the third wet cleaning chamber 1812C (FIG. 18A) and the upper doped layer 1330 and the capping layer 1331 may be removed as needed (FIG. 17E). While removing the upper doped layer 1330 and the capping layer 1331, the back surface of the substrate may be textured as needed. Subsequently, the substrate may be transferred to the second deposition chamber 1722B (FIG. 18A) and the third deposition chamber 1722C (FIG. 18A) to deposit a front surface passivation/anti-reflective layer 1332 and/or a rear surface passivation/anti-reflective layer 154 on the surfaces of the substrate (FIGS. 17E and 17F). Subsequently, the substrate may be further transferred to anther set of screen printing system 1816C and the drying chamber 1820C (FIG. 18A) to form features, etch structures and print patterns to form desired devices on the substrate surface (FIG. 17G). After the printing and/or gel etching process, the substrate is then transferred to the metal deposition chamber 1828 (FIG. 18A) to form the conducting layer 163 (FIG. 17H) on the substrate surface. In a final step, after formation of the conducting layer 163 formed on the substrate surface, the substrate may be further transferred to a final set of screening printing system 1816D and the drying chamber 1820D (FIG. 18A) to form, print and etch structures, features and patterns on the conducting layer 161 (FIG. 17I) as needed to form the solar cell devices. After all the processes have been performed on the substrate surface, the substrate may be final tested and sorted in the cell tester 1830 and cell sorter 1832 (FIG. 18A).

Figure 18B:
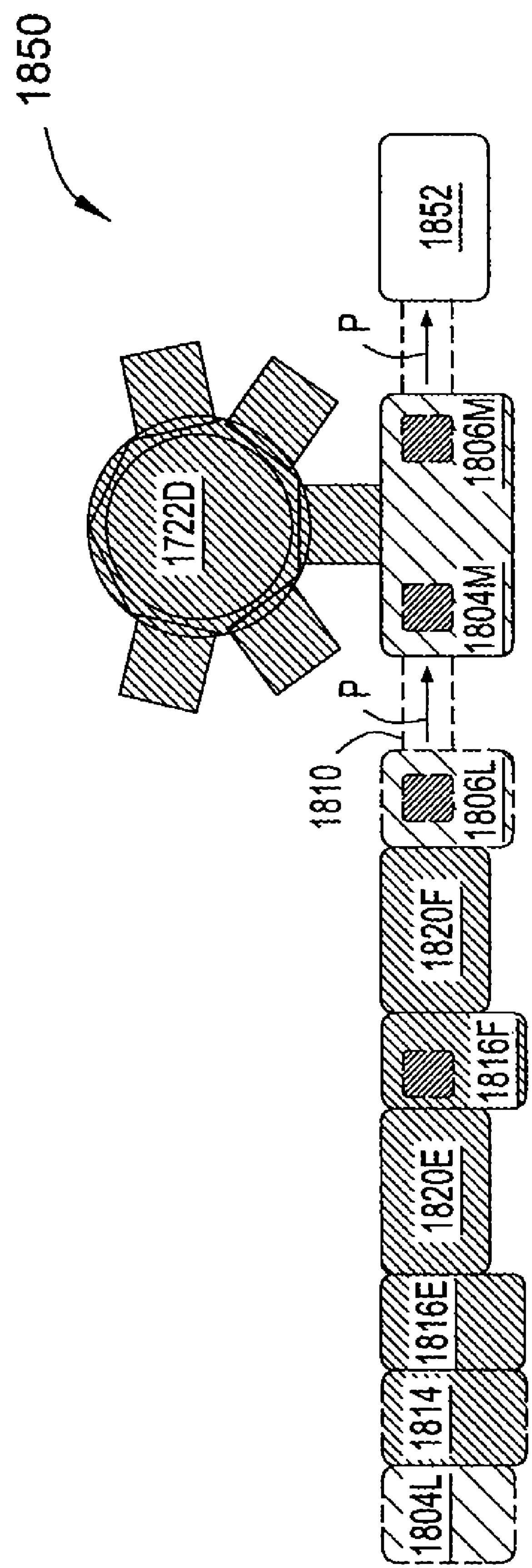
FIG. 18B illustrates a plan view of a solar cell production line according to another embodiment described herein.

FIG. 18B depicts another embodiment of a solar cell production line 1850 that may be utilized to form solar cells discussed above with referenced to FIGS. 1-17. Similar to the configurations discussed in FIG. 18A, the production line 1850 includes a substrate loader 1804L, a laser scanning/processing tool 1814, a first set of screen printing system 1816E and a drying chamber 1820E and a second set of screen printing tool 1816F and a drying chamber 1820F to form desired patterns, features, layouts, and structures on the substrate surface. After the desired patterns are formed on the substrate surface, the substrate may be then unloaded via the substrate unloader 1806L and further transferred by way of a transfer conveyor 1810 to a deposition chamber 1722D for film deposition, as similarly configured in FIG. 18A. The production line 1850 may include a substrate loader 1804M and a substrate unloader 1806M for loading substrates into and unloading substrates from the deposition chamber 1722D. After the desired film layer is formed on the substrate, the substrate may be then transferred to any suitable modules 1852 disposed along the production line 1850. The modules 1852 may include any numbers of screen printing tool and drying chamber, deposition chambers, such as CVD, PVD, plating, or any other suitable chambers, wet processing chambers, laser tools, rinse tank, tester, sorters, heating system, polishing tool, or any other suitable processing tool formed in any configurations and in any sequences disposed along the production line 1850 to form desired solar cell devices on the substrate surface.

Figure 19A:
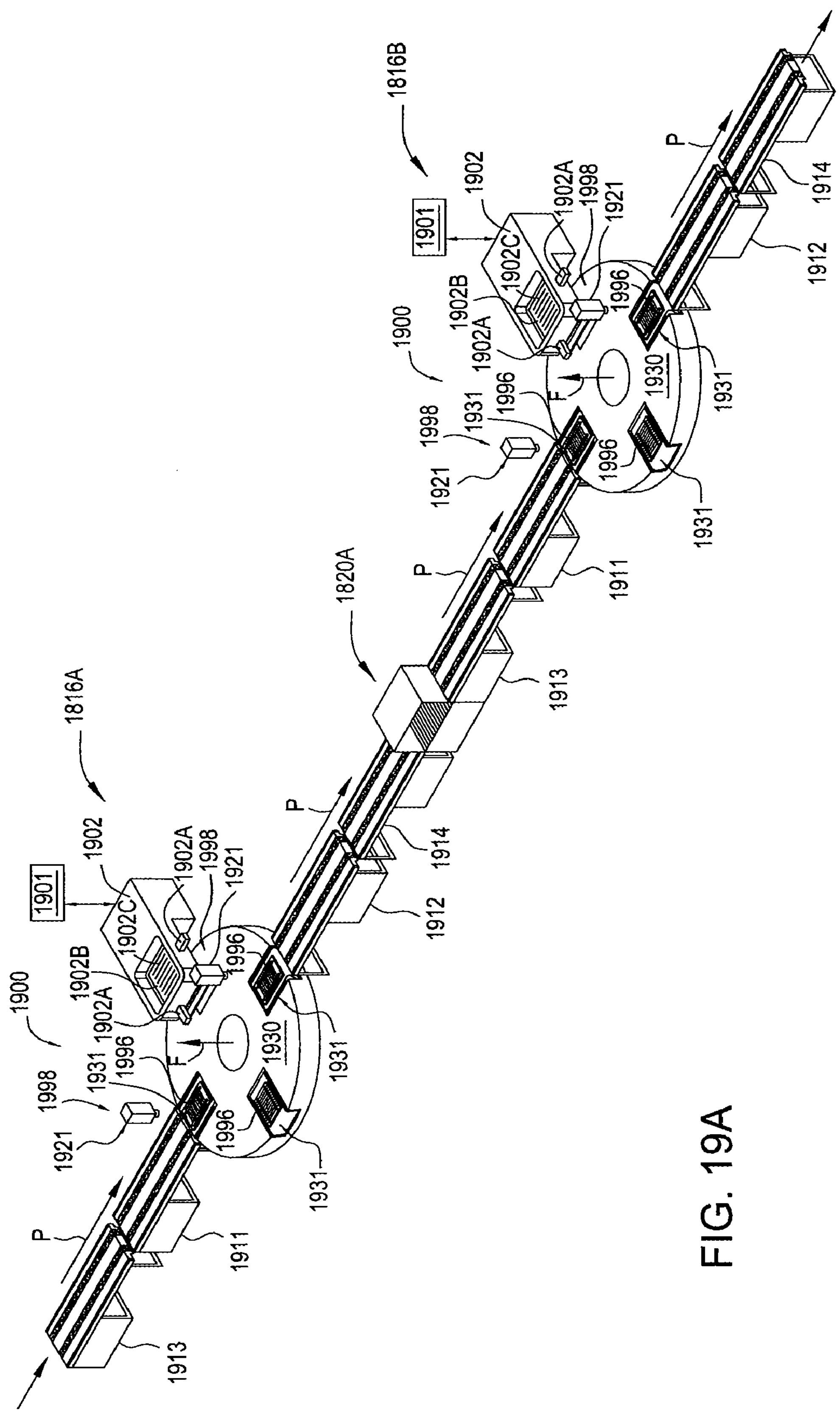
FIG. 19A is a schematic isometric view of a system that may be used in conjunction with embodiments of the present invention to form multiple layers of a desired pattern.
Figure 19B:
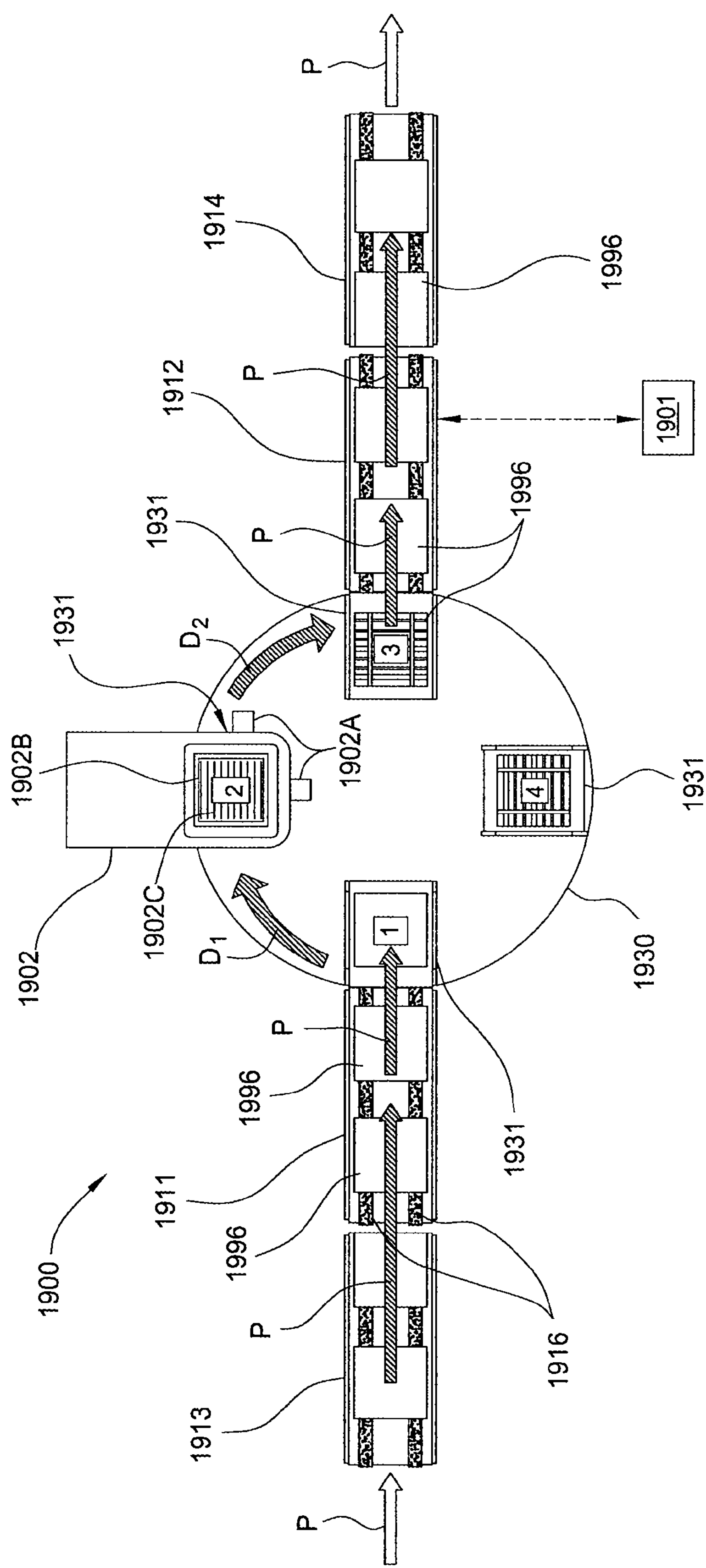
FIG. 19B is a schematic top plan view of the system in FIG. 17A according to one embodiment of the invention.

FIG. 19A is a schematic isometric view and FIG. 19B is a schematic plan view illustrating one embodiment of a screen printing system, or system 1900, that may be used in conjunction with embodiments of the present invention to form the metal contacts in a desired pattern on a surface of a solar cell substrate 1996. In one embodiment, the system 1900 comprises an incoming conveyor 1911, such as a portion of the transfer conveyor 1810 depicted in FIG. 18A, a rotary actuator assembly 1930, a screen print chamber 1902, and an outgoing conveyor 1912, such as another portion of the transfer conveyor 1810 depicted in FIG. 18A. The incoming conveyor 1911 may be configured to receive a substrate 1996 from an input device, such as an input conveyor 1913 (i.e., path "P" in FIG. 19B), and transfer the substrate 1996 to a printing nest 1931 coupled to the rotary actuator assembly 1930. The outgoing conveyor 1912 may be configured to receive a processed substrate 1996 from a printing nest 1931 coupled to the rotary actuator assembly 1930 and transfer the substrate 1996 to a substrate removal device, such as an exit conveyor 1914 (i.e., path "P" in FIG. 19B). The input conveyor 1913 and the exit conveyor 1914 may be automated substrate handling devices that are part of a larger production line, such as transfer conveyors 1810 from the production line 1800. A plurality of screen printing systems 1900, such as systems 1816A and 1816B from FIG. 18A, may be connected to each other by a drying chamber 1820A disposed therebetween. It is noted that FIG. 19A only depicts a portion of the production line depicted in FIG. 18A for brevity of description. Other different types of screen printing system, deposition tool, drying chambers or any suitable chambers, stations, and tools may also be disposed to be part of the system 1900 as needed.

The rotary actuator assembly 1930 may be rotated and angularly positioned about the "F" axis by a rotary actuator (not shown) and a system controller 1901, such that the printing nests 1931 may be selectively angularly positioned within the system 1900 (e.g., paths "$D_1$" and "$D_2$" in FIG. 19B). The rotary actuator assembly 1930 may also have one or more supporting components to facilitate the control of the print nests 1931 or other automated devices used to perform a substrate processing sequence in the system 1900.

In one embodiment, the rotary actuator assembly 1930 includes four printing nests 1931, or substrate supports, that are each adapted to support a substrate 1996 during the screen printing process performed within the screen print chamber 1902. FIG. 19B schematically illustrates the position of the rotary actuator assembly 1930 in which one printing nest 1931 is in position "1" to receive a substrate 1996 from the incoming conveyor 1911, another printing nest 1931 is in position "2" within the screen print chamber 1902 so that another substrate 1996 can receive a screen printed pattern on a surface thereof, another printing nest 1931 is in position "3"

for transferring a processed substrate 1996 to the outgoing conveyor 1912, and another printing nest 1931 is in position "4", which is an intermediate stage between position "1" and position "3".

Figure 19C:
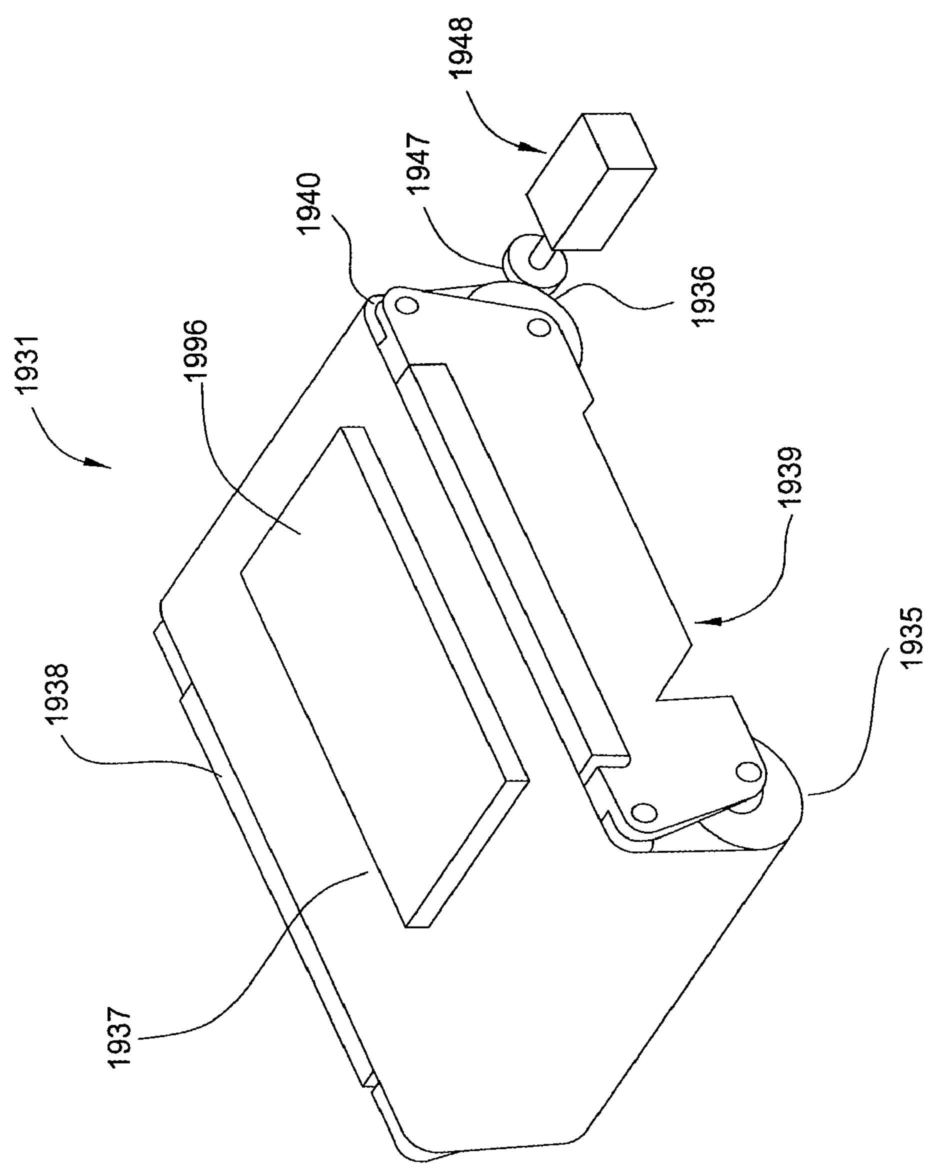
FIG. 19C is an isometric view of a printing nest portion of the screen printing system according to one embodiment of the invention.

As illustrated in FIG. 19C, a printing nest 1931 generally comprises a conveyor assembly 1939 that has a feed spool 1935, a take-up spool 1936, rollers 1940 and one or more actuators 1948, which are coupled to the feed spool 1935 and/or take-up spool 1936, and are adapted to feed and retain a supporting material 1937 positioned across a platen 1938. The platen 1938 generally has a substrate supporting surface on which the substrate 1996 and supporting material 1937 are positioned during the screen printing process performed in the screen print chamber 1902. In one embodiment, the supporting material 1937 is a porous material that allows a substrate 1996, which is disposed on one side of the supporting material 1937, to be retained on the platen 1938 by a vacuum applied to the opposing side of the supporting material 1937 by a conventional vacuum generating device (e.g., vacuum pump, vacuum ejector). In one embodiment, a vacuum is applied to vacuum ports (not shown) formed in the substrate supporting surface 1938A of the platen 1938 so that the substrate can be "chucked" to the substrate supporting surface 1938A of the platen. In one embodiment, the supporting material 1937 is a transpirable material that consists, for instance, of a transpirable paper of the type used for cigarettes or another analogous material, such as a plastic or textile material that performs the same function. In one example, the supporting material 1937 is a cigarette paper that does not contain benzene lines.

In one configuration, the actuators 1948 are coupled to, or are adapted to engage with, the feed spool 1935 and a take-up spool 1936 so that the movement of a substrate 1996 positioned on the supporting material 1937 can be accurately controlled within the printing nest 1931. In one embodiment, feed spool 1935 and the take-up spool 1936 are each adapted to receive opposing ends of a length of the supporting material 1937. In one embodiment, the actuators 1948 each contain one or more drive wheels 1947 that are coupled to, or in contact with, the surface of the supporting material 1937 positioned on the feed spool 1935 and/or the take-up spool 1936 to control the motion and position of the supporting material 1937 across the platen 1938.

In one embodiment, the system 1900 includes an inspection assembly 1998 adapted to inspect a substrate 1996 located on the printing nest 1931 in position "1". The inspection assembly 1998 may include one or more cameras 1921 positioned to inspect an incoming, or processed substrate 1996, located on the printing nest 1931 in position "1" (FIG. 19B). In this configuration, the inspection assembly 1998 includes at least one camera 1921 (e.g., CCD camera) and other electronic components capable of inspecting and communicating the inspection results to the system controller 1901 used to analyze the orientation and position of the substrate 1996 on the printing nest 1931. In one embodiment, the inspection assembly 1998 is configured to analyze the orientation and position of a pattern previously printed on the substrate 1996. In another embodiment, the inspection assembly 1998 comprises the optical inspection system.

The screen print chamber 1902 is adapted to deposit material in a desired pattern on the surface of the substrate 1996 positioned on the printing nest 1931 in position "2" during the screen printing process. In one embodiment, the screen print chamber 1902 includes a plurality of actuators, for example, actuators 1902A (e.g., stepper motors or servomotors) that are in communication with the system controller 1901 and are used to adjust the position and/or angular orientation of a screen printing mask 1902B (FIG. 19B) disposed within the screen print chamber 1902 with respect to the substrate 1996 being printed. In one embodiment, the screen printing mask 1902B is a metal sheet or plate with a plurality of features 1902C (FIG. 19B), such as holes, slots, or other apertures, formed therethrough to define a pattern and placement of screen printed material (i.e., ink or paste) on a surface of a substrate 1996. In general, the screen printed pattern that is to be deposited on the surface of a substrate 1996 is aligned to the substrate 1996 in an automated fashion by orienting the screen printing mask 1902B in a desired position over the substrate surface using the actuators 1902A and information received by the system controller 1901 from the inspection assembly 1998. In one embodiment, the screen print chamber 1902 are adapted to deposit a metal containing or dielectric containing material on a solar cell substrate having a width between about 125 mm and 156 mm and a length between about 70 mm and 156 mm. In one embodiment, the screen print chamber 1902 is adapted to deposit a metal containing paste on the surface of the substrate to form the metal contact structure on a surface of a substrate. In one embodiment, the screen print chamber 1902 may be used to deposit etchant materials, dopant materials, dielectric materials, and/or metal materials as described with referenced to FIGS. 1-17.

The system controller 1901 facilitates the control and automation of the screen printing system 1900 and may include a central processing unit (CPU) (not shown), memory (not shown), and support circuits (or I/O) (not shown). The CPU may be one of any form of computer processors that are used in industrial settings for controlling various chamber processes and hardware (e.g., conveyors, optical inspection assemblies, motors, fluid delivery hardware, etc.) and monitor the system and chamber processes (e.g., substrate position, process time, detector signal, etc.). The memory is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits are also connected to the CPU for supporting the processor in a conventional manner. The support circuits may include cache, power supplies, clock circuits, input/output circuitry, subsystems, and the like. A program (or computer instructions) readable by the system controller 1901 determines which tasks are performable on a substrate. Preferably, the program is software readable by the system controller 1901, which includes code to generate and store at least substrate positional information, the sequence of movement of the various controlled components, substrate optical inspection system information, and any combination thereof. In one embodiment of the present invention, the system controller 1901 includes pattern recognition software to resolve the positions of the heavily doped regions and/or alignment marks.

Figure 19D:
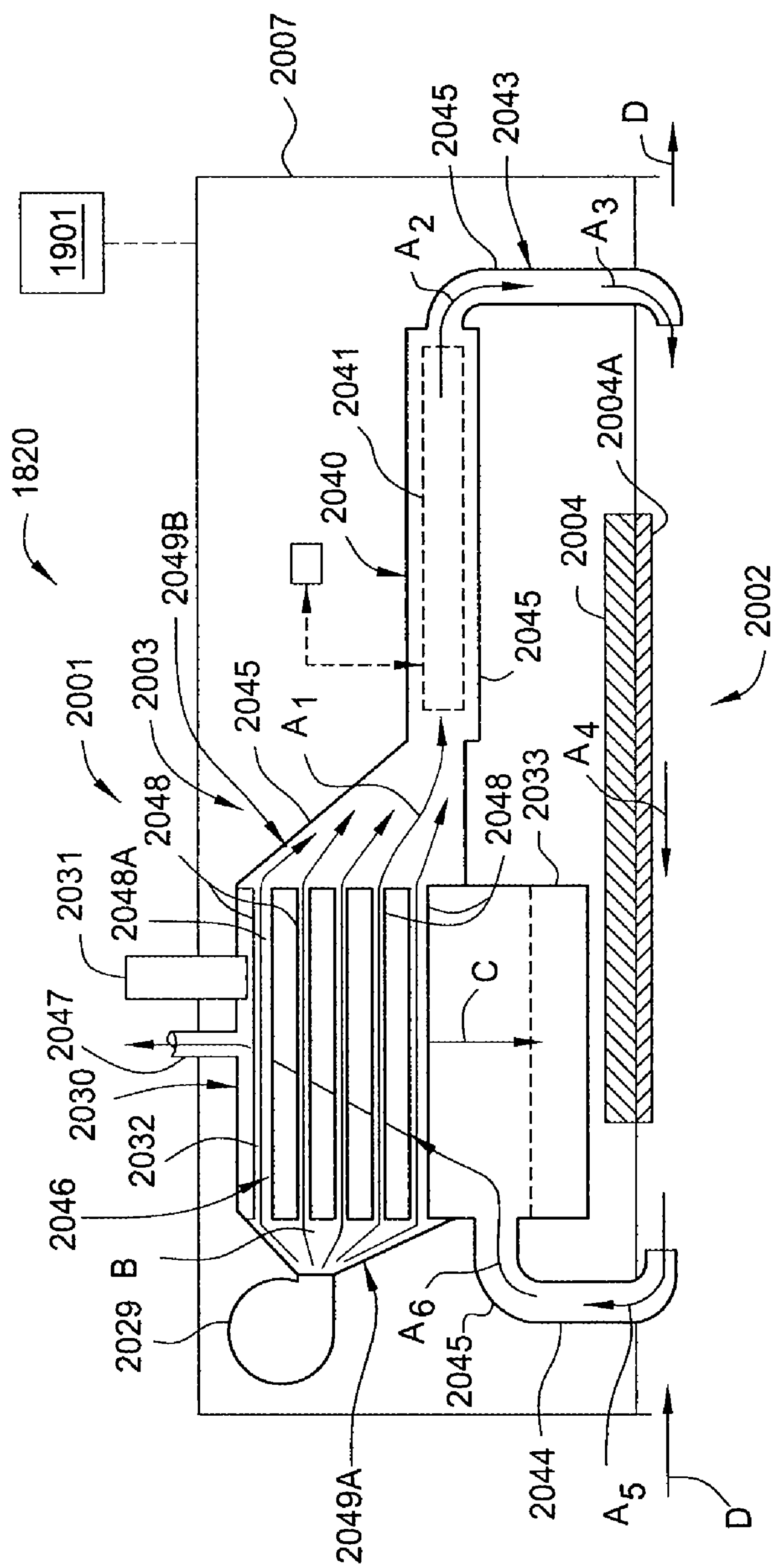
FIG. 19D is one embodiment of a side cross-sectional view of a drying chamber disposed in the system of FIG. 19A.

FIG. 19D generally illustrates one embodiment of a thermal system 2001 contained in a drying chamber 1820 (shown as 1820A-1820E in FIGS. 18A-18B and FIG. 19A) that may be disposed between print systems 1816A, 1816B. In general, the drying chamber 1820 contains a processing region 2002 in which energy is delivered from the thermal system 2001 to one or more substrates positioned therein, so that the material deposited on a surface of the one or more substrates can be dried. In one example, the deposited material is an aluminum (Al) containing paste, such as a lead free aluminum cermet paste (e.g., Al Cermet 6214) that are commonly used in solar cell production processes to form the backside contacts on a crystalline solar cell substrate. In another example, the deposited material may be a silver (Ag) paste used on the front side of a solar cell (e.g., PV 156 made by DuPont™) or a silver-aluminum (Ag/Al) paste (PV202 from DuPont™) used on the back side of a solar cell.

The thermal system 2001 generally comprises a radiant heating assembly 2004 and a convective heating assembly 2003 that are used together to rapidly dry the material deposited on the surface of the substrate. In this configuration, convective and radiant heat transfer modes can be separately controlled to achieve a desired thermal profile (e.g., temperature versus time) during the drying process to improve throughput and reduce energy consumption. In one embodiment, the substrate temperature during the drying process is raised to between about 150° C. and about 300° C. In general, it is desirable not to exceed the temperature at which the binders in the deposited material break down (e.g., 300-350° C.) to prevent damage to the formed pattern on the substrate.

In one configuration, as shown in FIG. 19D, one or more substrates are transferred through the processing region 2002 following path "D." The radiant heating assembly 2004 generally contains one or more electromagnetic energy delivering devices that are used to provide energy to the substrates as they pass through the processing region 2002. In one embodiment, the electromagnetic energy delivering device comprises one or more lamps 2004A that are adapted to and/or selected to deliver radiation at one or more desirable wavelengths to the substrate. The wavelength(s) of the radiant energy delivered from the radiant heating assembly 2004 is generally selected so that it is absorbed by the material deposited on the surface of the substrate. However, in cases where the thermal budget of the processed substrate is an issue, such as semiconductor substrates, solar cells, or other similar devices, it may be desirable to limit the wavelengths of the radiant energy delivered to substrate so that the radiant energy is preferentially absorbed by the deposited material and generally not by the material from which the substrate is made. In one example, in cases where the substrate is made from a silicon (Si) containing material the wavelength of the energy delivered by the lamps 2004A may be adjusted or filtered so that only wavelengths greater than the absorption edge of silicon, which is generally about 1.06 (μm), are delivered to reduce the amount of energy absorbed by the silicon substrate.

In one embodiment, the optimal wavelengths delivered by the radiant heating assembly 2004 are selected and/or adjusted for each type of substrate and each type of material deposited on a surface of the substrate to improve the absorption of the delivered energy, and thus the drying process of the deposited material. In one embodiment, the lamps 2004A are infrared (IR) lamps that have a maximum operating temperature between about 1200 and 1800° C. and have a maximum power emission at wavelengths greater than about 1.4 μm. In one example, the lamps 2004A are a double filament 5 kW fast medium wave IR lamp that is about 1 meter long, which is available from Heraeus Nobelight GmbH of Hanau, Germany. In some cases it is desirable to adjust the wavelength(s) of the emitted radiation from the lamps 2004A by adjusting the power delivered to the lamps and thus the temperature of the filament within the lamp (e.g., Wien's law). Therefore, by use of the system controller 1901, a power supply (not shown) coupled to the lamps 2004A, and knowledge of the optical absorption characteristics of the deposited material on the surface of the substrate, the wavelengths of the delivered energy by the lamps 2004A can be adjusted to improve the drying process.

The convective heating assembly 2003 generally comprises a fluid transferring device 2029, a plenum 2045 and a gas heating assembly 2040. A substrate disposed in the processing region 2002 is thus heated by directing the gas provided from the fluid transferring device 2029 through the heating assembly 2040 and past a surface of the substrate. In one embodiment, the fluid transferring device 2029 is an AC fan that can deliver a desired flow rate of gas (see path "B") through the radiant heating assembly 1804 and into the processing region 2002.

The gas heating assembly 2040 generally contains one or more resistive heating elements positioned in a heated zone 2041 that is adapted to heat the gas delivered from the fluid transferring device 2029. The temperature of the gas exiting the gas heating assembly 2040 may be controlled by use of a conventional heating element temperature controller 12042, one or more conventional temperature sensing devices (not shown), resistive heating elements (not shown) positioned in the heating zone 2041, and commands sent from the system controller 1901. In one embodiment, the gas temperature at the exit of the gas heating assembly 2040 is controlled to between about 150° C. and about 300° C.

The plenum 2045 is generally an enclosed region that is used to direct the gas delivered from fluid transferring device 2029 through the gas heating assembly 2040, into the plenum exit section 2043 and then through the processing region 2002. In one embodiment, the plenum 2045 may also contain a plenum inlet section 2044 that is adapted to receive the gas transferred through the processing region 2002 to provide a gas return, or re-circulation path, so that heated gas, such as air, can be collected and reused.

In an alternate embodiment of the convective heating assembly 2003, as shown in FIG. 19D, the gas returning from the processing region 2002 (i.e., paths $A_5$ and $A_6$) is not recirculated. In this configuration, the gas exiting the fluid transferring device 2029 (e.g., path "B") enters an inlet plenum 2049A passes through a plurality of heat exchanging tubes 2048 and enters the exit plenum 2049B before it is delivered through the gas heating assembly 2040 and processing region 2002. The heat exchanging tubes 2048 are generally sealed so that the gas following along path "B" passes through an internal region 2048A of the tube and does not mix with the gas returning from the processing region 2002. In one configuration, the gas returning from the processing region 2002 along paths $A_5$ and $A_6$ passes by the external surfaces of the heat exchanging tubes 2048 before it is exhausted from the thermal system 2001 through a port 2047. Therefore, by controlling the temperature of the heat exchanging tubes 2048 using the thermal controller 2031, the temperature of the gas flowing from the fluid transferring device 2029 to the gas heating assembly 2040 can be preheated, and the gas returning from the processing region 2002 can be cooled to remove any entrained volatile components. Preheating the gas before it enters the gas heating assembly 2040 may also help improve the gas heating efficiency and thus reduce the power consumption of the drying process performed in the drying chamber. In general, the thermal controller 2031 is adapted to keep the temperature of the surfaces of the heat exchanging tubes 2048 (i.e., heat exchanging surfaces 2032) at a temperature below the temperature of the heated gas delivered to the processing region 2002 (e.g., <219° C.) to condense and remove any volatile components contained in the gas flowing along path $A_6$. In one embodiment, the heat exchanging surfaces 2032 are maintained at a temperature between about 40° C. and about 80° C. to condense the vapor material entrained in the recirculated gas. Due to gravity the volatile components that condense on the heat exchanging tubes 2048 will flow to (i.e., path "C") and be collected within a fluid collection region 2033 of the plenum 2045. The fluid collection region 2033 may contain one or more drains that are used to deliver the collected vapor material to a waste collection system (not shown). Since energy consumption is often an important factor in the cost to produce a solar cell device, the methods of preheating and/or recirculating the gas discussed herein can help reduce the cost of ownership of a screen printing production line and thus the formed device's production cost.

Figure 20:
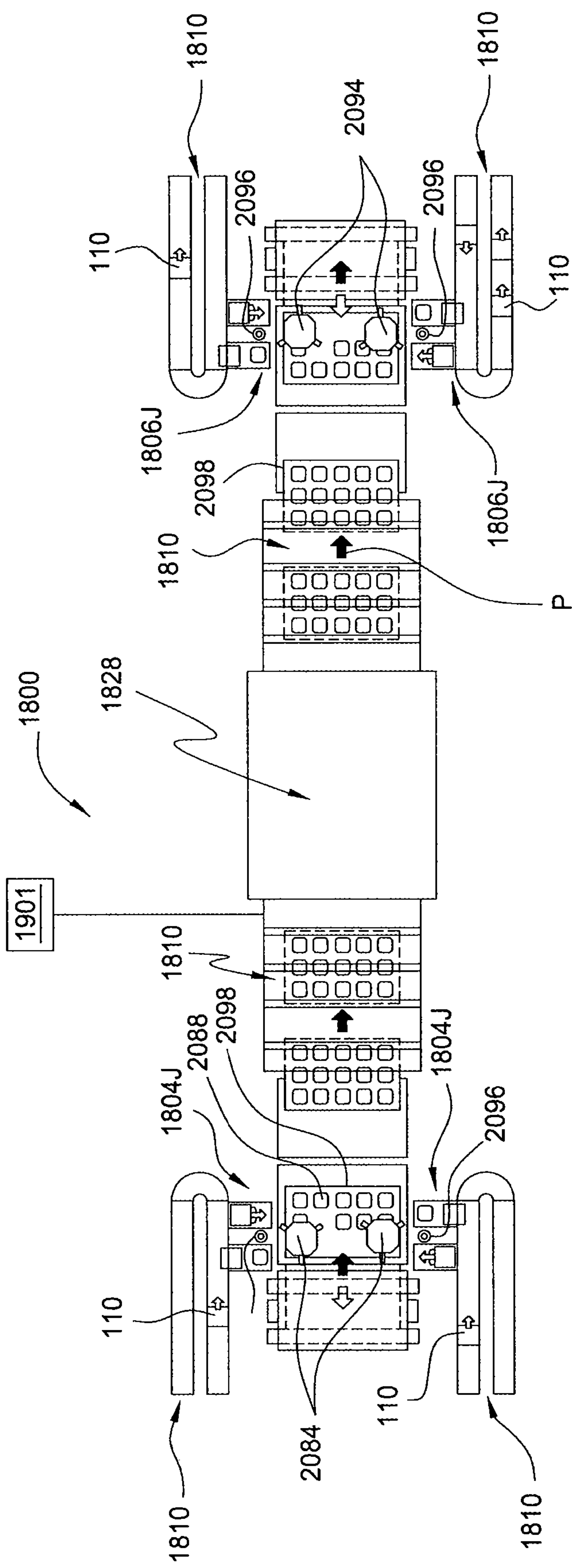
FIG. 20 is a schematic plan view of an apparatus for performing a process sequence according to one embodiment of the present invention depicted in FIG. 18.

FIG. 20 is a schematic plan view of a portion of the solar cell production line 1800 depicted in FIG. 18A including the metal deposition chamber 1828 disposed between the substrate loader 1804J and the substrate unloader 1806J. The metal deposition chamber 1828 is coupled to the substrate loader 1804J and the substrate unloader 1806J by a transport conveyor 1810. Other substrate loaders 1804A-1804L or substrate unloader 1806A-1806L depicted in FIGS. 18A-18B may be similarly configured. In one embodiment, substrates 110 may be transported into a substrate loader 1804J via the incoming transfer conveyor 1810. The substrate loader 1804J serves as a receiving region that can receive substrate 110 to be manufactured and form solar cell devices in the production line 1800. In one embodiment, the substrates 110 are individually transported on the transporting conveyor 1810. In another embodiment, the substrates 110 are transported in cassettes. In another embodiment, the substrates 110 are transported in stack boxes. In one embodiment, once each individual substrate 110 is delivered into the substrate loader 1804J, a transfer robot 2084 retrieves each substrate 110 from the substrate loader 1804J and holds the substrate 110 over an optional vision system 2096 to inspect the substrate prior to processing the substrate 110. The optional vision system 2096 may provide back lighting for an inspection device disposed in the vision system 2096 to capture images of the substrate 110 and communicate those images to the system controller 1901 to determine if the substrate 110 is in a state ready for processing. In one embodiment, the vision system 2096 is positioned to capture images of the substrate 110 prior to pick up by the transfer robot 2084.

The robot 2084 then places the substrate 110 into a specified feature 2088 on a substrate transport surface 2098. In one embodiment, the features 2088 are pockets and the substrate transport surface 2098 is a substrate carrier. In another embodiment, the features 2088 are support elements and the substrate transport surface 2098 comprises a plurality of lateral arms on a substrate handling robot. In another embodiment, the features 2088 are support elements or pockets, and the substrate transport surface 2098 is a platform portion of the transfer conveyor 1810, such as an upper surface of the substrate conveyor. After each of the features 2088 of the substrate transport surface 2098 are filled with substrates 110, the substrates 110 are transported into the metal deposition chamber 1828, or other types of deposition chambers, such as a PVD chamber, a CVD chamber, a screen printing system, or an evaporation chamber, disposed along the solar cell production line 1800 via the transport conveyor 1810. In one embodiment, the transport conveyor 1810 comprises rollers (not shown) and actuators (not shown) for linearly moving the substrates 110 on the substrate transport surface 2098.

After processing in the metal deposition chamber 1828, the substrate 110 is then transferred to the substrate unloader 1806A, where it may then be unloaded onto a transfer conveyor 1810 via a transfer robot 2094 and transported away from the wet processing chamber 1812A to other processing modules and chambers for further processing in the solar cell production line 1800 via the outgoing conveyor 1810. In one embodiment, each substrate 110 may be inspected in the substrate unloader 1806A via another inspection assembly 2096. The substrate unloader 1806A serves as an exit region that unloads the substrate 110 and removes the substrate 110 away from the wet processing chamber 1812A after the process is completed in the wet processing chamber 1812A.

Figure 21:
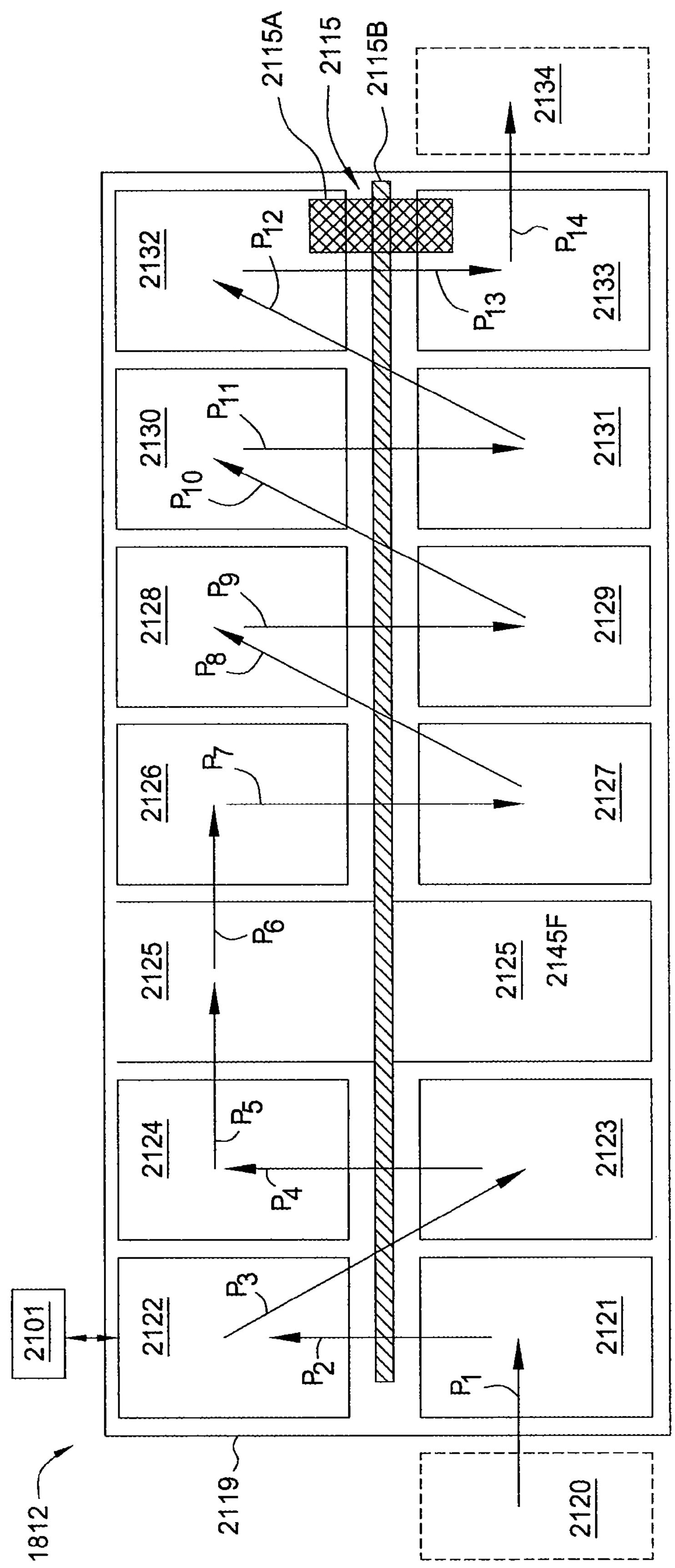
FIG. 21 is a plan view of a solar cell processing line according with one embodiment of the invention.

FIG. 21 is a schematic plan view of one embodiment of a wet processing chamber 1812 (shown as 1812A-1812C in FIG. 18A) that is adapted to perform a cleaning process sequence discussed herein. In general, the wet processing chamber 1812 comprises a system controller 2101, a mainframe 2119, and robotic device 2115 that are adapted to transfer substrates between the plurality of processing chambers disposed within the mainframe 2119. The shape, orientation or number of processing chambers (e.g., reference numerals 2121-2132) illustrated in FIG. 21 is not intended to be limiting to the scope of the invention described herein.

In general, the system controller 2101 is used to control one or more components and processes performed in the wet processing chamber 1812. The system controller 2101 is generally designed to facilitate the control and automation of the wet processing chamber 1812 and typically includes a central processing unit (CPU) (not shown), memory (not shown), and support circuits (or I/O) (not shown) as discussed above with similar configuration to the controller 1901.

One aspect of the wet processing chamber 1812 is the ability of the production line to receive a "raw" unprocessed substrate and perform a plurality of automated processes to form a surface texture or to clean the substrate surface. To move the solar cell substrate(s) to the various processing stations one or more robots, conveyors and/or other automation devices are used to control the movement substrates through the wet processing chamber 1812. In one example, the wet processing chamber 1812 is configured so that the process flow through the system generally follows a flow path "P", as shown as paths $P_1$-$P_{13}$ in FIG. 21. In general, the bulk of the movement of the various substrates through the wet processing chamber 1812 is performed by use of one or more robotic devices 2115, or robotic assembly, that are adapted to move and position the substrates so that can be received by, or positioned within, one or more of the processing chambers (e.g., reference numerals 2121-2132) and stations 2120, 2134 by use of commands sent by the system controller 2101. In one embodiment, the robotic device 2115 may comprise a robot 2115A that is adapted to move and position one or more substrates along the length of the mainframe 2119 by use of horizontal motion control system 2115B (e.g., slide, linear motor). In one example, the robotic device 2115 is a conventional robotic devices, such as a 6-axis robot or SCARA robot that is coupled to a horizontal motion control system 2115B and is configured to move and position the substrates as desired within the various processing chambers 2121-2132 and stations 2120, 2134. In one configuration, as shown in FIG. 21, the horizontal motion control system 2115B is positioned over the mainframe 2119 components.

In one embodiment, the robotic device 2115 is adapted to transfer a batch, or cassette, of substrates that are to be processed all at the same time in each of the processing chambers 2121-2132 in the wet processing chamber 1812. In this configuration, a batch of substrates are removed from an input staging area station 2120 by the robot device 2115 and are delivered to a process chamber 2121 following the transfer path $P_1$. In one embodiment, the substrate is exposed to an acid or solvent containing solution to pre-clean the surfaces of the substrates. Once the cleaning processing is completed in the station 2121, the substrates are then transferred to the process chamber 2122 by the robotic device 2115 following the transfer path $P_2$, where a dunk and/or spray rinsing step in deionized (DI) water is performed to remove any chemicals remaining on the surface of the substrate. After completing the rinsing step the substrate is then transferred to process chamber 2123 by the robotic device 2115 following the transfer path $P_3$. After performing the process step in the process chamber 2123 the substrates are then transferred by the robotic device 2115, following the transfer path $P_4$, to the process chamber 2124, where a dunk and/or spray rinsing step in DI water is performed to remove any chemicals remaining on the surface of the substrate. After performing the rinsing step in process chamber 2124 the substrates are then transferred by the robotic device 2115, following the transfer path $P_5$, to the processing chamber 2125. In one configuration, as shown in FIG. 21, the processing chamber 2125 is sized to hold a plurality of batches of substrates and thus allow a better utilization of the processing chambers once a steady state flow of substrates are delivered through the wet processing chamber 1812. Thus, in some configurations of the wet processing chamber 1812, one or more of the processing chambers are sized to allow multiple batches of substrates to be processed in parallel therein to prevent bottlenecks and improve the substrate throughput. In one example, batch may include 5 or more substrates, such as 20 or more substrates. After performing the cleaning process at the processing chamber 2125, the substrate is then transferred by the robotic device 2115, following the transfer path $P_6$, to the process chamber 2126 where a rinse step in DI water is performed to remove any chemicals remaining on the surface of the substrate. After rinsing the substrates they are then transferred by the robotic device 2115, following the transfer path $P_7$, to the process chamber 2127 where post etch texture smoothing process. Once the post etch texture smoothing process has been completed, the substrates are then transferred to the process chamber 2128 by the robotic device 2115 following the transfer path $P_8$, where a dunk and/or spray rinsing step in DI water is performed to remove any chemicals remaining on the surface of the substrate. After rinsing the substrates they are then transferred by the robotic device 2115, following the transfer path $P_9$, to the process chamber 2129 where post-clean step. Once the post-clean step has been completed, the substrates are then transferred to the process chamber 2130 by the robotic device 2115 following the transfer path $P_{10}$, where a dunk and/or spray rinsing step in DI water is performed to remove any chemicals remaining on the surface of the substrate. The substrates are then transferred to process chamber 2131 following the transfer path $P_{11}$ using the first robotic device 2115. In one embodiment, the robotic device 2115 is adapted to deliver the substrates between the process chambers 2129-2132 multiple times to perform the sequential repetition of processing steps, as discussed above. After the cleaning process are complete, the robotic device 2115 transfers the substrates to the process chamber 2132 following the transfer path $P_{12}$, where a rinsing step is performed. Once the rinsing step has been completed, the substrates are then removed from the process chamber 2132 by the robotic device 2115 and transferred to the following the transfer path $P_{13}$ to a chamber 2133 for drying. Next, the substrate may be transferred along path $P_{14}$ to the exit staging area 2134, where the surface of the substrate can be received for subsequent solar cell formation processing. In one configuration, the transfer conveyor 1810 in the production line 1800 is configured to transfer the substrates to the staging area station 2120 to do cleaning process in the wet processing chamber 1812 and then pick up the processed substrates in the staging area station 2134.

While the foregoing is directed to embodiments of the present invention, other and further embodiments of the invention may be devised without departing from the basic scope thereof, and the scope thereof is determined by the claims that follow.

What is claimed is:

1. A method of forming a solar cell device, comprising:

disposing a dopant material comprising a first dopant on a plurality of regions of a first surface of a substrate in a first deposition station disposed in an automation assembly, wherein the first deposition station comprises a screen printing mask and at least one actuator configured to position the screen printing mask;

forming a dielectric layer over the dopant material and a portion of the first surface of the substrate in a second deposition station disposed in the automation assembly, wherein the dielectric layer comprises a second dopant that is an opposite doping type of the first dopant;

heating the substrate to a desired temperature in a heating chamber disposed in the automation assembly to cause the first and the second dopants to diffuse into the first surface of the substrate; and depositing a conducting layer over at least a portion of the first surface of the substrate in a third deposition station disposed in the automation assembly.

2. The method of claim 1, further comprising:

cleaning the first surface of the substrate in a first wet processing chamber disposed in the automation assembly prior to or after heating the substrate.

3. The method of claim 1, further comprising:

texturing the first surface or a second surface of the substrate in a second wet processing chamber disposed in the automation assembly.

4. The method of claim 3, further comprising:

forming a second dielectric layer over the first surface of the substrate after texturing the first surface of the substrate; and patterning the second dielectric layer to form a plurality of regions, wherein the plurality of regions are adapted to expose portion of the first and the second dopants diffused into the substrate.

5. The method of claim 1, further comprising:

forming a capping layer over the dielectric layer in the second deposition station disposed in the automation assembly before heating the substrate.

6. The method of claim 5, further comprising:

depositing an etching material over one or more regions of the dielectric layer or capping layer in a fourth deposition chamber which comprises a screen printing mask, wherein the etching material comprises a doping element; and heating the substrate and the etching material to a desired temperature to cause doping elements to diffuse into the substrate.

7. The method of claim 6, further comprising:

forming a plurality of spacer materials between regions having the first and the second dopants.

8. The method of claim 1, further comprising:

etching one or more regions of the dielectric layer to expose a portion of the first surface of the substrate, wherein a dopant containing residue comprising the second dopant is left at the exposed surface of the substrate, wherein the heating the substrate further comprises heating the substrate, the first dopant material and dopant containing residue to a desired temperature to cause the doping atoms in the first dopant material and the dopant containing residue to diffuse into the substrate.

9. The method of claim 1, further comprising:
etching one or more regions of the dielectric layer before heating the substrate, wherein etching the one or more regions further comprises using an etching material that contains a third doping material, which contains a doping atom that is different than the first doped material.

10. The method of claim 1, further comprising:
forming a capping layer over the dielectric layer before heating the substrate.

11. A method of forming a solar cell device, comprising:
depositing a dielectric material on a plurality of first regions of a first surface of a substrate using a screen printing process that comprises aligning a first screen printing mask with the substrate by use of at least one actuator;
depositing a first dopant material on a plurality of second regions of the first surface of the substrate using a screen printing process that comprises aligning a second screen printing mask with the substrate by use of at least one actuator; and
depositing a second dopant material on a plurality of third regions of the first surface using a screen printing process that comprises aligning a third screen printing mask with the substrate by use of at least one actuator, wherein at least a portion of the first and second dopant materials are separated from each other by the deposited dielectric material.

12. The method of claim 11, further comprising:
heating the substrate to a desired temperature to cause the first and the second dopant materials to simultaneously diffuse into the first surface of the substrate.

13. The method of claim 12, further comprising:
removing the dielectric material disposed on the first surface of the substrate while texturing a second surface of the substrate, wherein removing the dielectric material is performed after heating the substrate to the desired temperature.

14. The method of claim 13, further comprising:
forming a dielectric layer over the first surface of the substrate;
etching the dielectric layer to form a plurality of regions to expose portion of the first surface of the substrate; and
forming a conductive layer on the dielectric layer and the exposed portion of the substrate.

15. The method of claim 12, further comprising:
depositing a conducting layer over the first surface of the substrate, wherein depositing the conducting layer is performed using a screen printing process.

16. The method of claim 15, further comprising:
removing a portion of the conducting layer to electrically isolate at least one region of the conducting layer in contact with a region of the first substrate surface on which a first dopant material was disposed and at least one region of the conducting layer in contact with a region of the first substrate surface on which a second dopant material was disposed.

17. The method of claim 15, further comprising:
removing the dielectric material disposed on the first surface of the substrate before depositing the conducting layer.

18. The method of claim 11, further comprising:
disposing a spacer material on a plurality of regions of the first surface of the substrate.

19. The method of claim 11, further comprising:
removing material from a second surface of the substrate to form a desirable roughness on the second surface.

* * * * *

UNITED STATES PATENT AND TRADEMARK OFFICE

CERTIFICATE OF CORRECTION

PATENT NO. : 7,951,637 B2
APPLICATION NO. : 12/549284
DATED : May 31, 2011
INVENTOR(S) : Weidman et al.

It is certified that error appears in the above-identified patent and that said Letters Patent is hereby corrected as shown below:

In the Detailed Description:

Column 44, Line 11, please delete "18041" and insert --1804I-- therefor;

Column 44, Line 34, please delete "18061" and insert --1806I-- therefor.

Signed and Sealed this
Twenty-third Day of August, 2011

David J. Kappos
*Director of the United States Patent and Trademark Office*